(12) United States Patent
Song et al.

(10) Patent No.: US 12,507,469 B2
(45) Date of Patent: Dec. 23, 2025

(54) INTEGRATED CIRCUIT DEVICES

(71) Applicant: Samsung Electronics Co., Ltd., Suwon-si (KR)

(72) Inventors: Seungmin Song, Suwon-si (KR); Minchan Gwak, Suwon-si (KR); Doyoung Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 443 days.

(21) Appl. No.: 18/063,937

(22) Filed: Dec. 9, 2022

(65) Prior Publication Data
US 2023/0343782 A1 Oct. 26, 2023

(30) Foreign Application Priority Data
Apr. 20, 2022 (KR) .................. 10-2022-0049166

(51) Int. Cl.
*H01L 27/088* (2006.01)
*H01L 21/28* (2025.01)
*H01L 21/78* (2006.01)
*H01L 21/8234* (2006.01)
*H01L 23/522* (2006.01)
(Continued)

(52) U.S. Cl.
CPC ....... *H10D 84/83* (2025.01); *H01L 21/28123* (2013.01); *H01L 21/7806* (2013.01); *H01L 23/5226* (2013.01); *H10D 30/014* (2025.01); *H10D 30/43* (2025.01); *H10D 30/6735* (2025.01); *H10D 62/121* (2025.01); *H10D 84/0149* (2025.01); *H10D 84/0151* (2025.01); *H10D 84/038* (2025.01)

(58) Field of Classification Search
CPC .... H10D 30/014; H10D 30/024; H10D 30/43; H10D 30/62; H10D 30/6211; H10D 30/6212; H10D 30/6213; H10D 30/6735; H10D 62/118; H10D 62/119; H10D 62/121; H10D 84/0149; H10D 84/0151; H10D 84/0158; H10D 84/0193; H10D 84/038; H10D 84/83; H10D 84/834; H10D 84/853; H01L 21/28123; H01L 21/7806; H01L 23/5226
See application file for complete search history.

(56) References Cited

U.S. PATENT DOCUMENTS 9,899,271 B2 2/2018 Chang et al.
10,615,265 B2 4/2020 Ghani et al.
(Continued)

FOREIGN PATENT DOCUMENTS

KR 10-2022-0004899 A 1/2022

OTHER PUBLICATIONS

Notice of Allowance in Korean Appln. No. 10-2022-0049166, mailed on Oct. 21, 2025, 7 pages (with English translation).

*Primary Examiner* — David C Spalla
(74) *Attorney, Agent, or Firm* — Fish & Richardson P.C.

(57) ABSTRACT

An integrated circuit device includes a channel area extending in a first horizontal direction, a gate cut structure having a tapered shape in which a horizontal width thereof decreases while extending from a lower side to an upper side in a vertical direction, and a pair of gate electrodes respectively having ends facing each other with the gate cut structure therebetween. The pair of gate electrodes may extend in a second horizontal direction intersecting with the first horizontal direction.

19 Claims, 52 Drawing Sheets

(51) Int. Cl.
  *H01L 29/06* (2006.01)
  *H01L 29/423* (2006.01)
  *H01L 29/66* (2006.01)
  *H01L 29/775* (2006.01)
  *H10D 30/01* (2025.01)
  *H10D 30/43* (2025.01)
  *H10D 30/67* (2025.01)
  *H10D 62/10* (2025.01)
  *H10D 84/01* (2025.01)
  *H10D 84/03* (2025.01)
  *H10D 84/83* (2025.01)

(56) References Cited

U.S. PATENT DOCUMENTS

| | | |
|---|---|---|
| 10,756,087 B2 | 8/2020 | Wu et al. |
| 11,081,356 B2 | 8/2021 | Wang et al. |
| 11,121,036 B2 | 9/2021 | Ching et al. |
| 2004/0119106 A1 | 6/2004 | Hsieh |
| 2006/0237754 A1 | 10/2006 | Ishida |
| 2017/0084499 A1* | 3/2017 | Chang .................. H10D 30/62 |
| 2020/0075770 A1 | 3/2020 | Kobrinsky et al. |
| 2020/0083116 A1 | 3/2020 | Demuynck et al. |
| 2020/0135848 A1* | 4/2020 | Lim .................. H10D 84/0167 |
| 2020/0381432 A1* | 12/2020 | Lee .................... H10D 62/115 |
| 2021/0035971 A1 | 2/2021 | Park et al. |
| 2021/0036121 A1* | 2/2021 | Lim .................. H10D 62/151 |
| 2021/0043737 A1 | 2/2021 | Takashima et al. |
| 2021/0183859 A1 | 6/2021 | Jeong et al. |
| 2021/0296315 A1 | 9/2021 | Lilak et al. |
| 2021/0398977 A1 | 12/2021 | Mishra et al. |
| 2023/0139399 A1* | 5/2023 | Zhou .................. H10D 62/118 257/506 |

* cited by examiner

INTEGRATED CIRCUIT DEVICES

CROSS-REFERENCE TO RELATED APPLICATION

This application is based on and claims priority under 35 U.S.C. § 119 to Korean Patent Application No. 10-2022-0049166, filed on Apr. 20, 2022, in the Korean Intellectual Property Office, the disclosure of which is incorporated by reference herein in its entirety.

BACKGROUND

Inventive concepts relate to an integrated circuit device, and more particularly, to an integrated circuit device with a metal gate.

As the degree of integration of the integrated circuit device increases, the size of the integrated circuit device may be extremely reduced. Accordingly, in order to improve device performance, an integrated circuit device, in which a polysilicon gate is replaced with a metal gate containing metal, has been introduced. In order to form a metal gate, a replacement metal gate (RMG) process may be used to form a metal gate in a space in which the previously formed one-time gate is removed.

SUMMARY

Inventive concepts provide an integrated circuit device having a metal gate and capable of increasing the degree of integration.

According to an embodiment of inventive concepts, an integrated circuit device may include a lower wiring structure including a plurality of lower wiring lines, a plurality of lower wiring vias connected to at least one of the plurality of lower wiring lines, and a lower inter-wiring insulating layer surrounding the plurality of lower wiring lines and the plurality of lower wiring vias; a substrate insulating layer on the lower wiring structure; a plurality of channel areas extending in a first horizontal direction on the substrate insulating layer; a plurality of gate structures, each of the plurality of gate structures including a gate electrode extending in a second horizontal direction on the plurality of channel areas, a pair of gate spacers covering both sidewalls of the gate electrode, and a gate insulating layer between the gate electrode and the pair of gate spacers, the second horizontal direction crossing the first horizontal direction; an interlayer insulating layer covering the plurality of gate structures; and a gate cut structure on the substrate insulating layer. The gate cut structure may extend in a vertical direction from an upper surface of the substrate insulating layer toward the interlayer insulating layer and pass through the gate electrode of a corresponding one of the plurality of gate structures to cut and separate the gate electrode of the corresponding one of the plurality of gate structures. The gate cut structure may have a tapered shape in which a horizontal width thereof decreases from a lower side to an upper side thereof in the vertical direction.

According to an embodiment of inventive concepts, an integrated circuit device may include a channel area extending in a first horizontal direction, a gate cut structure having a tapered shape in which a horizontal width thereof decreases while extending from a lower side to an upper side in a vertical direction, and a pair of gate electrodes respectively having ends facing each other with the gate cut structure therebetween. The pair of gate electrodes may extend in a second horizontal direction. The second horizontal direction may intersect the first horizontal direction.

According to an embodiment of inventive concepts, an integrated circuit device may include a lower wiring structure including a plurality of lower wiring lines, a plurality of lower wiring vias connected to at least one of the plurality of lower wiring lines, and a lower inter-wiring insulating layer surrounding the plurality of lower wiring lines and the plurality of lower wiring vias; a substrate insulating layer on the lower wiring structure; a plurality of fin-type active areas extending in a first horizontal direction on the substrate insulating layer; a plurality of nanosheet stacked structures on the plurality of fin-type active areas, each of the plurality of nanosheet stacked structures including a plurality of nanosheets extending parallel to upper surfaces of the plurality of fin-type active areas; a plurality of source/drain areas respectively connected to ends of the plurality of nanosheets in the plurality of nanosheet stacked structures; a plurality of gate structures, each of the plurality of gate structures including a gate electrode extending in a second horizontal direction on the plurality of fin-type active areas, a pair of gate spacers covering both sidewalls of the gate electrode, and a gate insulating layer between the gate electrode and the pair of gate spacers, the second horizontal direction crossing the first horizontal direction; an inter-gate insulating layer filling a portion of a space between the plurality of gate structures; a protective insulating layer filling a protective recess, the protective recess defined by a lower portion of the space between the plurality of gate structures, a material of the protective insulating layer being different than a material of at least a portion of the inter-gate insulating layer; an interlayer insulating layer configured to cover the plurality of gate structures; and a gate cut structure on the substrate insulating layer. The gate cut structure may extend in a vertical direction from an upper surface of the substrate insulating layer toward the interlayer insulating layer and pass through the gate electrode of a corresponding one of the plurality of gate structures to cut and separate the gate electrode of the corresponding one of the plurality of gate structures. The gate cut structure may have a tapered shape in which a horizontal width thereof decreases from a lower side to an upper side thereof in the vertical direction.

BRIEF DESCRIPTION OF THE DRAWINGS

Embodiments of inventive concepts will be more clearly understood from the following detailed description taken in conjunction with the accompanying drawings in which.

DETAILED DESCRIPTION OF THE EMBODIMENTS

Figure 1A:
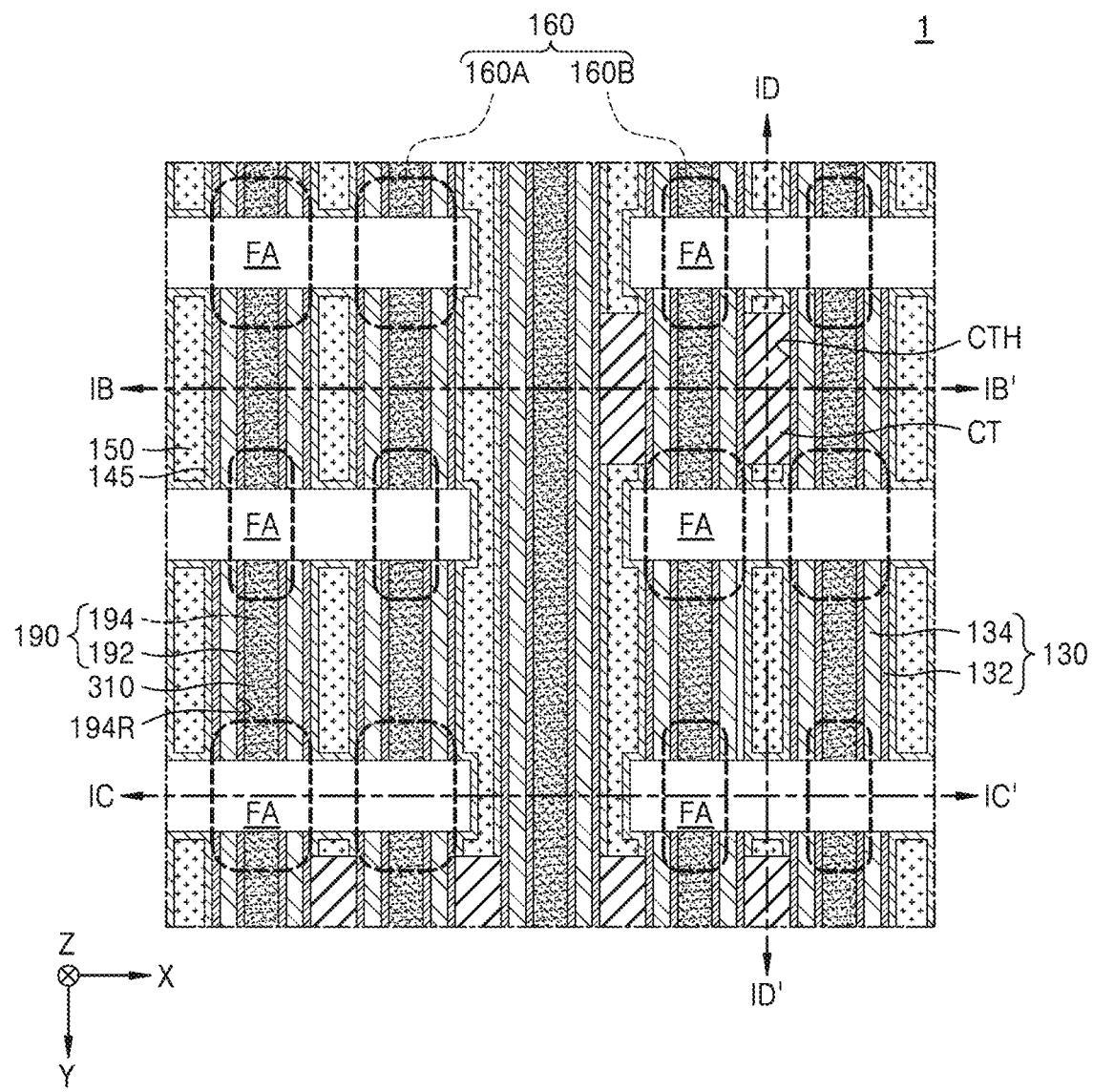
FIGS. 1A to 1D are a plan layout view and cross-sectional views of an integrated circuit device, according to embodiments.
Figure 1B:
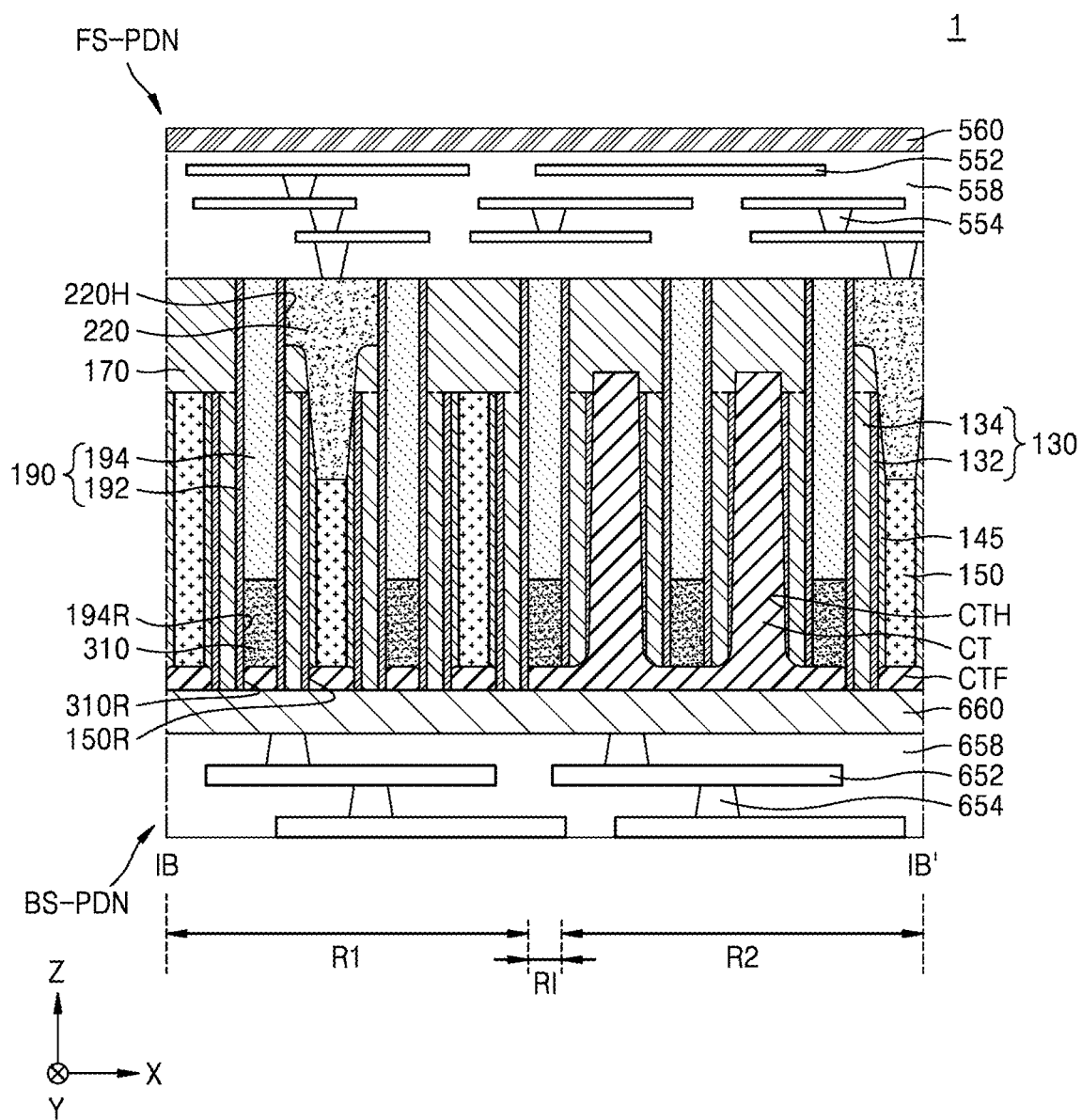
Figure 1C:
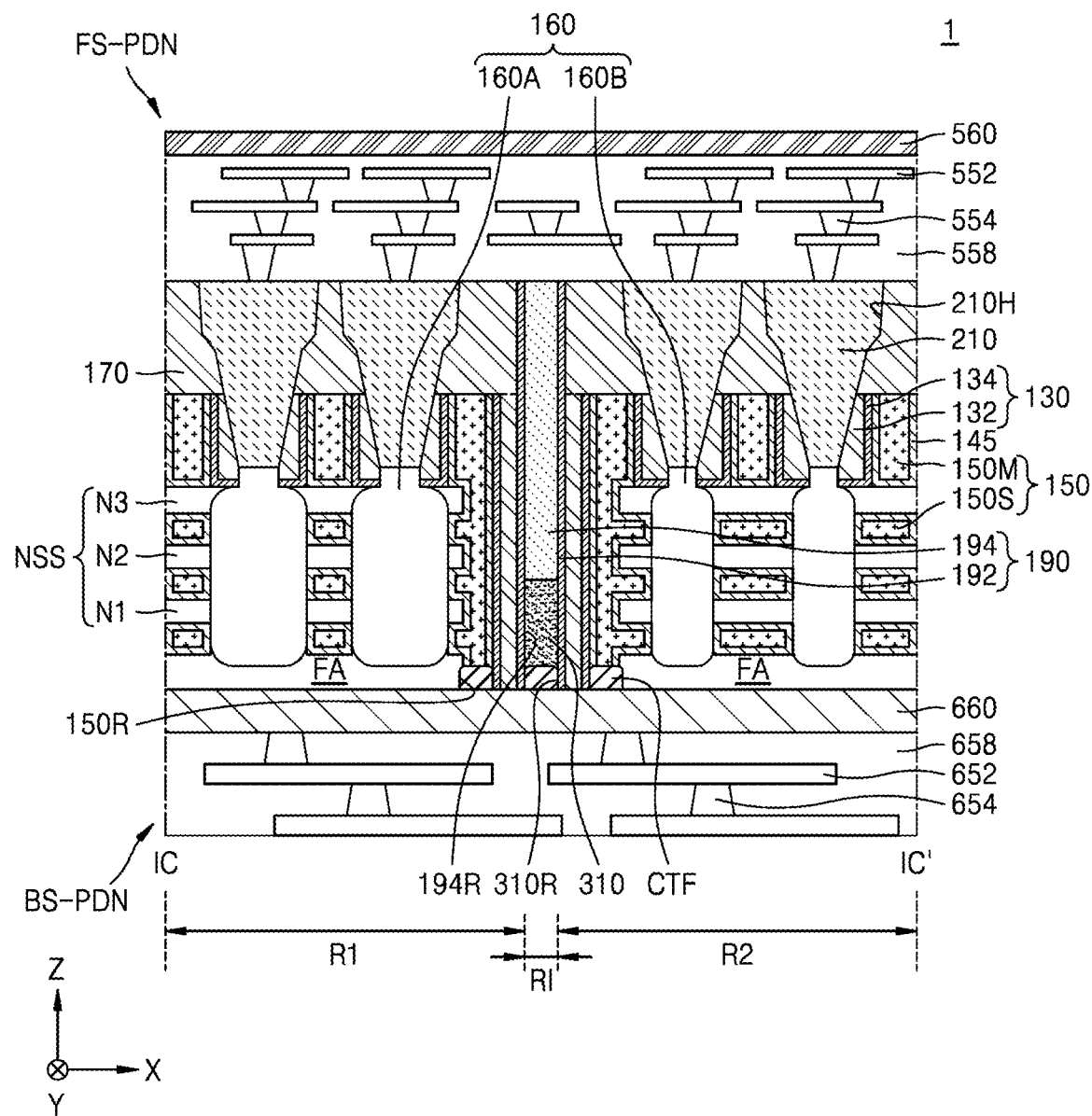
Figure 1D:
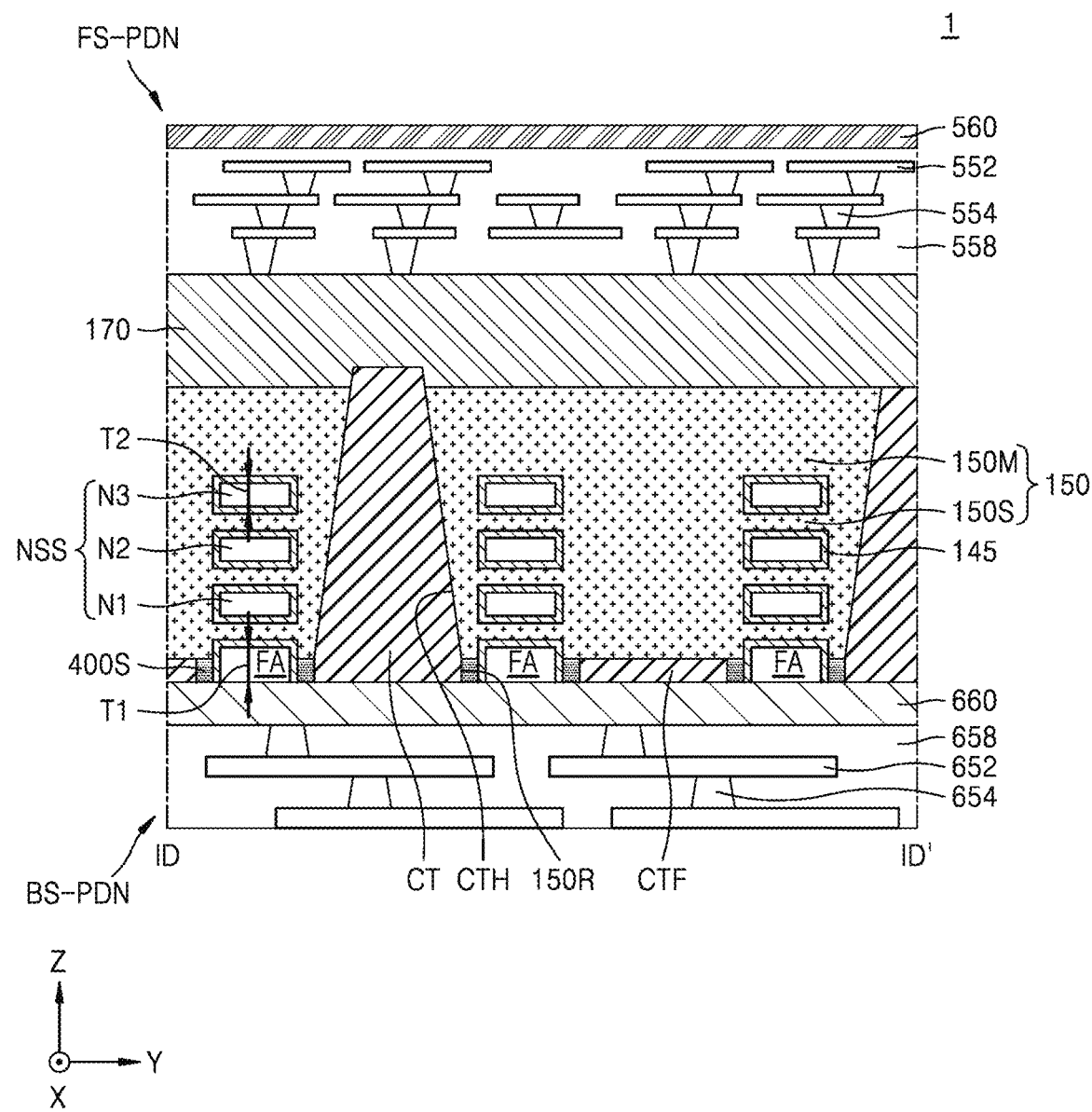

FIGS. 1A to 1D are a plan layout view and cross-sectional views of an integrated circuit device, according to embodiments. In more detail, FIGS. 1B, 1C, and 1D are cross-sectional views of the integrated circuit device, taken along lines IB-IB', IC-IC', and ID-ID' of FIG. 1A.

Referring to FIGS. 1A to 1D together, an integrated circuit device 1 may include a lower wiring structure BS-PDN, a substrate insulating layer 660 covering the lower wiring structure BS-PDN, and a plurality of fin-type active areas FA protruding from the upper surface of the substrate insulating layer 660 in a vertical direction (a Z direction) and extending in a first horizontal direction (an X direction). In some embodiments, the integrated circuit device 1 may include a plurality of nanosheet stacked structures NSS facing the upper surface of the plurality of fin-type active areas FA at positions apart from the upper surfaces of the plurality of fin-type active areas FA. For example, the integrated circuit device 1 may include a multi-gate metal-oxide-semiconductor filed effect transistor (MOSFET) configured by a fin-type active area FA and a nanosheet stacked structure NSS. The fin-type active area FA and the nanosheet stacked structure NSS may be collectively referred to as a channel area. The channel area may extend in the first horizontal direction (X direction).

Figure 14:
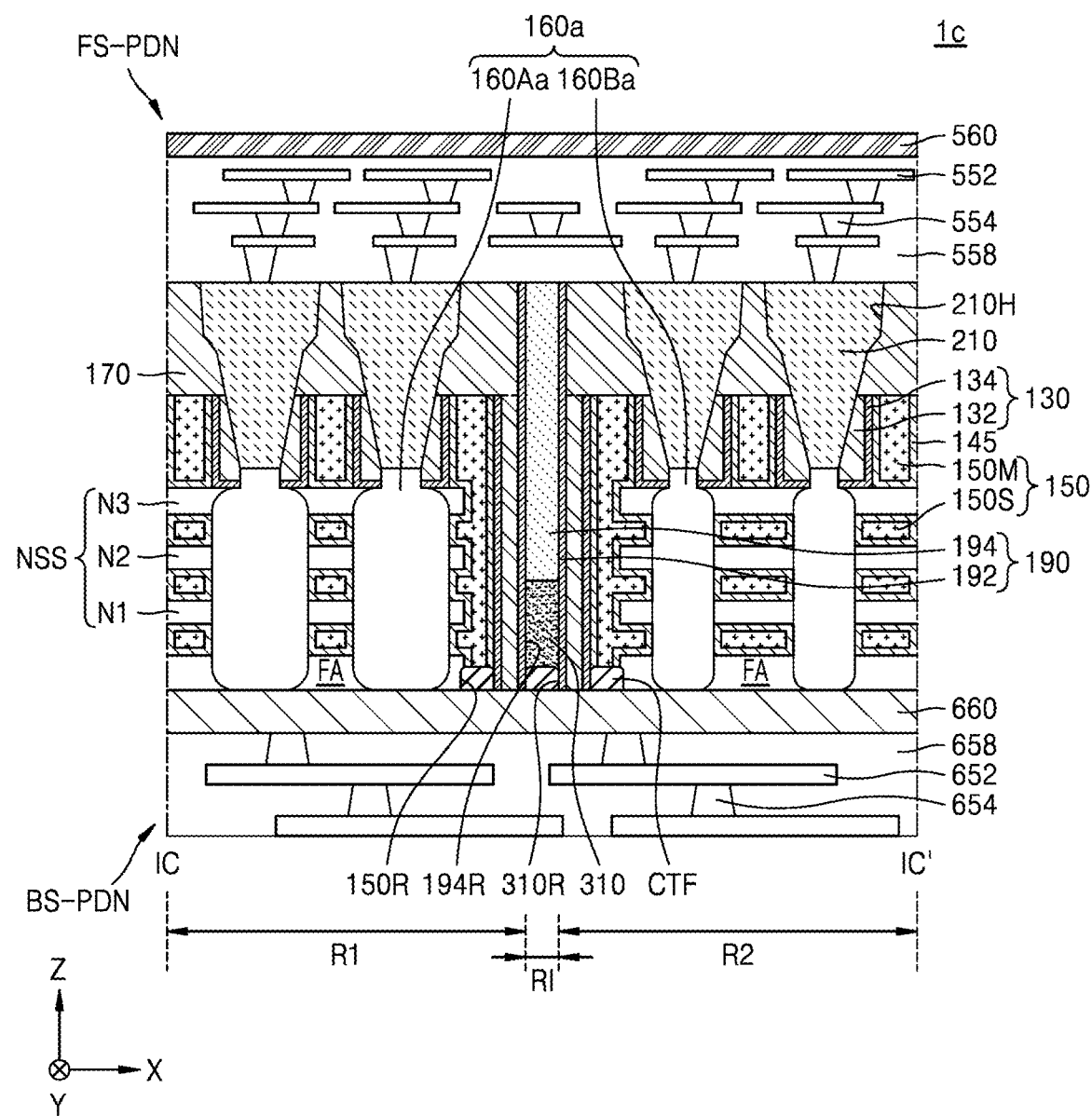
FIG. 14 is a cross-sectional view of an integrated circuit device according to embodiments.
Figure 15A:
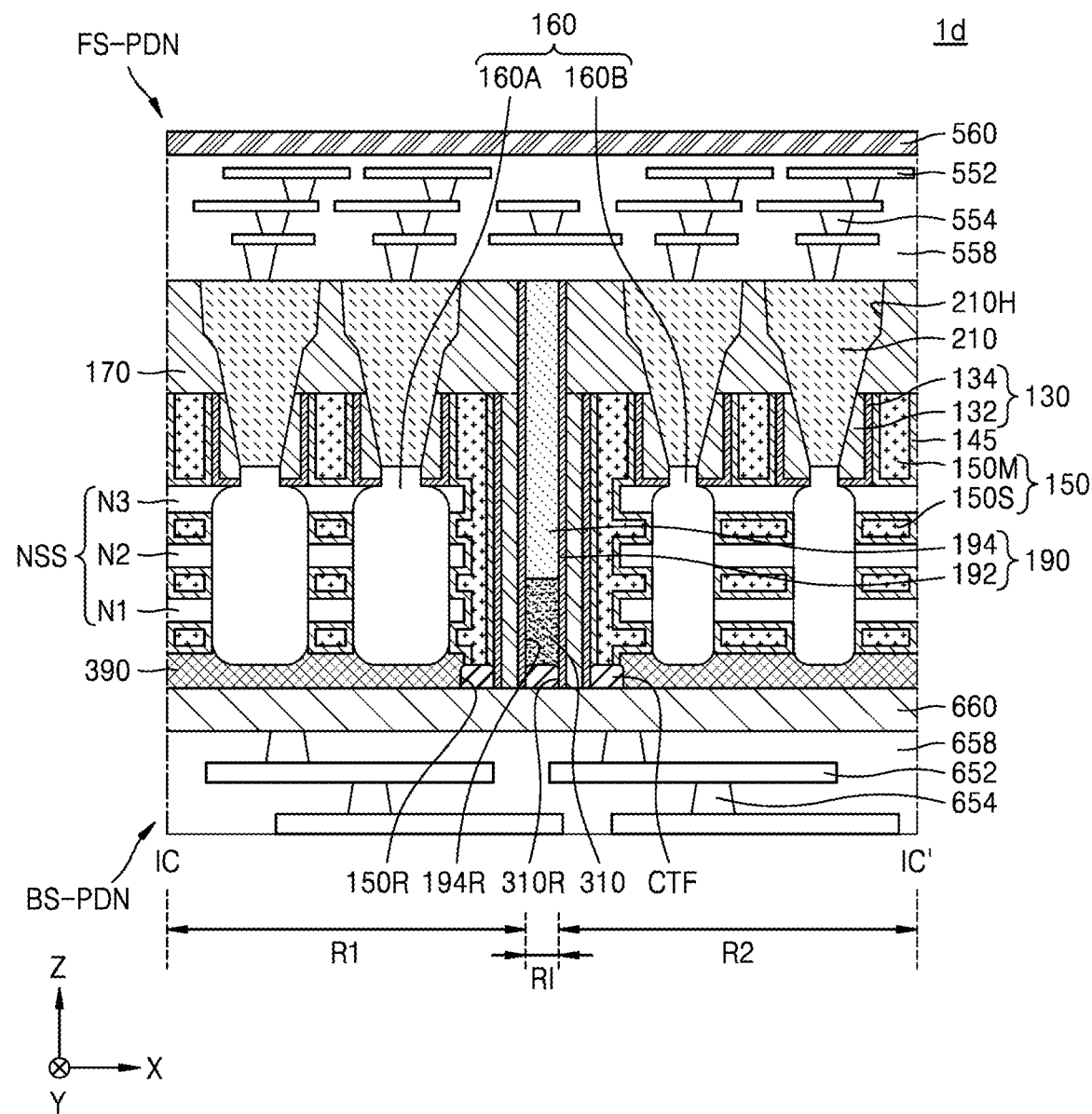
FIGS. 15A and 15B are cross-sectional views of an integrated circuit device according to embodiments.
Figure 15B:
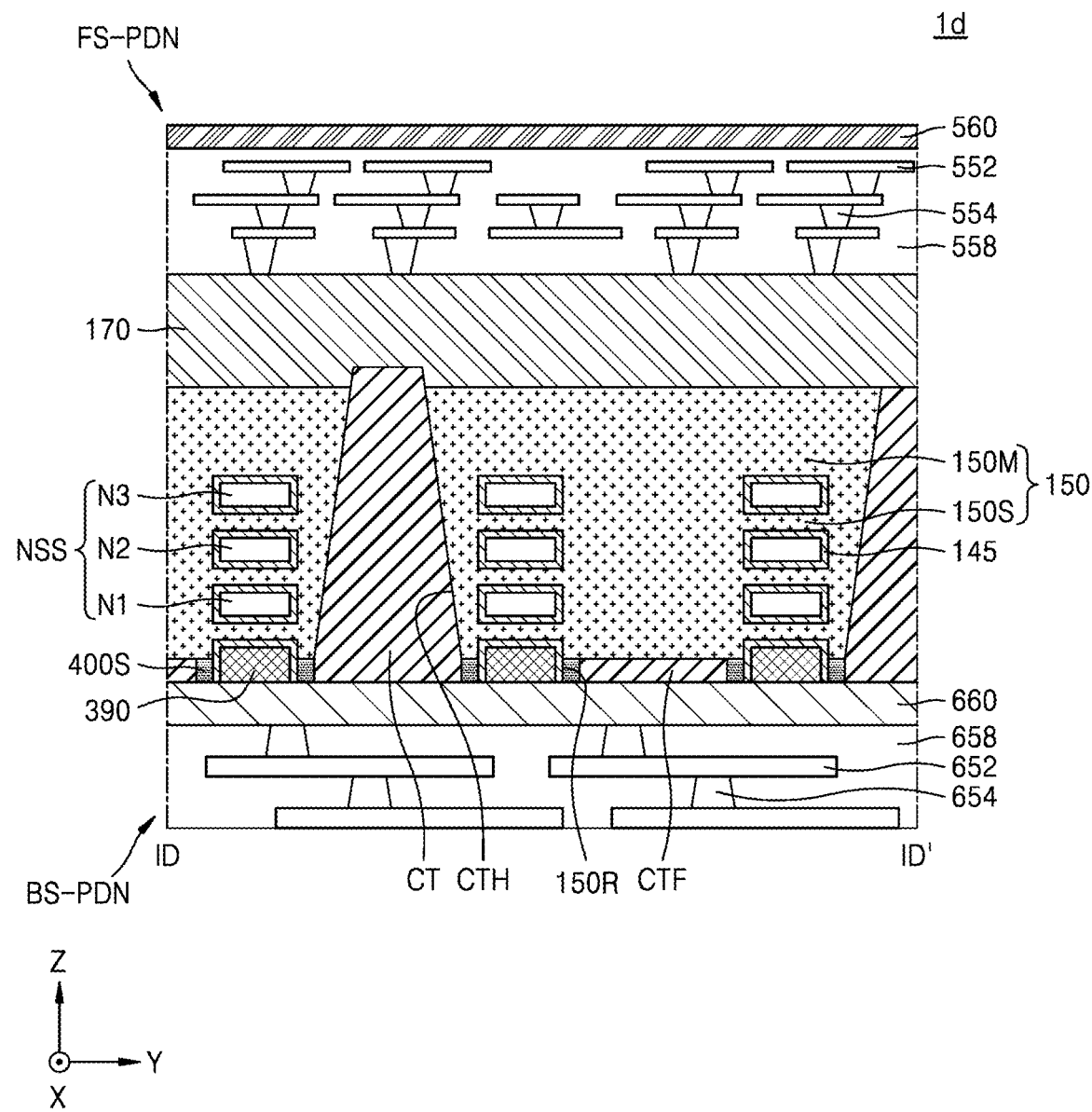

Hereinafter, in the present specification, each of the integrated circuit device 1 shown in FIGS. 1A to 1D, an integrated circuit device 1a shown in FIGS. 12A and 12B, an integrated circuit device 1b shown in FIG. 13, an integrated circuit device 1c shown in FIG. 14, and an integrated circuit device 1d shown in FIGS. 15A and 15B is described as including a multi-gate MOSFET, but embodiments of inventive concepts are not limited thereto. For example, each of the integrated circuit device 1 shown in FIGS. 1A to 1D, the integrated circuit device 1a shown in FIGS. 12A and 12B, the integrated circuit device 1b shown in FIG. 13, the integrated circuit device 1c shown in FIG. 14, and the integrated circuit device 1d shown in FIGS. 15A and 15B may include a single-gate MOSFET constituted by a fin-type active area FA, instead of the multi-gate MOSFET constituted by the fin-type active area FA and the nanosheet stacked structure NSS. When each of the integrated circuit device 1 shown in FIGS. 1A to 1D, the integrated circuit device 1a shown in FIGS. 12A and 12B, the integrated circuit device 1b shown in FIG. 13, the integrated circuit device 1c shown in FIG. 14, and the integrated circuit device 1d shown in FIGS. 15A and 15B includes a single-gate MOSFET constituted by a fin-type active area FA instead of the multi-gate MOSFET constituted by the fin-type active area FA and the nanosheet stacked structure NSS, the fin-type active area FA may be referred to as a channel area.

The integrated circuit device 1 may be a logic semiconductor chip. For example, the integrated circuit device 1 may be a central processing unit (CPU) chip, a graphics processing unit (GPU) chip, or an application processor (AP) chip.

In this specification, a logic semiconductor chip is not a memory semiconductor chip, but refers to a semiconductor chip that performs logical operations. For example, the logic semiconductor chip may include a logic cell. In some embodiments, the logic semiconductor chip may include both a logic cell and a memory cell. The logic cell may be variously configured including a plurality of circuit elements, such as transistors and resistors. The logic cell may constitute, for example, an AND, a NAND, an OR, NOR, an exclusive OR (XOR), an exclusive NOR (XNOR), an inverter (INV), an adder (ADD), a buffer (BUF), a delay (DLY), a filter (FIL), a multiplexer (MXT/MXIT), OR/AND/INVERTER (OAI), AND/OR (AO), AND/OR/INVERTER (AOI), a D flip-flop, a reset flip-flop, a master-slave flip-flop, a latch, and the like. The logic cell may constitute standard cells that perform a desired logical function, such as a counter and a buffer.

The integrated circuit device 1 may have a first region R1, a second region R2, and a third region RI between the first region R1 and the second region R2. The first region R1 and the second region R2 may have a third region RI therebetween and may be apart from each other. The plurality of fin-type active areas FA and the plurality of nanosheet stacked structures NSS may be arranged in each of the first region R1 and the second area R2.

The substrate insulating layer 660 may include silicon oxide. For example, the substrate insulating layer 660 may include an insulating material, such as a High Density Plasma (HDP) oxide layer, a tetra-ethyl-ortho-silicate (TEOS) oxide layer, Tonen SilaZene (TOSZ), Spin On Glass (SOG), Undoped Silica Glass (USG), or a low-k dielectric layer.

The fin-type active area FA may include a semiconductor, such as silicon (Si) or germanium (Ge), or a compound semiconductor, such as silicon germanium (SiGe), silicon carbide (SiC), gallium arsenide (GaAs), indium arsenide (InAs), or indium phosphide (InP). In some embodiments, the fin-type active area FA may include at least one of a group III-V material and a group IV material. The group III-V material may include a binary, a trinary, or a quaternary compound including at least one group III element and at least one group V element. In some embodiments, when an n-channel metal-oxide-semiconductor (NMOS) transistor is formed, the plurality of fin-type active areas FA may include one of the group III-V materials explained above. In some other embodiments, when p-channel metal-oxide-semiconductor (PMOS) transistor is formed, the fin-type active area FA may include germanium (Ge).

The plurality of nanosheet stacked structures NSS may be arranged to be apart from the upper surface of the fin-type active area FA in the vertical direction (Z direction). The plurality of nanosheet stacked structures NSS may include a plurality of nanosheets N1, N2, and N3 extending parallel to the upper surface of the fin-type active area FA.

The plurality of nanosheets N1, N2, and N3 constituting one nanosheet stacked structure NSS are sequentially stacked on the upper surface of the fin-type active area FA. The present example is a description of a case where the single nanosheet stack structure NSS includes the three nanosheets N1, N2, and N3 but embodiments of inventive concepts are not limited thereto. For example, one nanosheet stacked structure NSS may include two or four nanosheets.

The plurality of nanosheets N1, N2, and N3 may include the same material. In some embodiments, the plurality of nanosheets N1, N2, and N3 may include the same material as that of the fin-type active area FA.

In some embodiments, a first thickness T1, which is the thickness of the fin-type active area FA in the vertical direction (Z direction), may be greater than a second thickness T2, which is the thickness of each of the plurality of nanosheets N1, N2, and N3.

A plurality of source/drain areas 160 are formed on the plurality of fin-type active areas FA. The plurality of source/drain areas 160 are connected to ends of adjacent nanosheets N1, N2, and N3, respectively. The plurality of source/drain areas 160 may include a first source/drain area 160A arranged in the first region R1; and a second source/drain area 160B arranged in the second region R2.

In some embodiments, the first source/drain area 160A and the second source/drain area 160B may include different materials, and each of the first source/drain area 160A and the second source/drain area 160B may be formed by performing a separate epitaxial growth process. The first source/drain area 160A may include Ge. For example, the first source/drain area 160A may have a multilayer structure of a semiconductor material including Si and a semiconductor material including Ge. The second source/drain area 160B may include Si but not Ge. For example, the second source/drain area 160B may include a semiconductor material including Si, or may have a multilayer structure of a semiconductor material, such as Si, and a compound semiconductor material, such as SiC.

In some embodiments, the plurality of source/drain areas 160 may extend into the fin-type active area FA from the upper surface of the fin-type active area FA. In some embodiments, the plurality of source/drain areas 160 may extend into the fin-type active area FA, but may not extend to the lower surface of the fin-type active area FA. For example, the plurality of source/drain areas 160 may not contact the substrate insulating layer 660. A portion of the fin-type active area FA may be between the plurality of source/drain areas 160 and the substrate insulating layer 660.

A plurality of gate electrodes 150 may extend in a second horizontal direction (a Y direction) crossing the first horizontal direction (X direction) in the fin-type active area FA. The plurality of gate electrodes 150 may respectively overlap the plurality of nanosheet stacked structures NSS at least partially in the vertical direction (Z direction).

The plurality of gate electrodes 150 may be formed to surround at least a portion of the plurality of nanosheets N1, N2, and N3, respectively, while covering the nanosheet stacked structure NSS. A gate electrode 150 may include a main gate portion 150M covering the upper surface of the nanosheet stack structure NSS and a plurality of sub-gate portions 150S formed in a space between the fin-type active area FA and the nanosheets N1, N2, and N3, that is, under the nanosheets N1, N2, and N3. A gate insulating layer 145 is formed between the fin-type active area FA and the gate electrode 150, between the nanosheet stacked structure NSS and the gate electrode 150, and between a source/drain area 160 and the gate electrode 150.

The gate insulating layer 145 may include a silicon oxide layer, a high-k layer, or a combination thereof. The high-k layer may include a metal oxide or a metal oxynitride. The high-k layer may include a material having a dielectric constant greater than that of the silicon oxide layer. For example, the high-k layer may have a dielectric constant of about 10 to about 25. The gate insulating layer 145 may have a stacked structure of the interfacial layer and the high-k layer. The interfacial layer may include a low-k material having a dielectric constant of about 9 or less.

For example, the interfacial layer may include oxide, nitride, or oxynitride. In some embodiments, the interfacial layer may include a silicon oxide layer, a silicon oxynitride layer, or a combination thereof. In some embodiments, the interfacial layer may be omitted.

The gate electrode 150 may include a layer containing metal for adjusting a work function, and a layer containing metal for filling a gap formed on an upper portion of the layer containing metal for adjusting the work function. The layer containing metal for adjusting the work function may include at least one metal of titanium (Ti), tungsten (W), ruthenium (Ru), niobium (Nb), Mo, hafnium (Hf), nickel (Ni), cobalt (Co), platinum (Pt), ytterbium (Yb), terbium (Tb), dysprosium (Dy), erbium (Er), and palladium (Pd). In some embodiments, the gate electrode 150 may have a structure in which a metal nitride layer, a metal layer, a conductive capping layer, and a gap-fill metal layer are sequentially stacked. The metal nitride layer and the metal layer may include at least one metal of Ti, Ta, W, Ru, Nb, Mo, and Hf. The gap-fill metal layer may include a W layer or an Al layer. In some embodiments, the gate electrode 150 may include, but is not limited to, a stacked structure of TiAlC/TiN/W, a stacked structure of TiN/TaN/TiAlC/TiN/W, or a stacked structure of TiN/TaN/TiN/TiAlC/TiN/W.

A gate spacer 130 having the gate insulating layer 145 therebetween and covering a sidewall of the gate electrode 150 is formed on the plurality of nanosheet stacked structures NSS and on a plurality of fin-type stack structures FS. A pair of gate spacers 130 facing each other may cover both sidewalls of one gate electrode 150. The gate spacer 130 may include silicon nitride, but embodiments of inventive concepts are not limited thereto. In some embodiments, the gate spacer 130 may have a stacked structure of a first gate spacer 132 and a second gate spacer 134 having the gate insulating layer 145 therebetween and sequentially covering sidewalls of the gate electrode 150. In some other embodiments, the gate spacer 130 may include a single layer or a stacked structure of three or more layers. The gate insulating layer 145, the gate electrode 150, and the gate spacer 130 may be collectively referred to as a gate structure.

The gate electrode 150 may be formed using a replacement metal gate (RMG) process. For example, after forming a dummy gate electrode in the fin-type active area FA, the pair of gate spacers 130 covering both sidewalls of the dummy gate electrode may be formed, and the gate electrode 150 may be formed between the pair of gate spacers 130 after the dummy gate electrode is removed.

An inter-gate insulating layer 190 may fill a portion of a space between the plurality of gate structures, that is, a plurality of gate spacers 130 having the gate insulating layer 145 therebetween and covering the sidewalls of the gate electrode 150. The inter-gate insulating layer 190 may fill a portion of the space between the gate spacers 130 in the plurality of source/drain areas 160. A protective recess 194R may be at a lower portion between the plurality of gate structures. The protective recess 194R may be filled by a protective insulating layer 310. The protective insulating layer 310 may include a material different from that of at least a portion of the inter-gate insulating layer 190. In some embodiments, the inter-gate insulating layer 190 may include a silicon oxide layer. The inter-gate insulating layer 190 may be in the third region RI.

In some embodiments, the inter-gate insulating layer 190 may have a stacked structure of a first inter-gate insulating layer 192 conformally covering the bottom and inner surfaces of the space between the gate spacers 130 and a second inter-gate insulating layer 194 covering the first inter-gate insulating layer 192 and filling the space between the gate spacers 130. For example, the first inter-gate insulating layer 192 may include silicon nitride, and the second inter-gate insulating layer 194 may include silicon oxide. In some other embodiments, the inter-gate insulating layer 190 may include a single layer or a stacked structure of three or more layers.

The second inter-gate insulating layer 194 may be between a pair of first inter-gate insulating layers 192 facing each other. The second inter-gate insulating layer 194 may fill an upper portion of a space between the pair of first inter-gate insulating layers 192 facing each other. A portion of the space between the pair of first inter-gate insulating layers 192 facing each other that is not filled by the second inter-gate insulating layer 194 may be limited to the protective recess 194R. The protective recess 194R may be a lower portion of the space between the pair of first inter-gate insulating layers 192 facing each other, and the protection insulating layer 310 may be filled in the protective recess 194R. The protective insulating layer 310 may include a material different from that of the second inter-gate insulating layer 194. In some embodiments, the protective insulating layer 310 may include silicon nitride. The space between the pair of first inter-gate insulating layers 192 facing each other may be filled by the protective insulating layer 310 and the second inter-gate insulating layer 194.

In some other embodiments, when the inter-gate insulating layer 190 includes a single layer, or when the first inter-gate insulating layer 192 and the second inter-gate insulating layer 194 include the same or similar material, the protective recess 194R may be limited to a portion of the space between the gate spacers 130 not filled by the inter-gate insulating layer 190, and the protective insulating layer 310 may include a material different from that of the inter-gate insulating layer 190.

An interlayer insulating layer 170 is formed on the plurality of source/drain areas 160. The interlayer insulating layer 170 may cover the inter-gate insulating layer 190 and the plurality of gate electrodes 150. The interlayer insulating layer 170 may include silicon oxide, but embodiments of inventive concepts are not limited thereto.

A plurality of first contact plugs 210 may be connected to the plurality of source/drain areas 160. A first contact plug 210 may fill a first contact hole 210H passing through the gate spacer 130 and the interlayer insulating layer 170 and may be connected to the source/drain area 160. In some embodiments, a metal silicide layer may be between the source/drain area 160 and the first contact plug 210.

A plurality of second contact plugs 220 may be connected to the plurality of gate electrodes 150. A second contact plug 220 may pass through the interlayer insulating layer 170 to be connected to the gate electrode 150. In some embodiments, the second contact plug 220 may extend between the pair of gate spacers 130 covering both sidewalls of the gate electrode 150, and a lowermost end of the second contact plug 220 may be at a lower vertical level than the uppermost end of the gate electrode 150.

Each of the first contact plug 210 and the second contact plug 220 may include a metal, a conductive metal nitride, or a combination thereof.

An upper wiring structure FS-PDN may be on the interlayer insulating layer 170. In some embodiments, a passivation layer 560 may cover the upper surface of the upper wiring structure FS-PDN. The passivation layer 560 may include, for example, silicon nitride.

The lower wiring structure BS-PDN may include a plurality of lower wiring lines 652, a plurality of lower wiring vias 654 connected to at least one of the plurality of lower wiring lines 652, and a lower inter-wiring insulating layer 658 surrounding the plurality of lower wiring lines 652 and the plurality of lower wiring vias 654. In some embodiments, when the plurality of lower wiring lines 652 have two or more wiring layers, some of the plurality of lower wiring vias 654 may electrically connect the lower wiring lines 652 at different vertical levels, that is, the lower wiring lines 652 arranged in different wiring layers, from among the plurality of lower wiring lines 652.

The wiring layer refers to an electrical path extending in a plane at the same vertical level. The upper wiring structure FS-PDN may have more wiring layers than in the lower wiring structure BS-PDN. For example, the upper wiring structure FS-PDN may have at least three wiring layers, and the lower wiring structure BS-PDN may have at least two wiring layers. In the vertical direction (Z direction), the thickness of the upper wiring structure FS-PDN may be greater than the thickness of the lower wiring structure BS-PDN.

In some embodiments, some of the plurality of lower wiring vias 654 may pass through the substrate insulating layer 660 to electrically connect some of the plurality of lower wiring lines 652 to at least some of the plurality of gate electrodes 150 or at least some of the plurality of fin-type active areas FA.

The upper wiring structure FS-PDN may include a plurality of upper wiring lines 552, a plurality of upper wiring vias 554 connected to at least one of the plurality of upper wiring lines 552, and an upper inter-wiring insulating layer 558 surrounding the plurality of upper wiring lines 552 and the plurality of upper wiring vias 554. Some of the plurality of upper wiring vias 554 may electrically connect upper wiring lines 552 at different vertical levels, that is, the upper wiring lines 552 arranged in different wiring layers, from among the plurality of upper wiring lines 552. Some other upper wiring vias 554 may be electrically connected to any one of the plurality of first contact plugs 210 and the plurality of second contact plugs 220.

The plurality of lower wiring lines 652, the plurality of lower wiring vias 654, the plurality of upper wiring lines 552, and the plurality of upper wiring vias 554 may include, for example, a metal material, such as copper (Cu), aluminum (Al), and W. The lower inter-wiring insulating layer 658 and the upper inter-wiring insulating layer 558 may include an insulating material, such as a High Density Plasma (HDP) oxide layer, a TEOS oxide layer, Tonen SilaZene (TOSZ), Spin On Glass (SOG), Undoped Silica Glass (USG), or a low-k dielectric layer.

The integrated circuit device 1 may include a gate cut structure CT that fills a gate cut hole CTH passing through the gate electrode 150. The gate cut structure CT fills the gate cut hole CTH and may extend in the vertical direction (Z direction) from the upper surface of the substrate insulating layer 660 toward the interlayer insulating layer 170. The gate cut hole CTH may extend between the pair of gate spacers 130, and the gate cut structure CT fills the gate cut hole CTH and may extend in the vertical direction (Z direction) between the pair of gate spacers 130. The gate cut hole CTH may extend in the vertical direction (Z direction) to pass through at least one of the plurality of gate electrodes 150. The gate cut structure CT may be separated by cutting the gate electrode 150 extending in the second horizontal direction (Y direction) to be apart from each other with the gate cut structure CT as the center. Accordingly, a pair of gate electrodes 150 having the gate cut structure CT therebetween and respectively having ends facing each other may extend along a straight line extending in the second horizontal direction (Y direction). The gate cut structure CT may include silicon nitride.

The gate cut structure CT may have a bar-shaped planar cross-section extending in the second horizontal direction (Y direction) or a rectangular planar cross-section having a long axis in the second horizontal direction (Y direction). The gate cut structure CT may have a tapered shape in which the horizontal width thereof decreases from the lower side to the upper side thereof in the vertical direction (Z direction). The horizontal width of the gate cut structure CT may decrease away from the substrate insulating layer 660, and the horizontal width of the gate cut structure CT may increase away from the interlayer insulating layer 170.

For example, the gate cut structure CT may have a tapered shape in which the horizontal width thereof decreases in the second horizontal direction (Y direction) while extending upward in the vertical direction (Z direction). In some embodiments, the gate cut structure CT may have a tapered shape in which the horizontal width in the first horizontal direction (X direction) and the horizontal width in the second horizontal direction (Y direction) decrease, respectively, while extending upward in the vertical direction (Z direction).

The pair of gate spacers 130 may cover both sidewalls of the gate cut structure CT in the first horizontal direction (X direction). In the gate cut structure CT, a rate at which the horizontal width decreases in the first horizontal direction (X direction) while extending upward in the vertical direction (Z direction) may be less than a rate at which the horizontal width decreases in the second horizontal direction (Y direction).

In some embodiments, the lower surface of the gate cut structure CT and the upper surface of the substrate insulating layer 660 may be at the same vertical level. That is, namely, the gate cut structure CT may extend from the lower surface to the upper surface of the gate electrode 150. In some embodiments, the gate cut structure CT may extend into the interlayer insulating layer 170 from between the pair of gate spacers 130. That is, a portion of the gate cut structure CT may protrude from the lower surface of the interlayer insulating layer 170 into the interlayer insulating layer 170 through the lower and upper surfaces of the gate electrode 150.

In some embodiments, at least two gate cut structures CT adjacent in the first horizontal direction (X direction) may be connected to each other at a lower portion to form an integral body. The at least two gate cut structures CT adjacent to each other in the first horizontal direction (X direction) may be connected to each other while extending under the protective insulating layer 310 therebetween.

In some embodiments, a residual insulating layer CTF may be under the gate electrode 150. A portion of a space between the pair of gate spacers 130 covering both sidewalls of the gate electrode 150 that is not filled by the gate electrode 150 may be limited to a first lower recess 150R. The first lower recess 150R may be a lower portion of the space between the pair of gate spacers 130 covering the both sidewalls of the gate electrode 150. The first lower recess 150R may be between the gate electrode 150 and the substrate insulating layer 660 in the vertical direction (Z direction). The first lower recess 150R may be filled by the residual insulating layer CTF. For example, a residual insulating layer CTF and the gate electrode 150 on the residual insulating layer CTF may be between the pair of gate spacers 130. The residual insulating layer CTF may include the same material as that of the gate cut structure CT. For example, the residual insulating layer CTF may include silicon nitride.

The lower surface of the gate cut structure CT and the lower surface of the residual insulating layer CTF may be at the same vertical level. In some embodiments, the lower surface of the gate cut structure CT, the lower surface of the residual insulating layer CTF, the lower surface of the gate spacer 130, and the lower surface of the fin-type active area FA may be at the same vertical level to form a coplanar surface.

The residual insulating layer CTF may also be below the protective insulating layer 310. A portion of the space between the pair of first inter-gate insulating layers 192 facing each other that is not filled by the second inter-gate insulating layer 194 and the protective insulating layer 310 may be limited to the second lower recess 310R. The residual insulating layer CTF may fill the second lower recess 310R below the protective insulating layer 310. The second lower recess 310R may be between the protective insulating layer 310 and the substrate insulating layer 660 in the vertical direction (Z direction). The second lower recess 310R may mean a lower portion of the protective recess 194R, but for convenience of description, a portion filled by the protection insulating layer 310 may be referred to as the protective recess 194R, and a portion filled with the residual insulating layer CTF below the protective insulating layer 310 may be referred to as the second lower recess 310R. The first lower recess 150R and the second lower recess 310R may be collectively referred to as a lower recess, and the residual insulating layer CTF may fill the lower recess. The residual insulating layer CTF filling the first lower recess 150R may be referred to as a first residual insulating layer, and the residual insulating layer CTF filling the second lower recess 310R may be referred to as a second residual insulating layer. The first residual insulating layer and the second residual insulating layer may include the same material.

The residual insulating layer CTF below the protective insulating layer 310 and filling the second lower recess 310R, that is, the second residual insulating layer, may be interposed at a lower portion of a space between the pair of first inter-gate insulating layers 192 facing each other. The residual insulating layer CTF below the protective insulating layer 310, that is, the second residual insulating layer, and the residual insulating layer CTF below the gate electrode 150, that is, the first residual insulating layer, may have substantially the same thickness. The upper surface of the residual insulating layer CTF in contact with the gate electrode 150, that is, the upper surface of the first residual insulating layer, may have a convexly round shape toward the upper gate electrode 150. When the protective insulating layer 310 and the residual insulating layer CTF include the same material, for example, silicon nitride, the residual insulating layer CTF below the protective insulating layer 310 may be regarded as a portion of the protective insulating layer 310.

The integrated circuit device 1 may include a plurality of gap insulating layers 400S arranged adjacent to the plurality of fin-type active areas FA on the substrate insulating layer 660. In some embodiments, the gap insulating layers 400S have the gate insulating layer 145 therebetween, and may cover at least a portion of a sidewall of the fin-type active area FA. In some other embodiments, the gate insulating layer 145 may not be between a gap insulating layer 400S and the sidewall of the fin-type active area FA, and the gap insulating layer 400S may directly contact the fin-type active area FA. In some embodiments, the gap insulating layer 400S may cover a lower portion of the sidewall of the fin-type active area FA.

In some embodiments, a pair of gap insulating layers 400S may be adjacently on both sidewalls of one fin-type active area FA in an extension direction of the gate electrode 150, that is, the second horizontal direction (Y direction). The gate cut structure CT may be apart from the fin-type active area FA with the gap insulating layer 400S therebetween. The pair of gap insulating layers 400S may be on lower portions of the both sidewalls of the gate cut structure CT in the second horizontal direction (Y direction). The pair of gap insulating layers 400S may contact the lower portions of both sidewalls of the gate cut structure CT. The gap insulating layer 400S may define the horizontal width of the gate cut structure CT, for example, a horizontal width in the second horizontal direction (Y direction). For example, when the horizontal width of the gap insulating layer 400S increases in the second horizontal direction, the horizontal width of the gate cut structure CT in the second horizontal direction (Y direction) may decrease in proportion thereto.

When the gate cut structure CT is not arranged between two fin-type active areas FA adjacent to each other in the second horizontal direction, the gap insulating layer 400S may be between the residual insulating layer CTF and the fin-type active area FA. In some embodiments, the thickness of the gap insulating layer 400S may be substantially the same as the thickness of the residual insulating layer CTF. For example, the upper surface of the gap insulating layer 400S may be at the same vertical level as the upper surface of the residual insulating layer CTF, and the lower surface of the gap insulating layer 400S may be at the same vertical level as the lower surface of the residual insulating layer CTF. In some embodiments, the lower surface of the gate cut structure CT, the lower surface of the gap insulating layer 400S, the lower surface of the residual insulating layer CTF, the lower surface of the gate spacer 130, and the lower surface of the fin-type active area FA may be at the same vertical level to form a coplanar surface.

In some embodiments, in one of the first region R1 and the second region R2, an insulating spacer in contact with the source/drain area 160 may be formed in a space between each of the plurality of nanosheets N1, N2, and N3. The insulating spacer may be between a sub-gate portion 150S and the source/drain area 160 in a space between the fin-type active area FA and each of the plurality of nanosheets N1, N2, and N3.

The integrated circuit device 1 according to an embodiment of inventive concepts includes the gate cut structure CT having a tapered shape in which the horizontal width thereof decreases from a lower side to an upper side thereof in the vertical direction (Z direction) between the pair of gate spacers 130 from the upper surface of the substrate insulating layer 660. The gate cut structure CT may be formed by removing a portion of a lower surface of the gate electrode 150 to form the gate cut hole CTH, and then filling the gate cut hole CTH with an insulating material. Therefore, it is possible to limit and/or prevent damage to components around and above the gate electrode 150 in the process of forming the gate cut structure CT.

In addition, by the fin-type active area FA or the plurality of fin-type active areas FA and the gap insulating layer 400S, the gate cut hole CTH and the gate cut structure CT filling the gate cut hole CTH may be formed in self-alignment.

Accordingly, the integrated circuit device 1 according to embodiments of inventive concepts includes the gate electrode 150 that is a metal gate containing a metal, and the degree of integration may be increased.

Figure 11A:
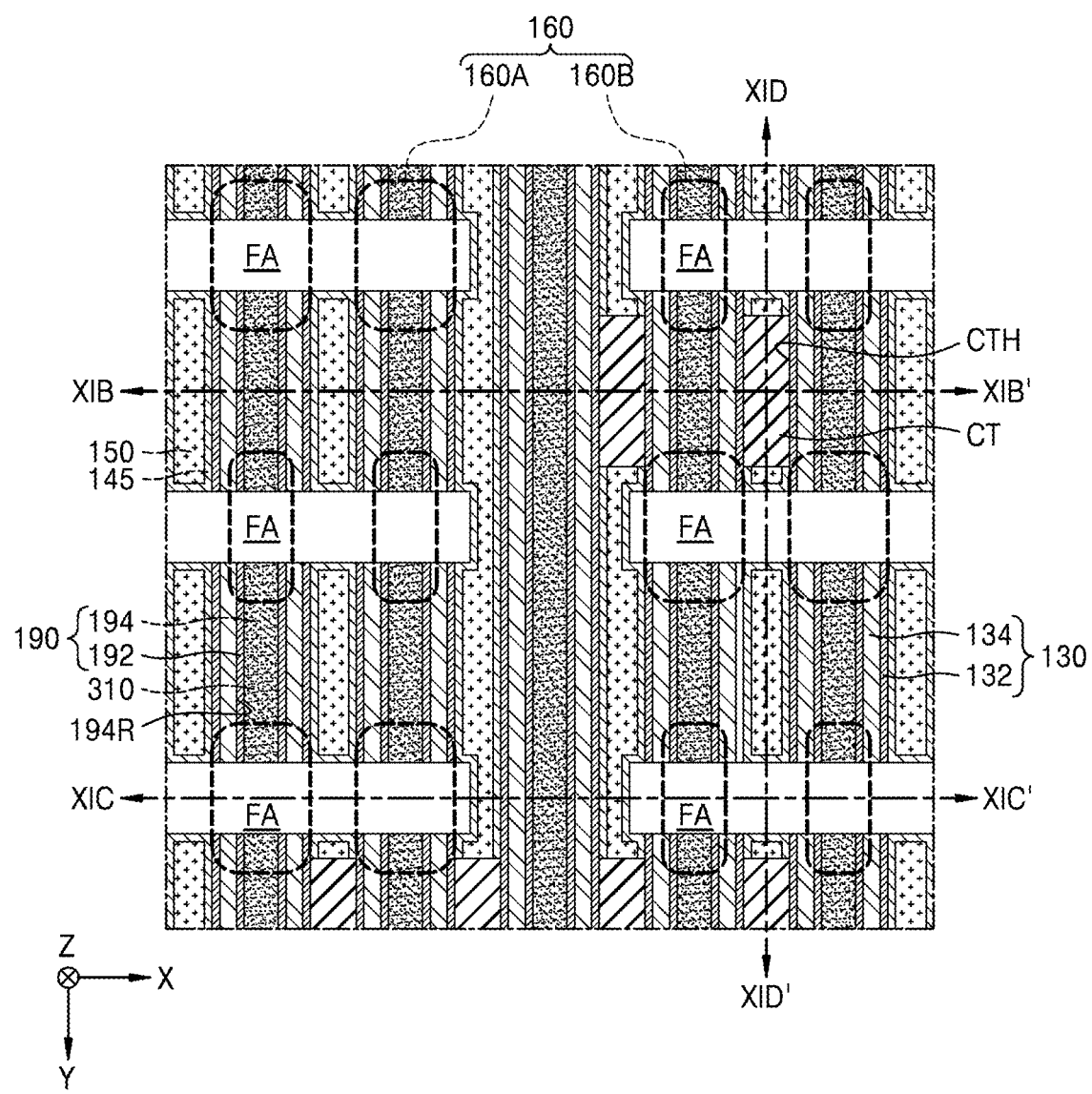
Figure 11B:
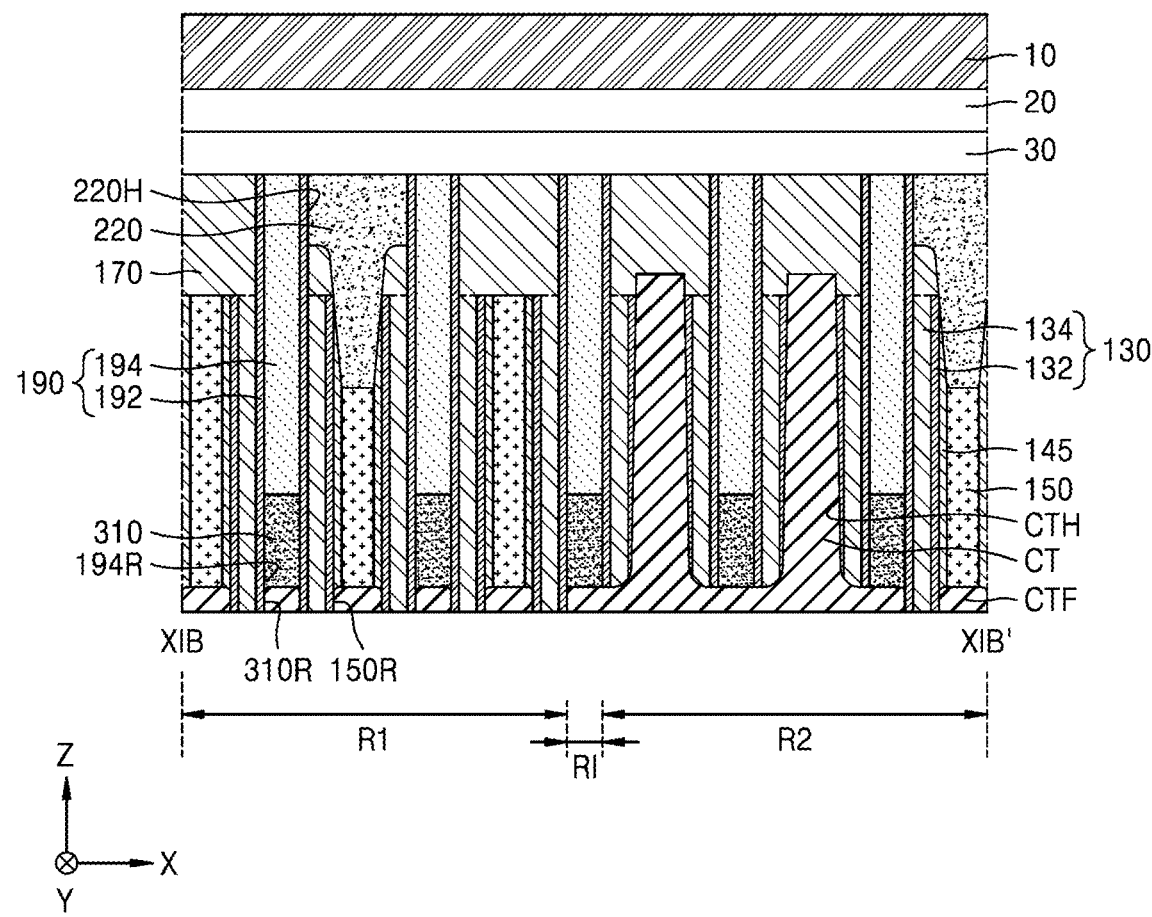
Figure 11C:
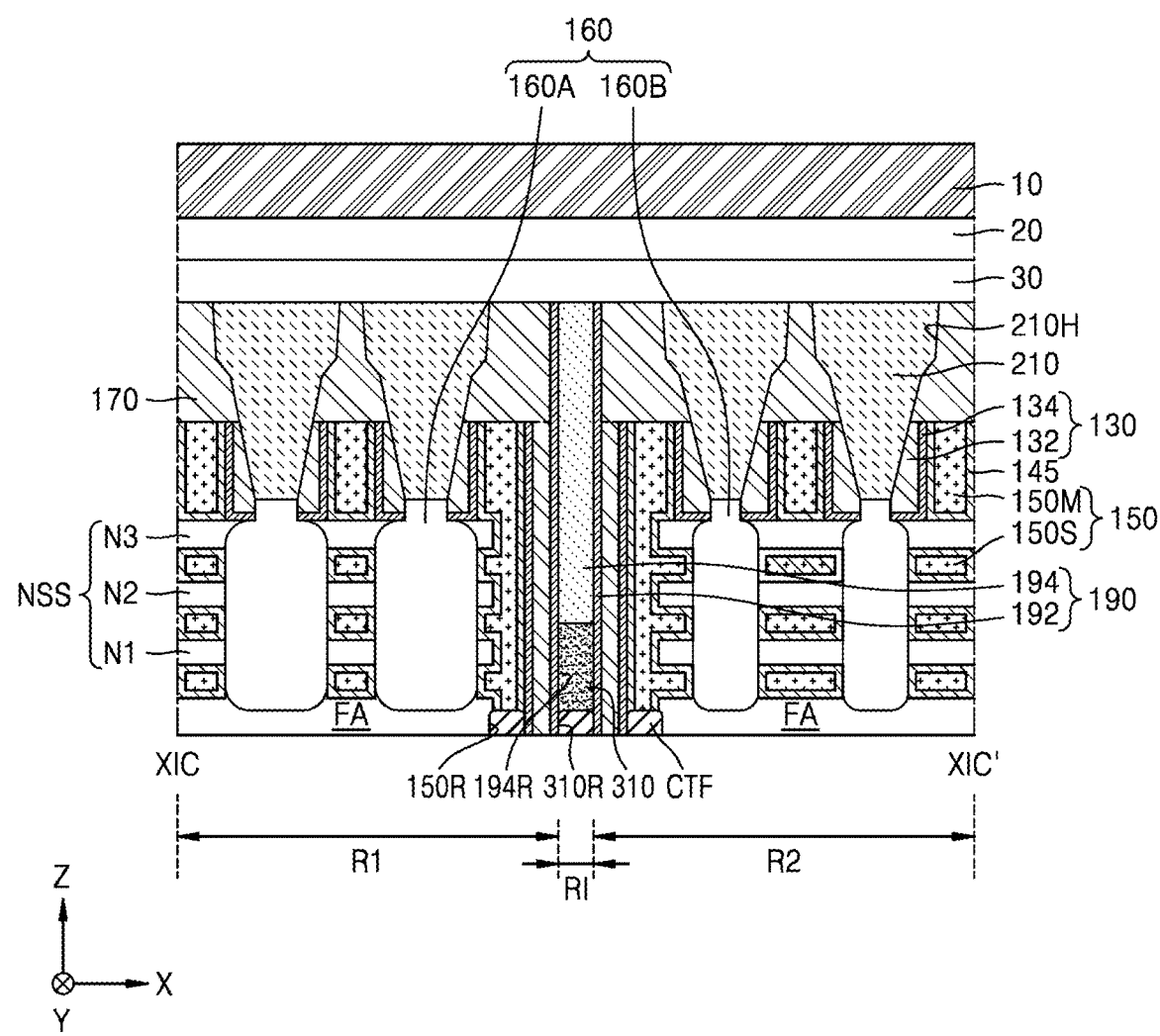
Figure 11D:
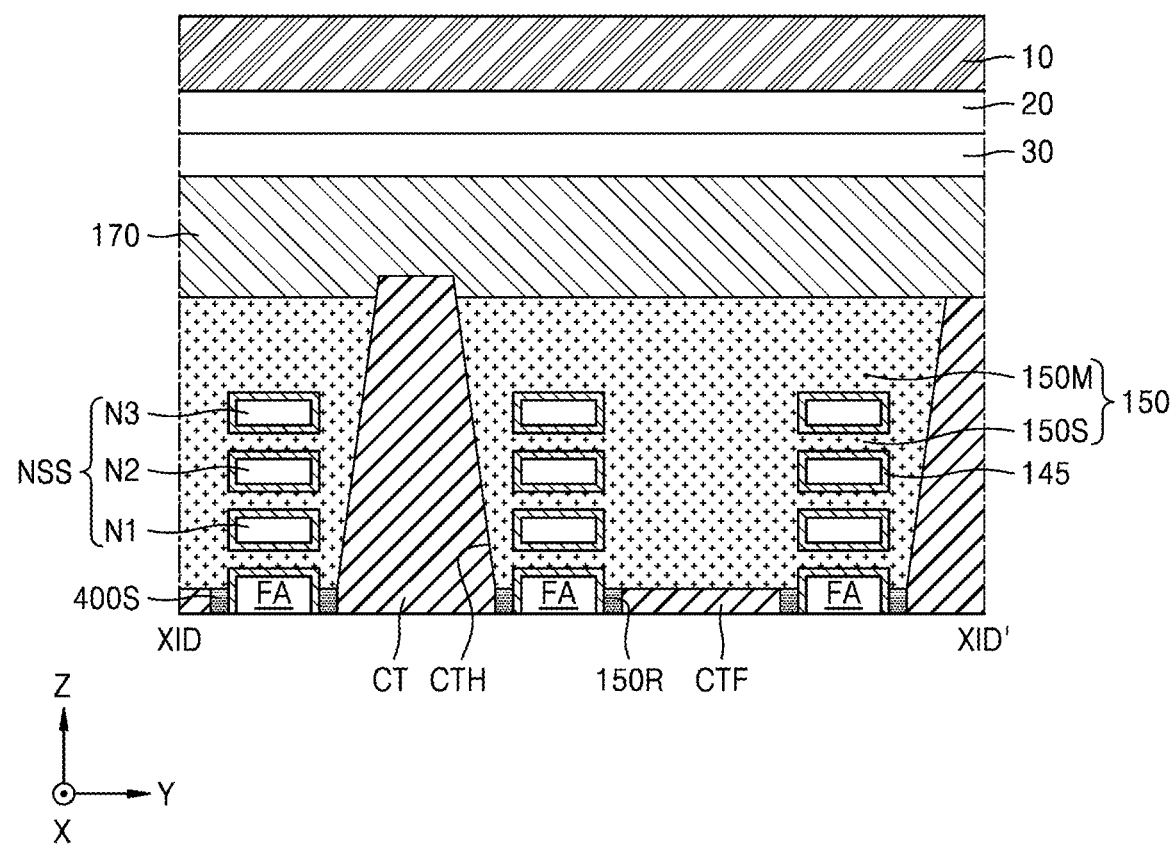

FIGS. 2A to 11D are plan layout views and cross-sectional views illustrating a method of manufacturing an integrated circuit device, according to embodiments. In more detail, FIGS. 2B, 2C, and 2D are cross-sectional views of the integrated circuit device, taken along lines IIB-IIB', IIC-IIC', and IID-IID' of FIG. 2A; FIGS. 3B, 3C, and 3D are cross-sectional views of the integrated circuit device, taken along lines IIIB-IIIB', IIIC-IIIC', and IIID-IIID' of FIG. 3A; FIGS. 4B, 4C, and 4D are cross-sectional views of the integrated circuit device, taken along lines IVB-IVB', IVC-IVC', and IVD-IVD' of FIG. 4A; FIGS. 5B, 5C, and 5D are cross-sectional views of the integrated circuit device, taken along lines VB-VB', VC-VC', and VD-VD' of FIG. 5A; FIGS. 6B, 6C, and 6D are cross-sectional views of the integrated circuit device, taken along lines VIB-VIB', VIC-VIC', and VID-VID' of FIG. 6; FIGS. 7B, 7C, and 7D are cross-sectional views of the integrated circuit device, taken along lines VIIB-VIIB', VIIC-VIC', and VIID-VID' of FIG. 7A; FIGS. 8B, 8C, and 8D are cross-sectional views of the integrated circuit device, taken along lines VIIIB-VIIIB', VIIIC-VIIIC', and VIIID-VIIID' of FIG. 8A; FIGS. 9B, 9C, and 9D are cross-sectional views of the integrated circuit device, taken along lines IXB-IXB', IXC-IXC', and IXD-IXD' of FIG. 9A; FIGS. 10B, 10C, and 10D are cross-sectional views of the integrated circuit device, taken along lines XB-XB', XC-XC', and XD-XD' of FIG. 10A; and FIGS. 11B, 11C, and 11D are cross-sectional views of the integrated circuit device, taken along lines XIB-XIB', XIC-XIC', and XID-XID' of FIG. 11A.

Referring to FIGS. 2A to 2D together, the substrate 110 having the plurality of fin-type active areas FA defined by a device isolation layer 120, the plurality of nanosheet stacked structures NSS facing the upper surfaces of the plurality of fin-type active areas FA and respectively including the plurality of nanosheets N1, N2, and N3, the plurality of source/drain areas 160 on the plurality of fin-type active areas FA and respectively connected to ends of the plurality of adjacent nanosheets N1, N2, and N3, the plurality of gate electrodes 150 each surrounding at least a portion of the plurality of nano sheets N1, N2, and N3 while covering the nanosheet stacked structure NSS in the fin-type active area FA, the gate insulating layer 145 between the fin-type active area FA and the gate electrode 150, between the nanosheet stacked structure NSS and the gate electrode 150, and between the source/drain area 160 and the gate electrode 150, the plurality of gate spacers 130 covering sidewalls of the plurality of gate electrodes 150, the inter-gate insulating layer 190 filling a space between the plurality of gate spacers 130 covering the sidewalls of the plurality of gate electrodes 150, the interlayer insulating layer 170 covering the plurality of gate spacers 130 and the plurality of gate electrodes 150, the plurality of first contact plugs 210 passing through the gate spacer 130 and the interlayer insulating layer 170 to be connected to the plurality of source/drain areas 160, and the plurality of second contact plugs 220 passing through the interlayer insulating layer 170 and connected to the plurality of gate electrodes 150 are formed.

After alternately stacking a plurality of sacrificial semiconductor layers and a plurality of nanosheet semiconductor layers including different semiconductor materials on the substrate 110 one-by-one, a stacked structure of the plurality of sacrificial semiconductor layers and the plurality of nanosheet semiconductor layers, and a portion of the substrate 110 are etched to form a plurality of trenches. As a result, the plurality of fin-type active areas FA defined by the plurality of trenches, and a stacked structure NSS of the plurality of nanosheets N1, N2, and N3, and the plurality of sacrificial semiconductor layers on the plurality of fin-type active areas FA may be formed. The stacked structure NSS of the plurality of nanosheets N1, N2, and N3 may be formed by removing a portion of the plurality of nanosheet semiconductor layers by etching. Thereafter, a preliminary device isolation layer filling the plurality of trenches is formed, and the device isolation layer 120 is formed by performing a recess process for removing the preliminary device isolation layer by a partial thickness from the top thereof. Dry etching, wet etching, or a combination of dry etching and wet etching may be used to perform the recess process.

A plurality of dummy gate structures extending to cross at least a portion of the plurality of fin-type active areas FA are formed on the stacked structure NSS of the plurality of nanosheets N1, N2, and N3 and the plurality of fin-type active areas FA in which the plurality of sacrificial semiconductor layers are formed. The plurality of dummy gate structures may be formed to extend in the second horizontal direction (Y direction) in parallel to each other. A dummy gate structure may have a structure in which an oxide layer, a dummy gate layer, and a capping layer are sequentially stacked. In some embodiments, the dummy gate layer may include polysilicon, and the capping layer may include a silicon nitride layer, but embodiments of inventive concepts are not limited thereto.

Thereafter, a gate spacer covering both sidewalls of the dummy gate structure is formed, and a portion of the stacked structure NSS of the plurality of nanosheets N1, N2, and N3 and a portion of the plurality of sacrificial semiconductor layers are removed by etching using the dummy gate structure and the gate spacer 130 as an etch mask to form a recessed region that exposes the fin-type active area FA at a bottom surface thereof. In some embodiments, after removing a portion of the plurality of sacrificial semiconductor layers exposed from both sides of at least some of the plurality of nanosheet stacked structures NSS to form a removal space, an insulating spacer may be formed to fill the removal space formed between each of the plurality of nanosheets N1, N2, and N3.

The plurality of source/drain areas 160 may be formed by epitaxially growing a semiconductor material from both exposed sidewalls of the plurality of nanosheets N1, N2, and N3; and an exposed surface of the fin-type active area FA. In some embodiments, a plurality of first source/drain areas 160A and a plurality of second source/drain areas 160B may be formed by performing separate epitaxial growth processes to include different materials.

An inter-gate insulating layer 190 filling between the plurality of dummy gate structures is formed, the capping layer, the dummy gate layer, and the oxide layer are removed, and the plurality of sacrificial semiconductor layers remaining in the fin-type active area FA are removed to form a plurality of gate spaces. Thereafter, the gate insulating layer 145 is formed on surfaces exposed in the plurality of gate spaces, and the plurality of gate electrodes 150 filling the plurality of gate spaces are formed on the gate insulating layer 145.

After forming the interlayer insulating layer 170 covering the plurality of gate spacers 130 and the plurality of gate electrodes 150, the gate spacers 130 and the interlayer insulating layer 170 are partially etched to form a plurality of first contact holes 210H exposing the plurality of source/drain areas 160, and the interlayer insulating layer 170 are partially etched to form a plurality of second contact holes 220H exposing the plurality of gate electrodes 150. Thereafter, the plurality of first contact plugs 210 filling the plurality of first contact holes 210H and the plurality of second contact plugs 220 filling the plurality of second contact holes 220H are formed.

Thereafter, after a first bonding layer 20 is formed on a support substrate 10 and a second bonding layer 30 is formed on the interlayer insulating layer 170, the substrate 110 on which the plurality of fin-type active areas FA, the plurality of nanosheet stacked structures NSS, the plurality of source/drain areas 160, the plurality of gate electrodes 150, the gate insulating layer 145, the plurality of gate spacers 130, the inter-gate insulating layer 190, the interlayer insulating layer 170, the plurality of first contact plugs 210, and the plurality of second contact plugs 222 are formed is attached to the support substrate 10 so that the first bonding layer 20 and the second bonding layer 30 are in contact with each other.

The support substrate 10 may be a semiconductor substrate, a glass substrate, a ceramic substrate, or a plastic substrate. In some embodiments, each of the first bonding layer 20 and the second bonding layer 30 may include any one of SiO, SiN, SiCN, SiCO, and a polymer material. For example, the polymer material may be benzocyclobutene (BCB), polyimide (PI), polybenzoxazole (PBO), silicone, acrylate, or epoxy. In some embodiments, the first bonding layer 20 and the second bonding layer 30 may include the same material. The first bonding layer 20 and the second bonding layer 30 may be bonded to each other by applying heat and/or pressure. In some embodiments, the first bonding layer 20 and the second bonding layer 30 may be bonded to each other by forming a covalent bond. In some other embodiments, the first bonding layer 20 and the second bonding layer 30 may include an adhesive material.

Figure 2A:
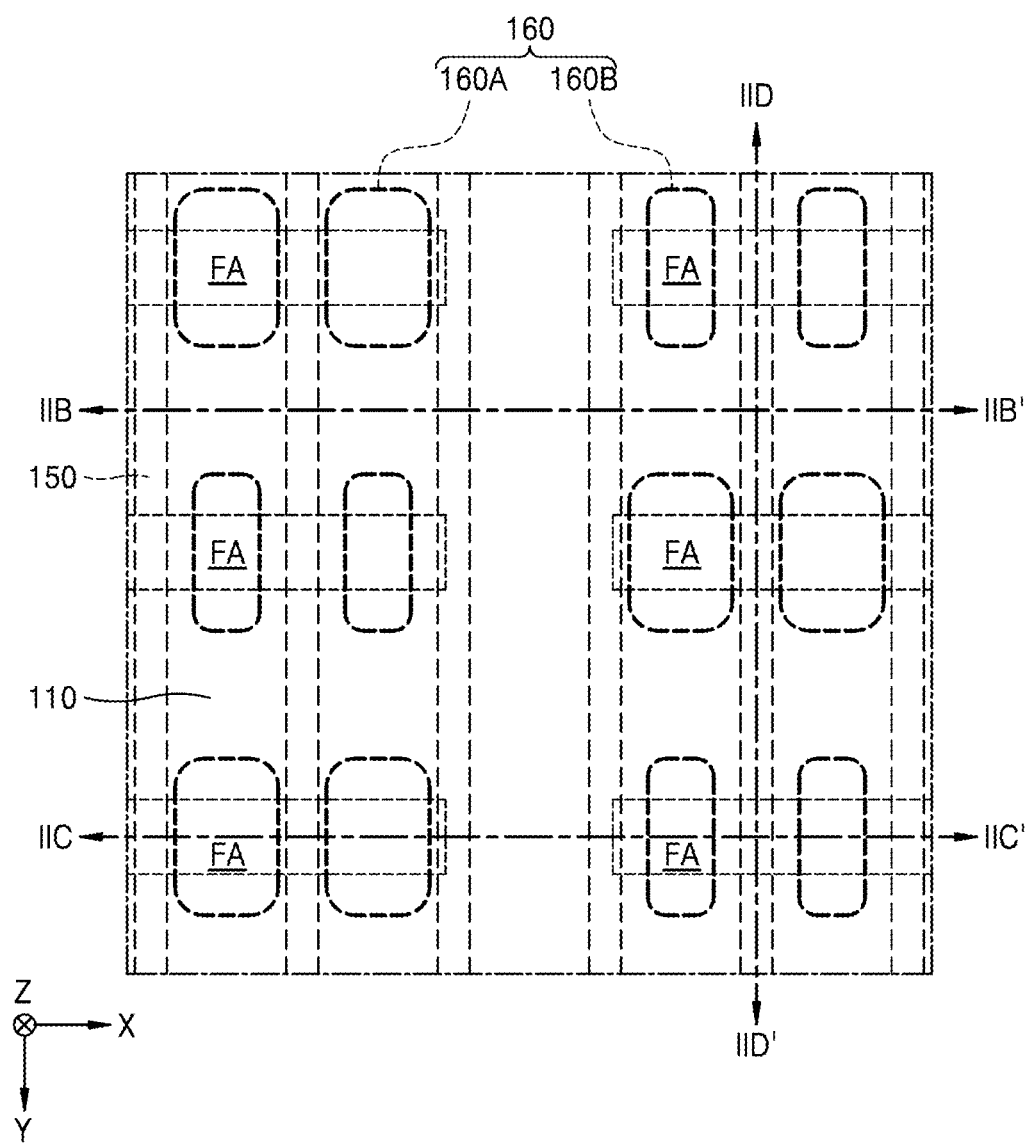
FIGS. 2A to 11D are plan layout views and cross-sectional views illustrating a method of manufacturing an integrated circuit device, according to embodiments.
Figure 2B:
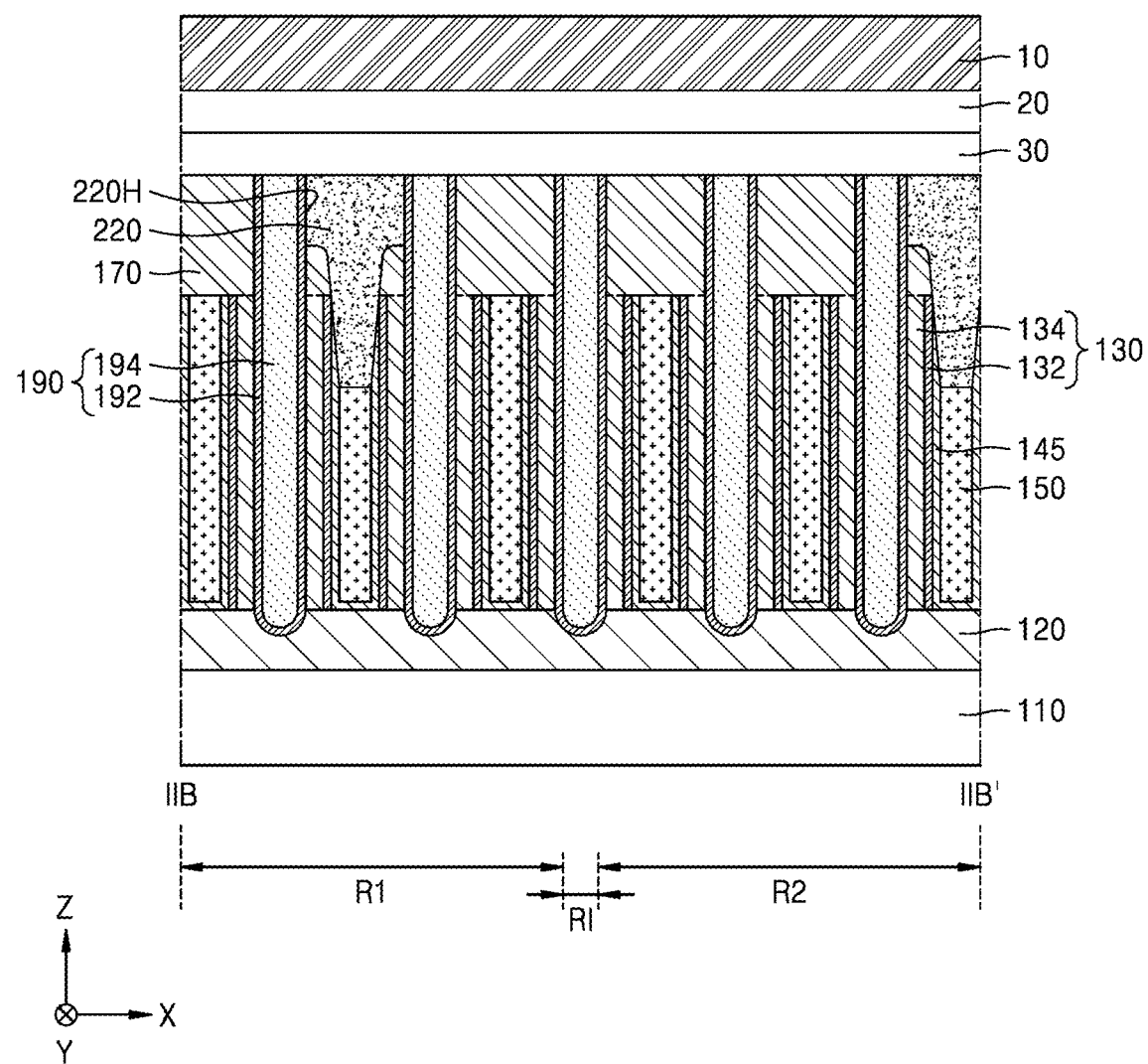
Figure 2C:
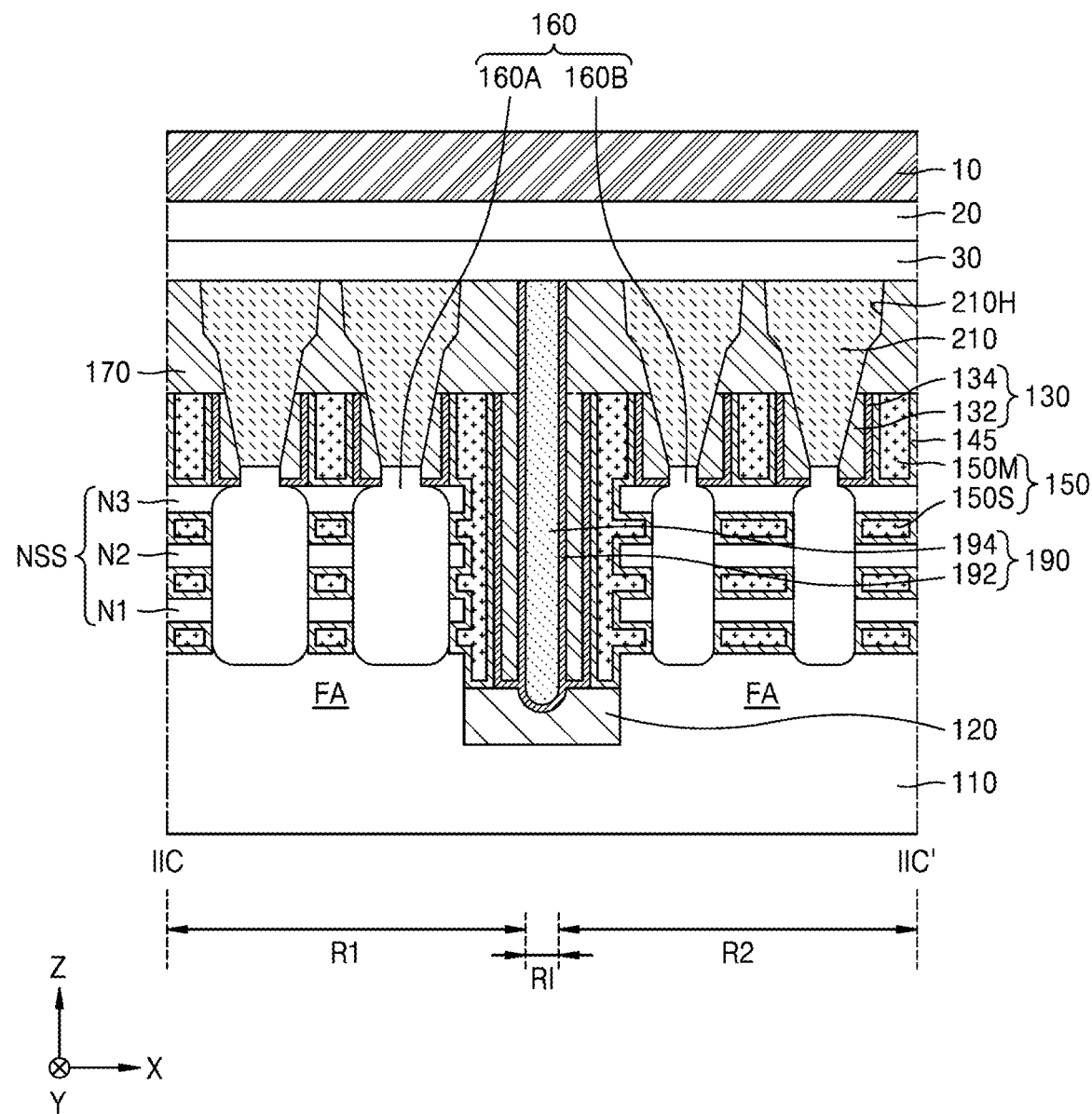
Figure 2D:
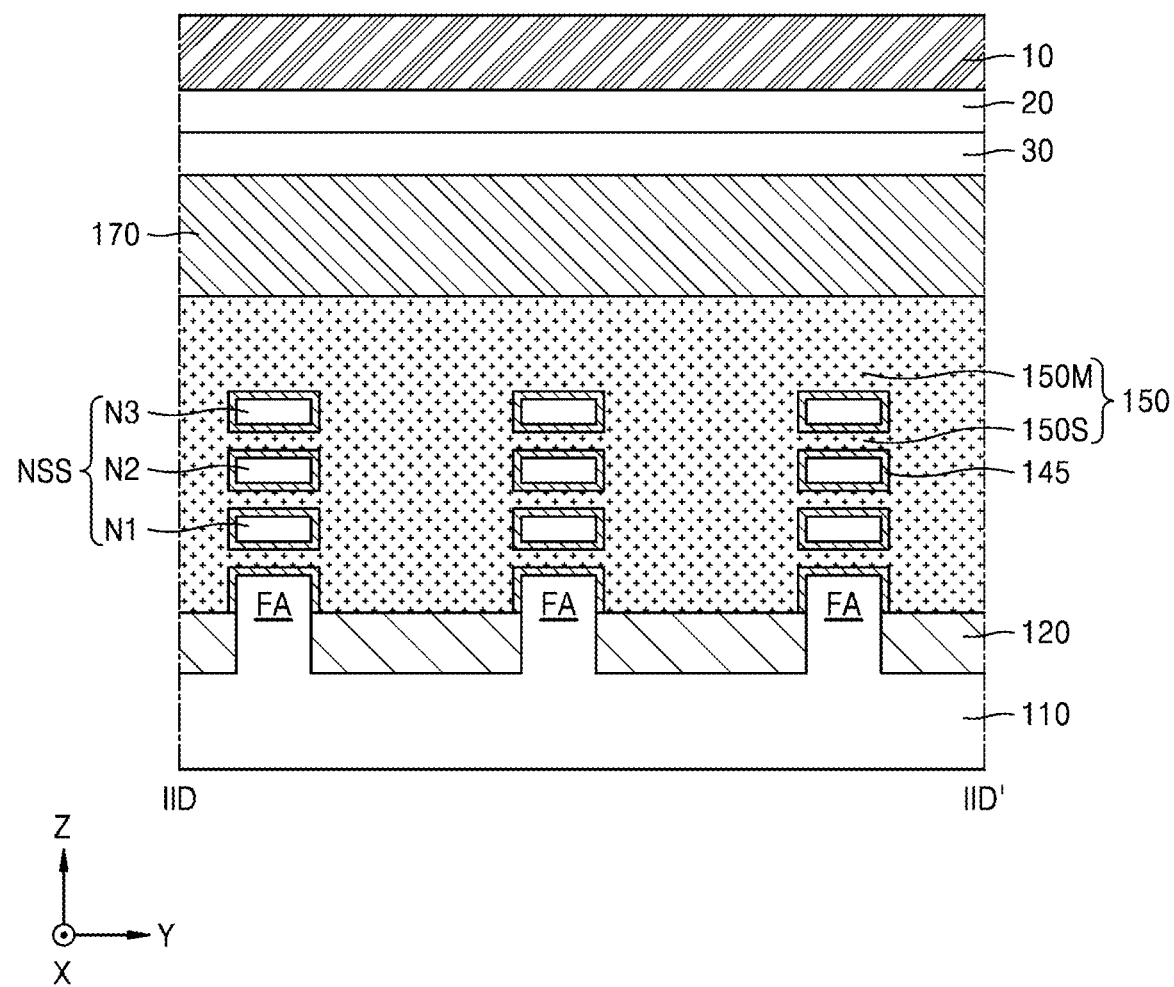
Figure 3A:
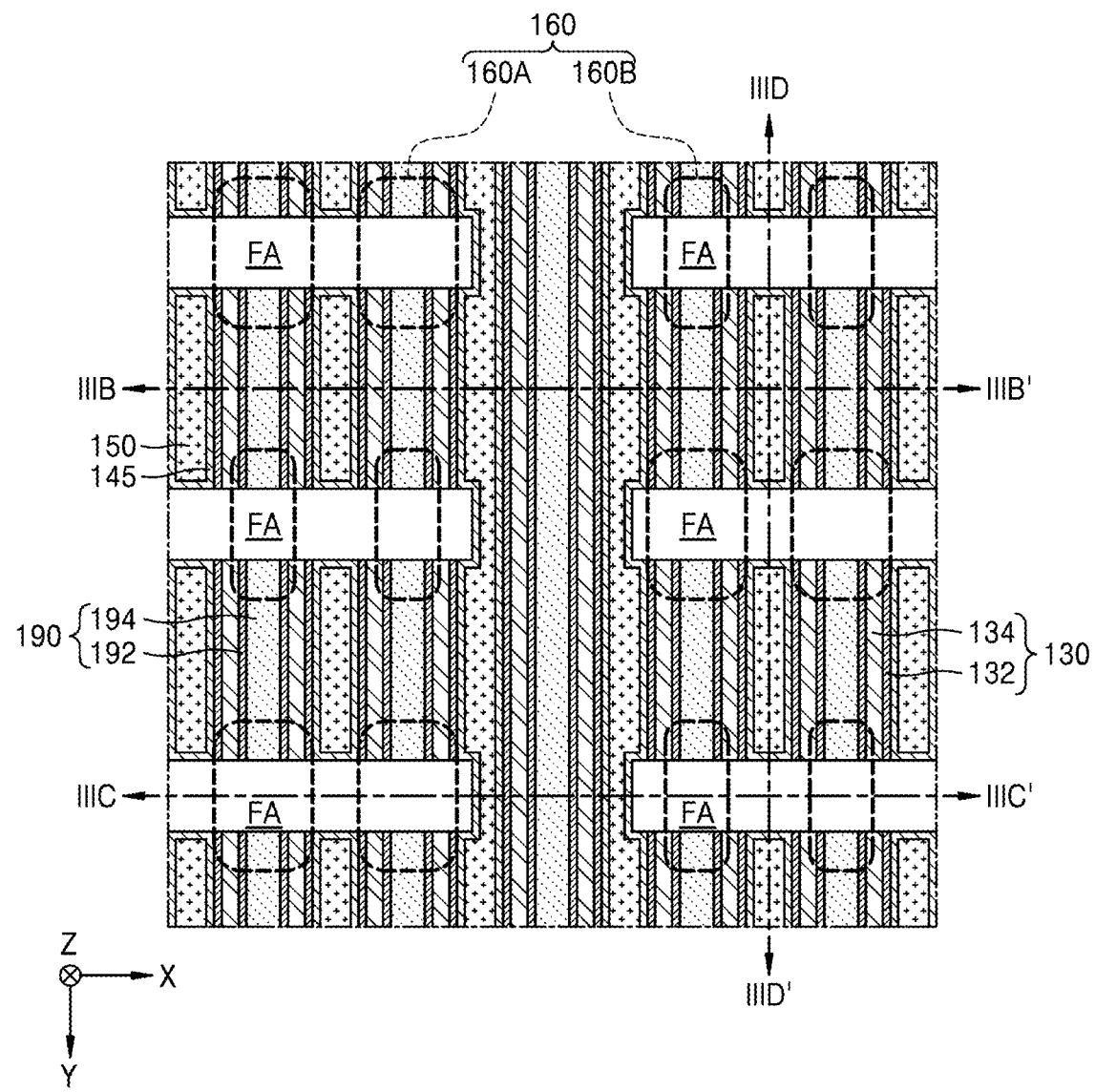
Figure 3B:
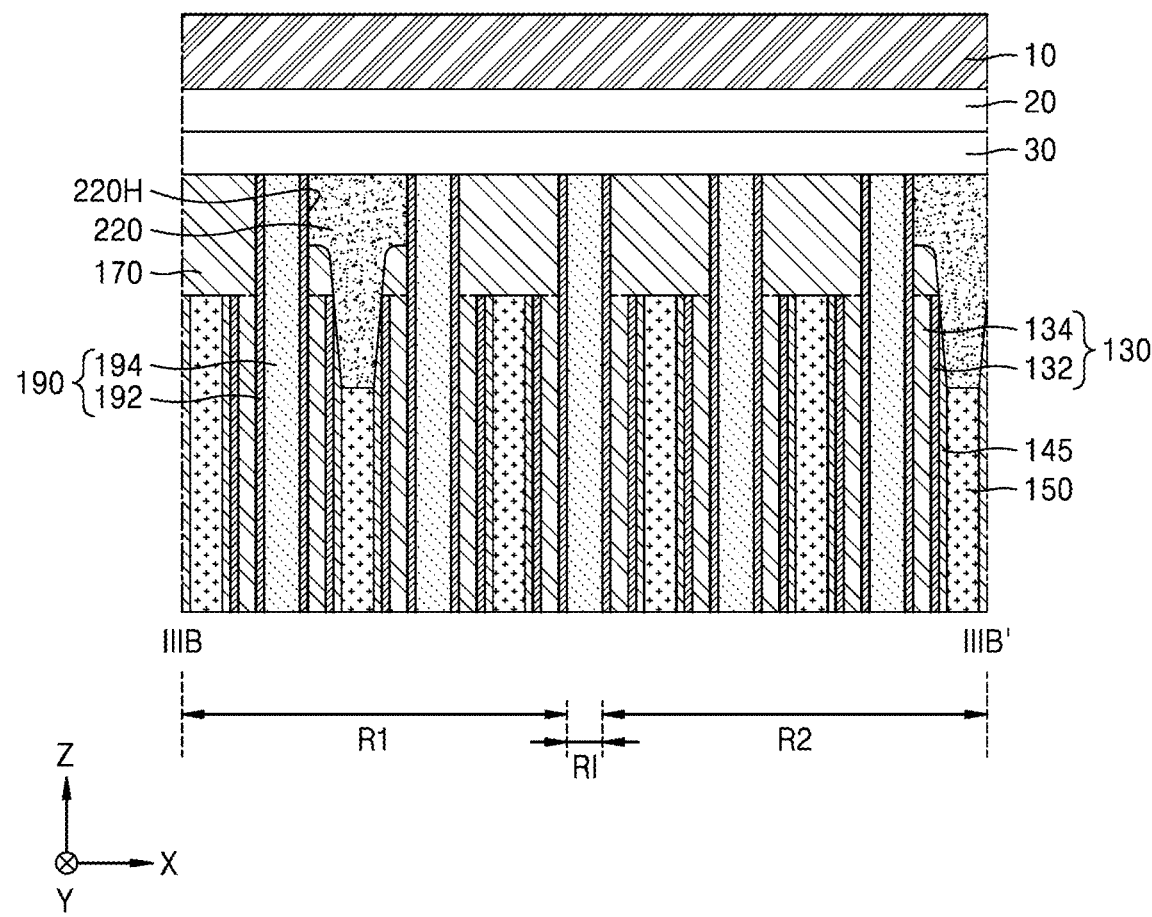
Figure 3C:
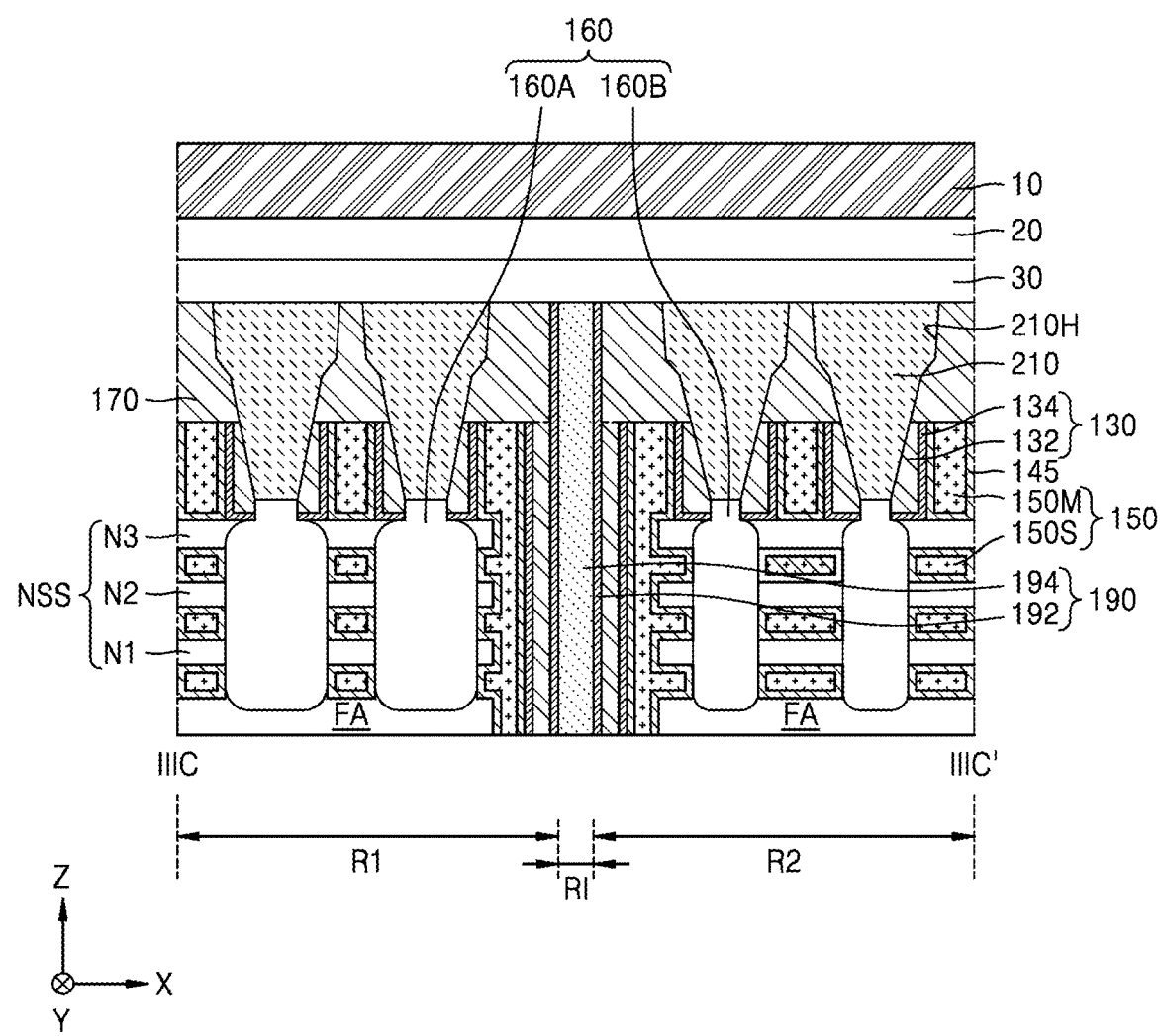
Figure 3D:
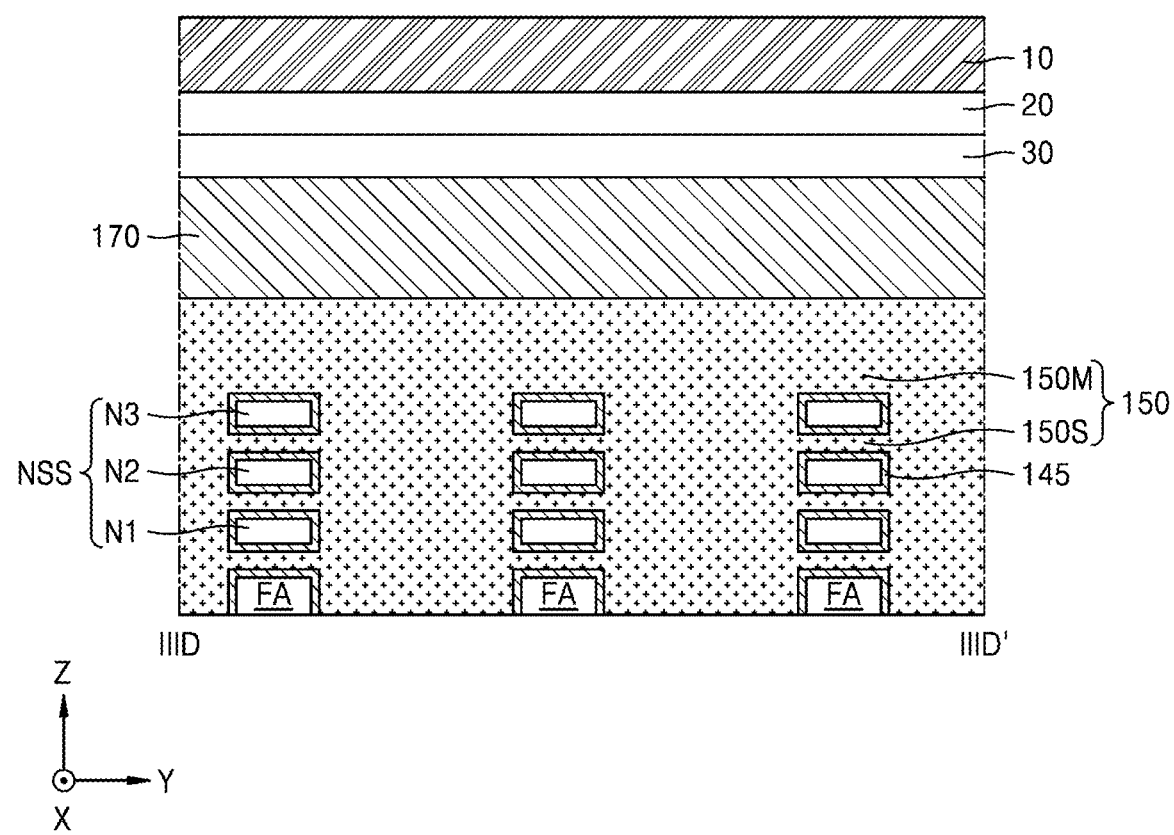
Figure 4A:
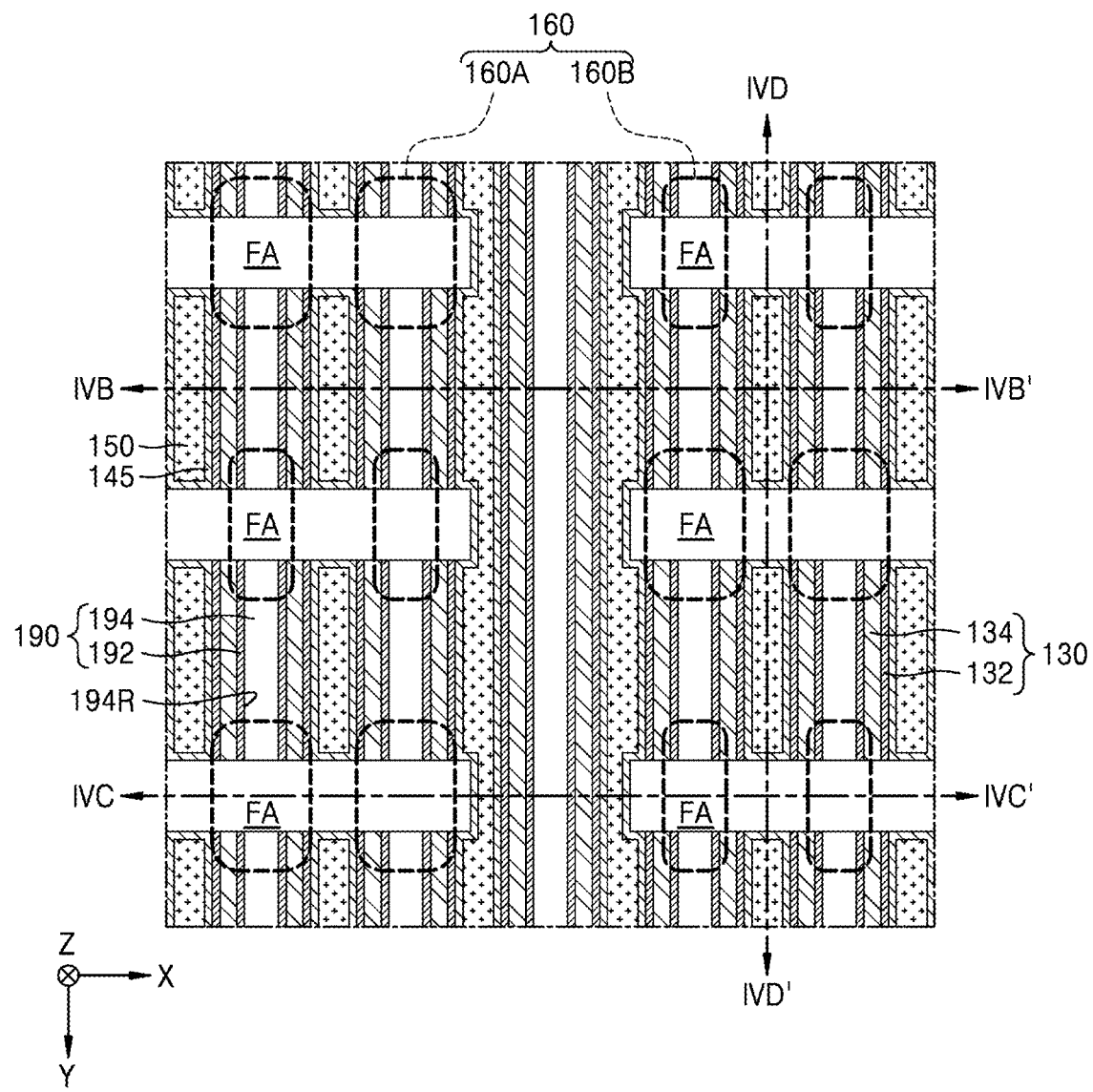
Figure 4B:
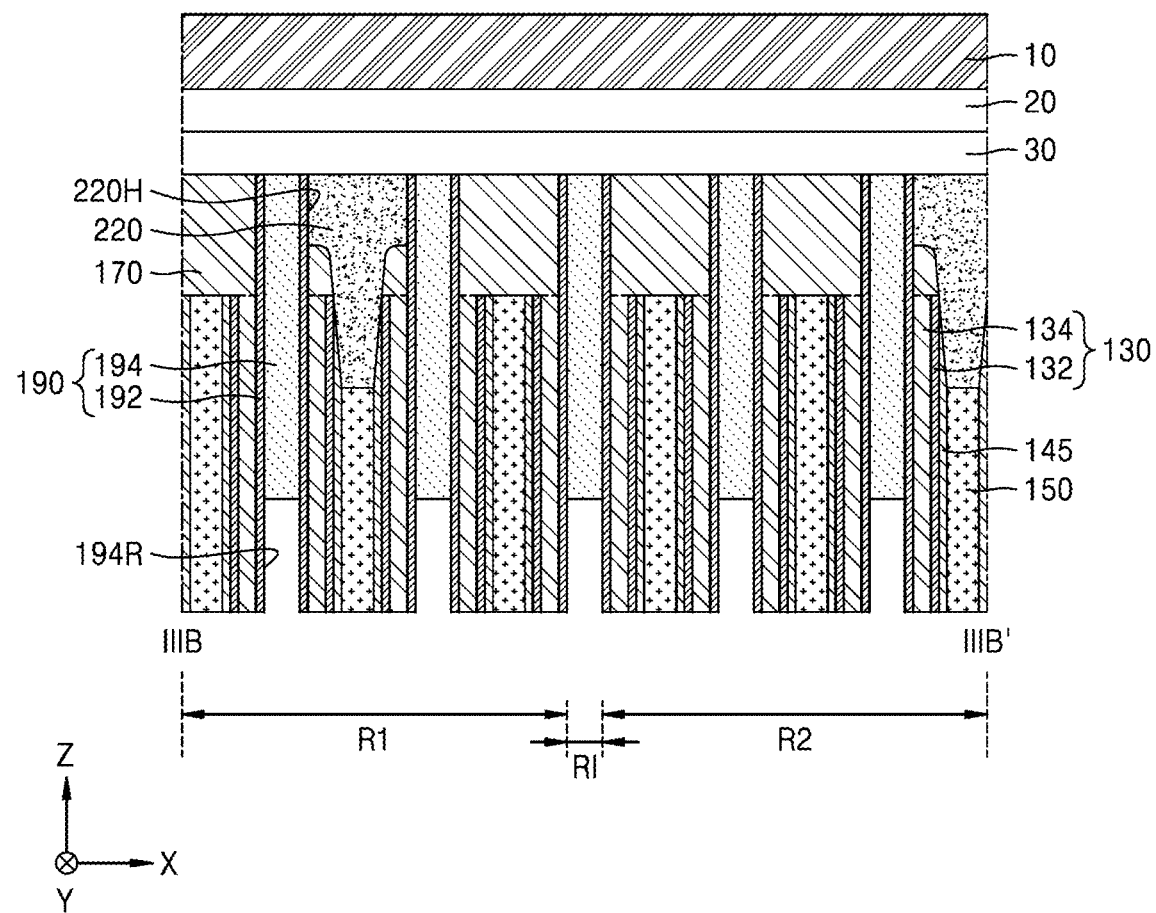
Figure 4C:
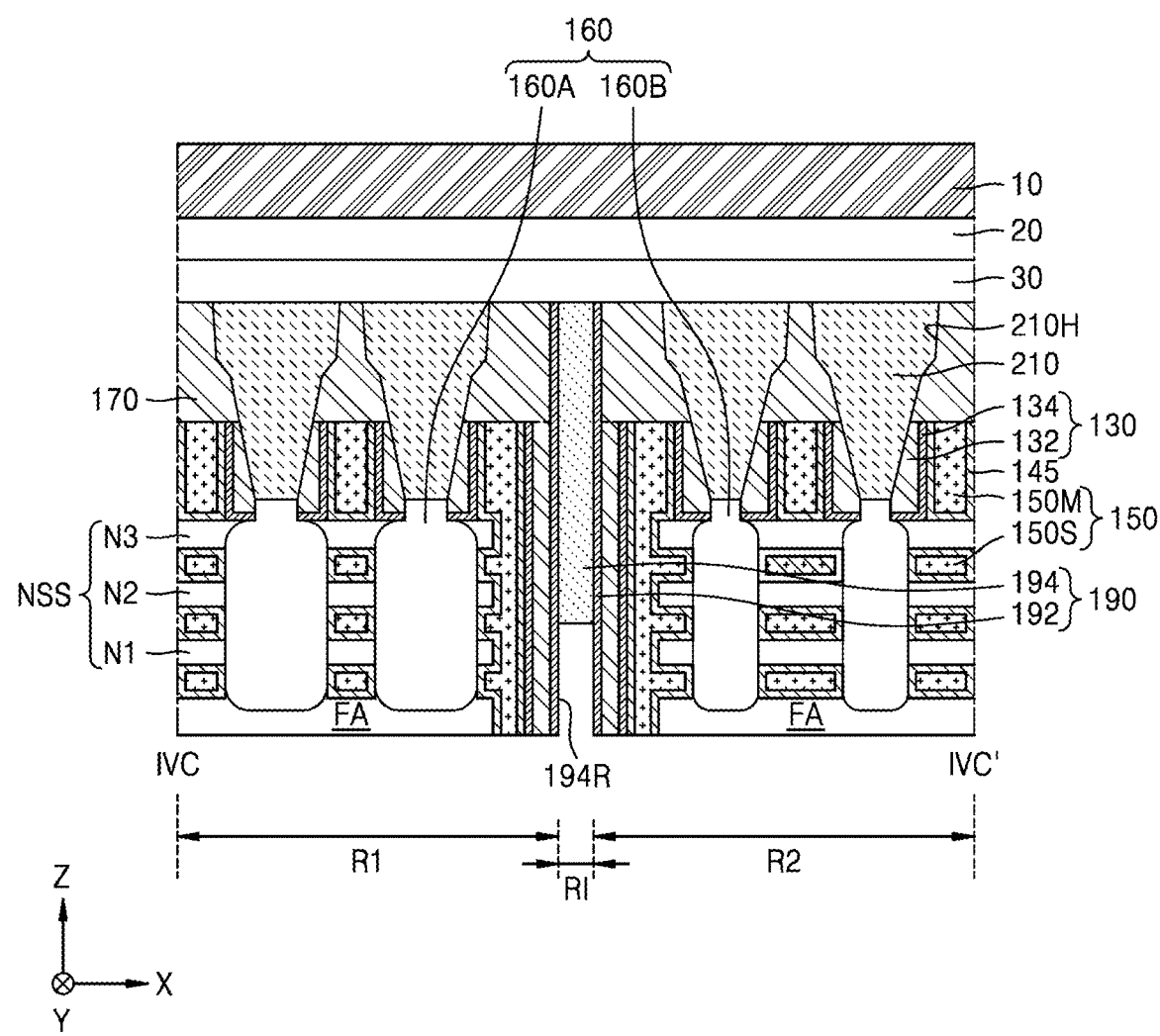
Figure 4D:
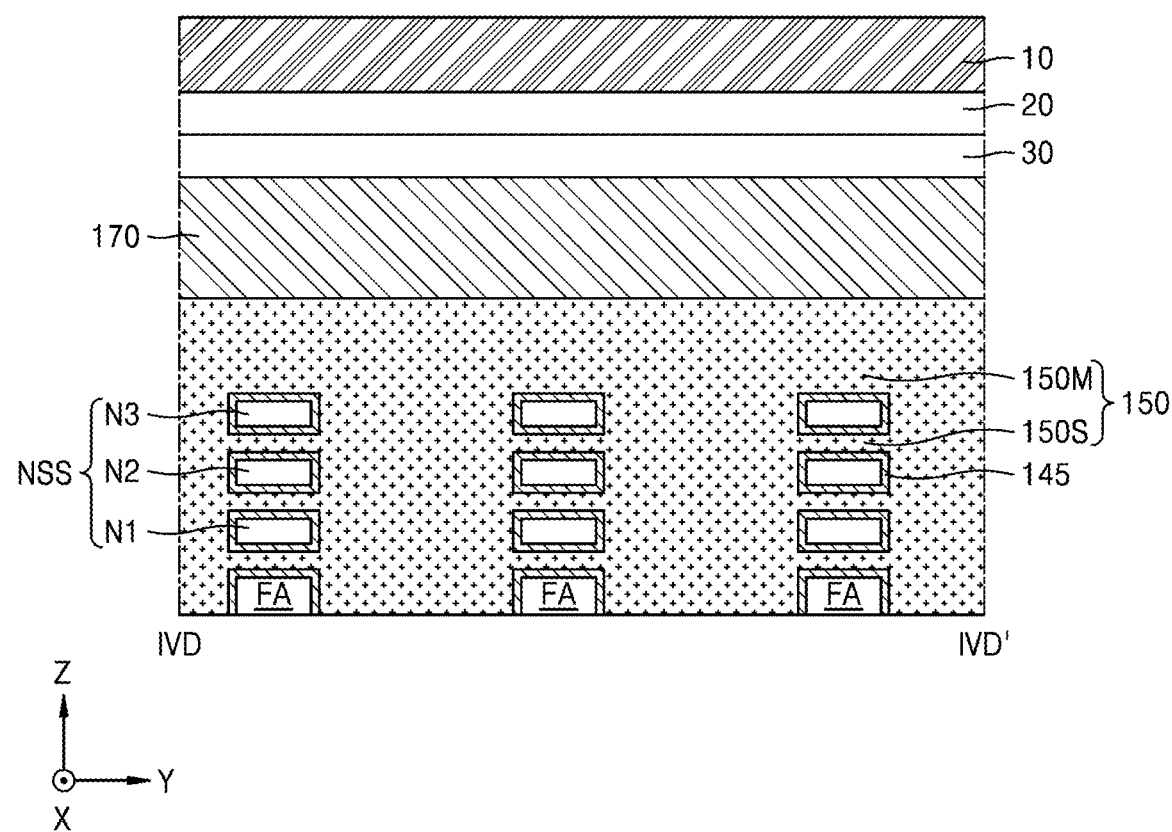
Figure 5A:
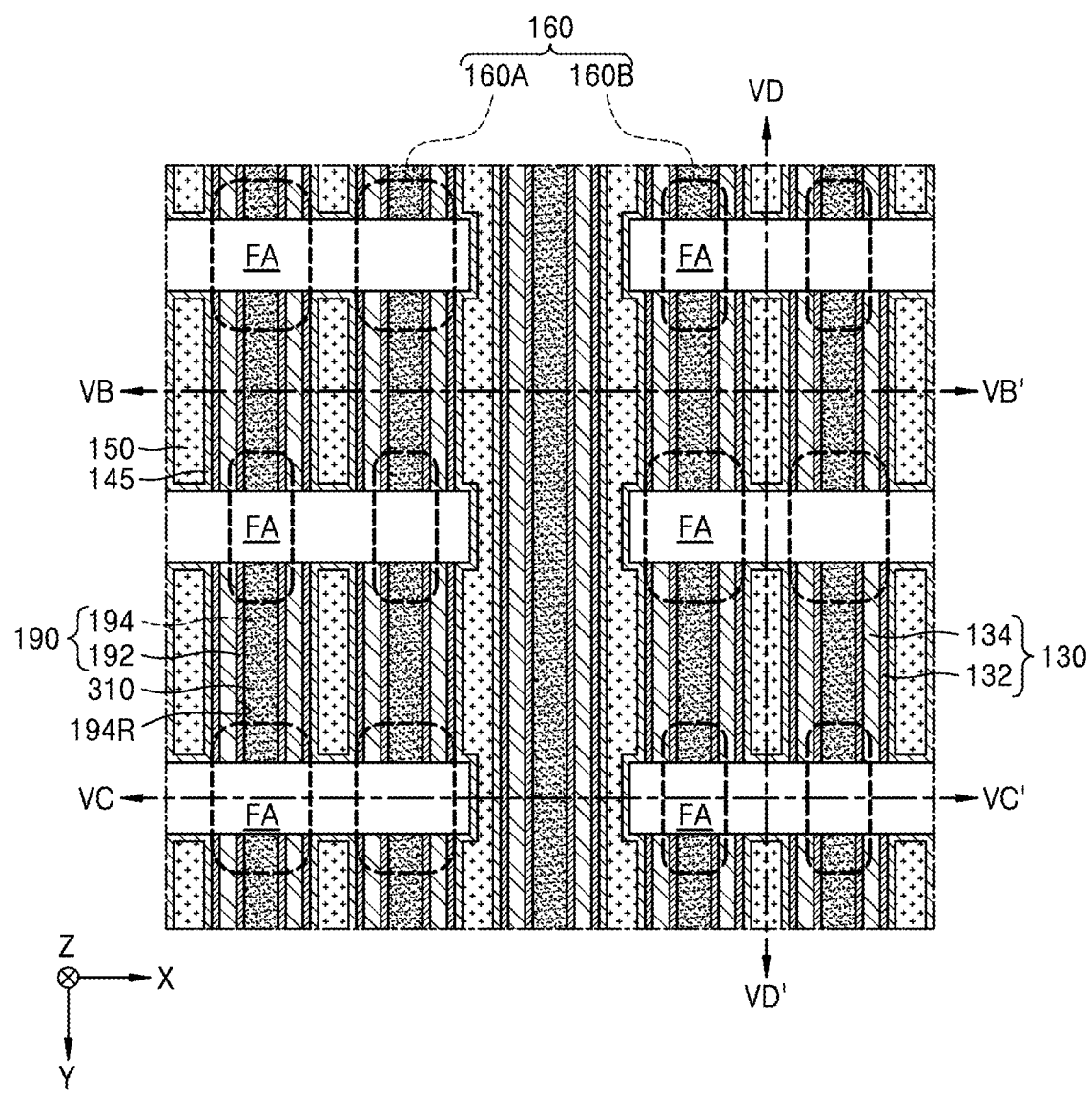
Figure 5B:
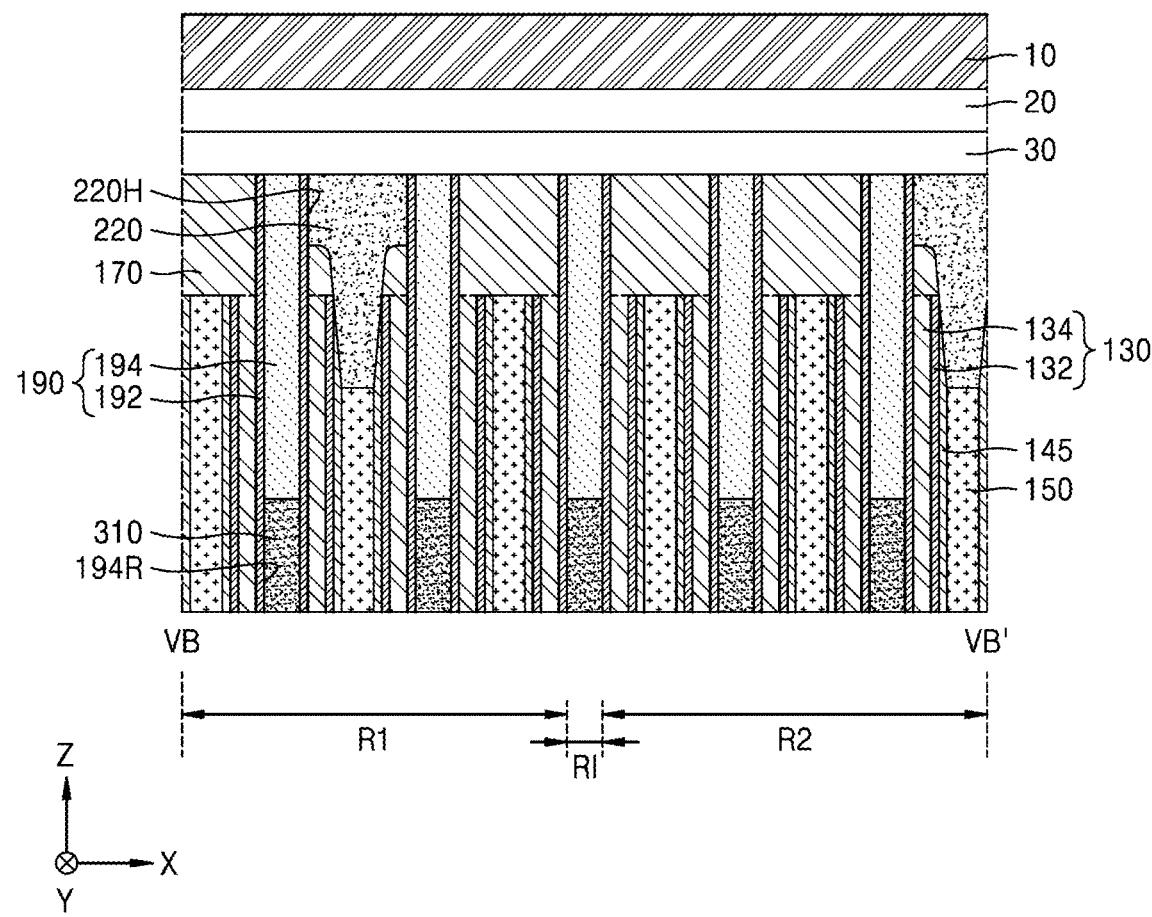
Figure 5C:
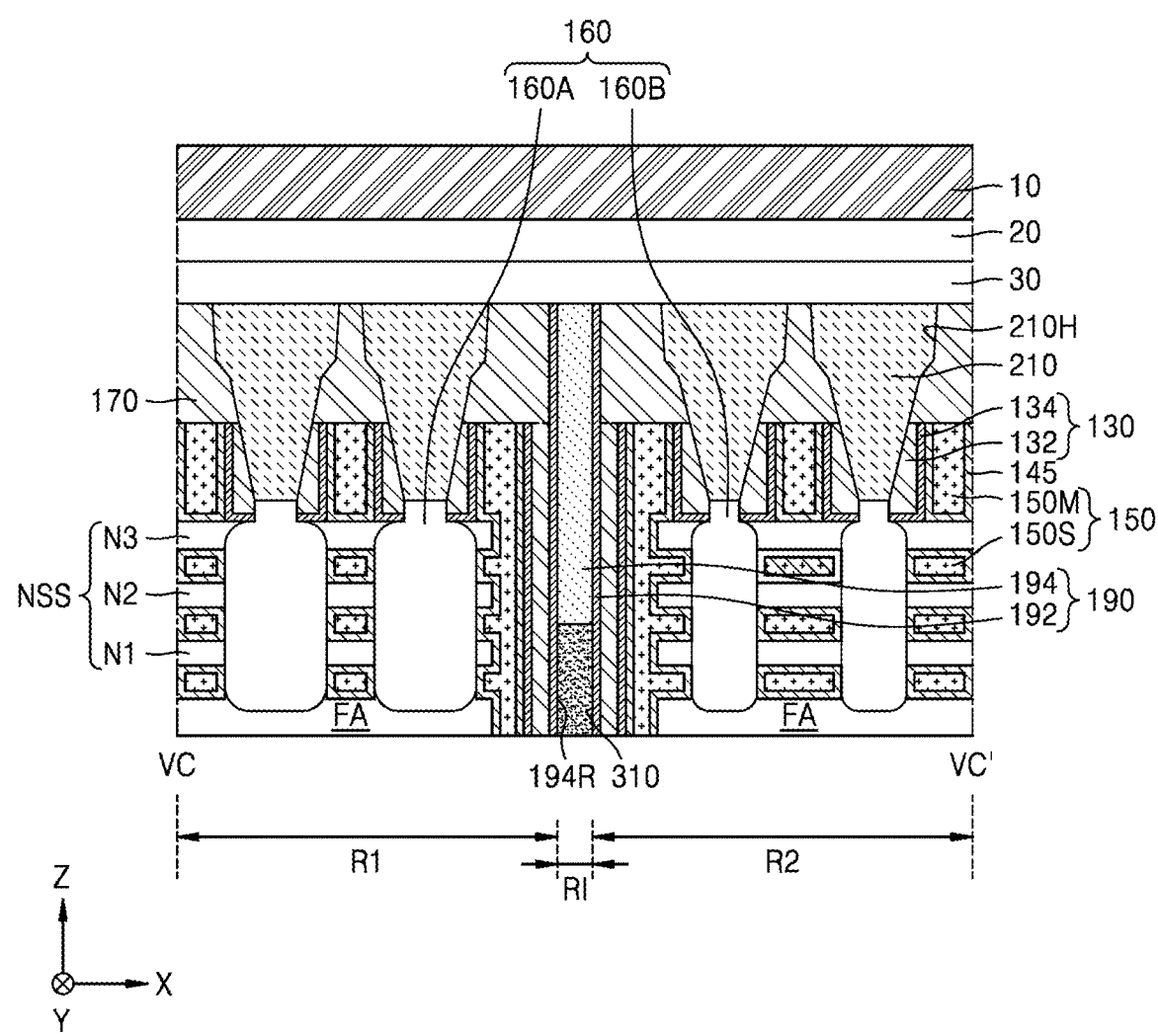
Figure 5D:
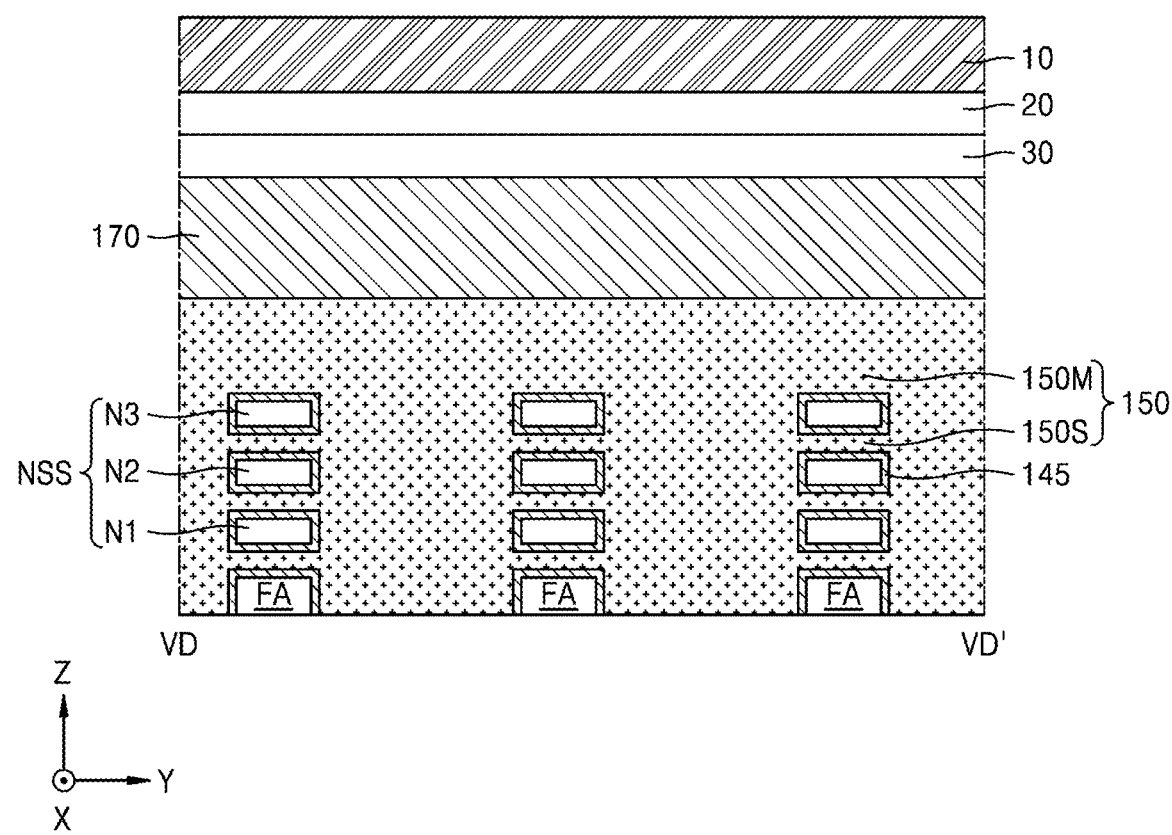
Figure 6A:
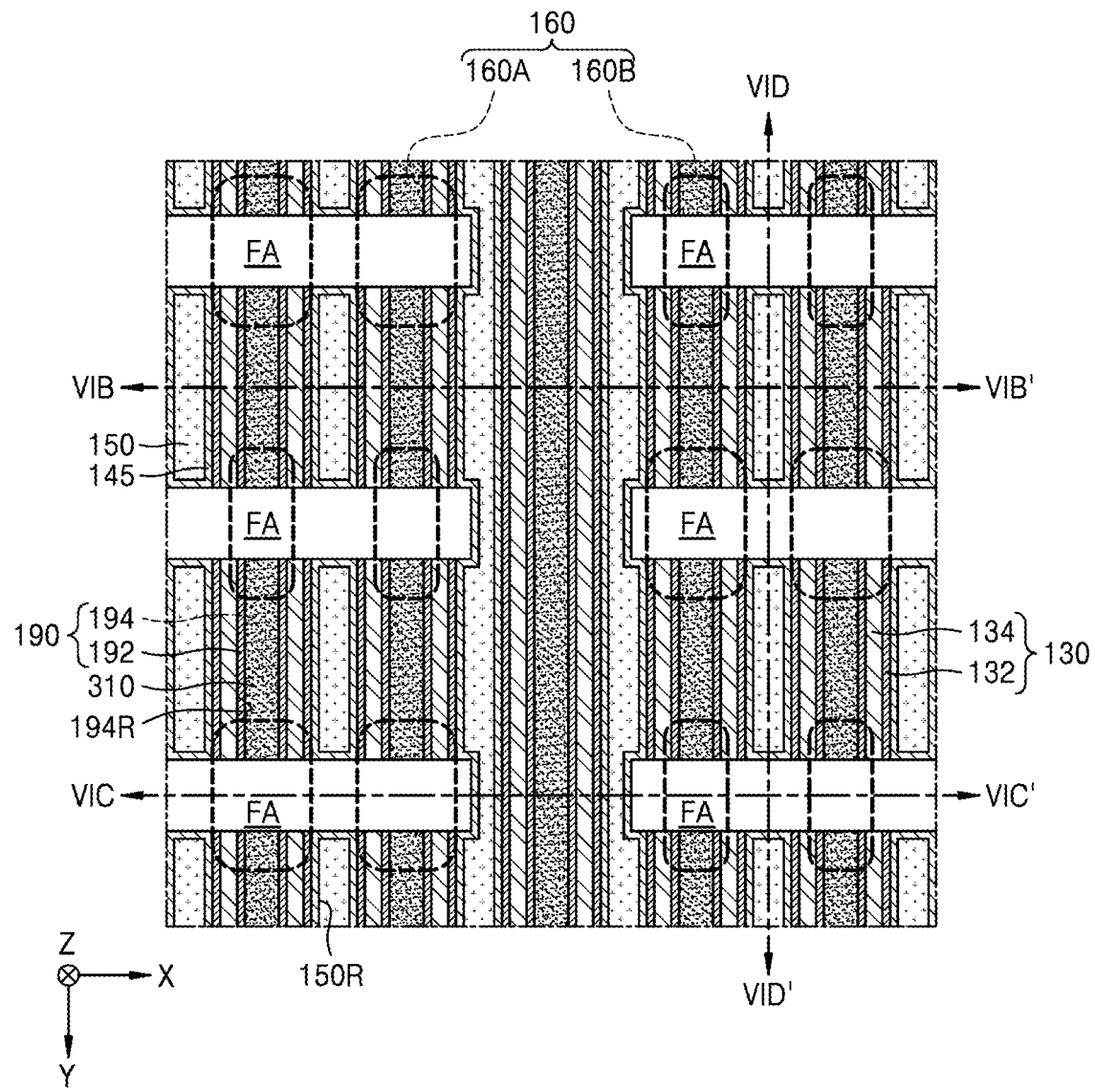
Figure 6B:
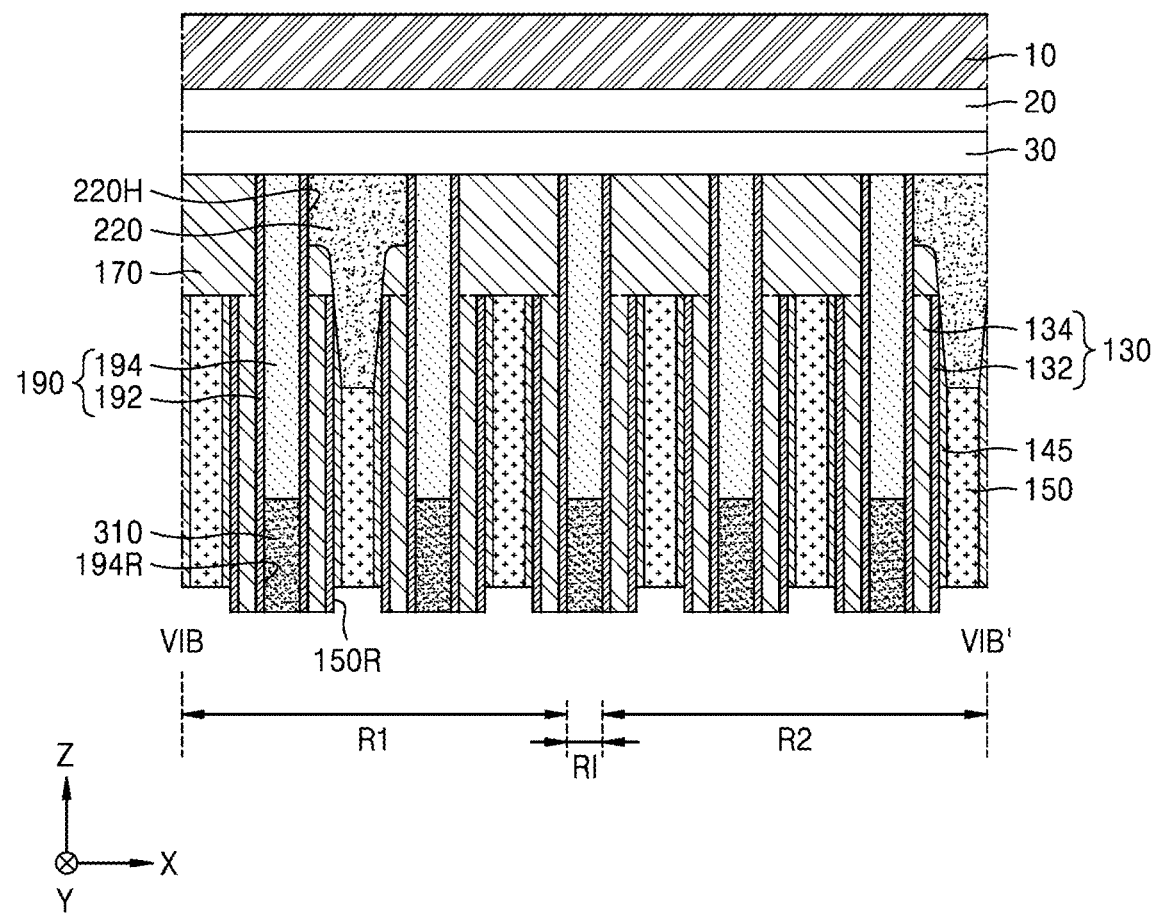
Figure 6C:
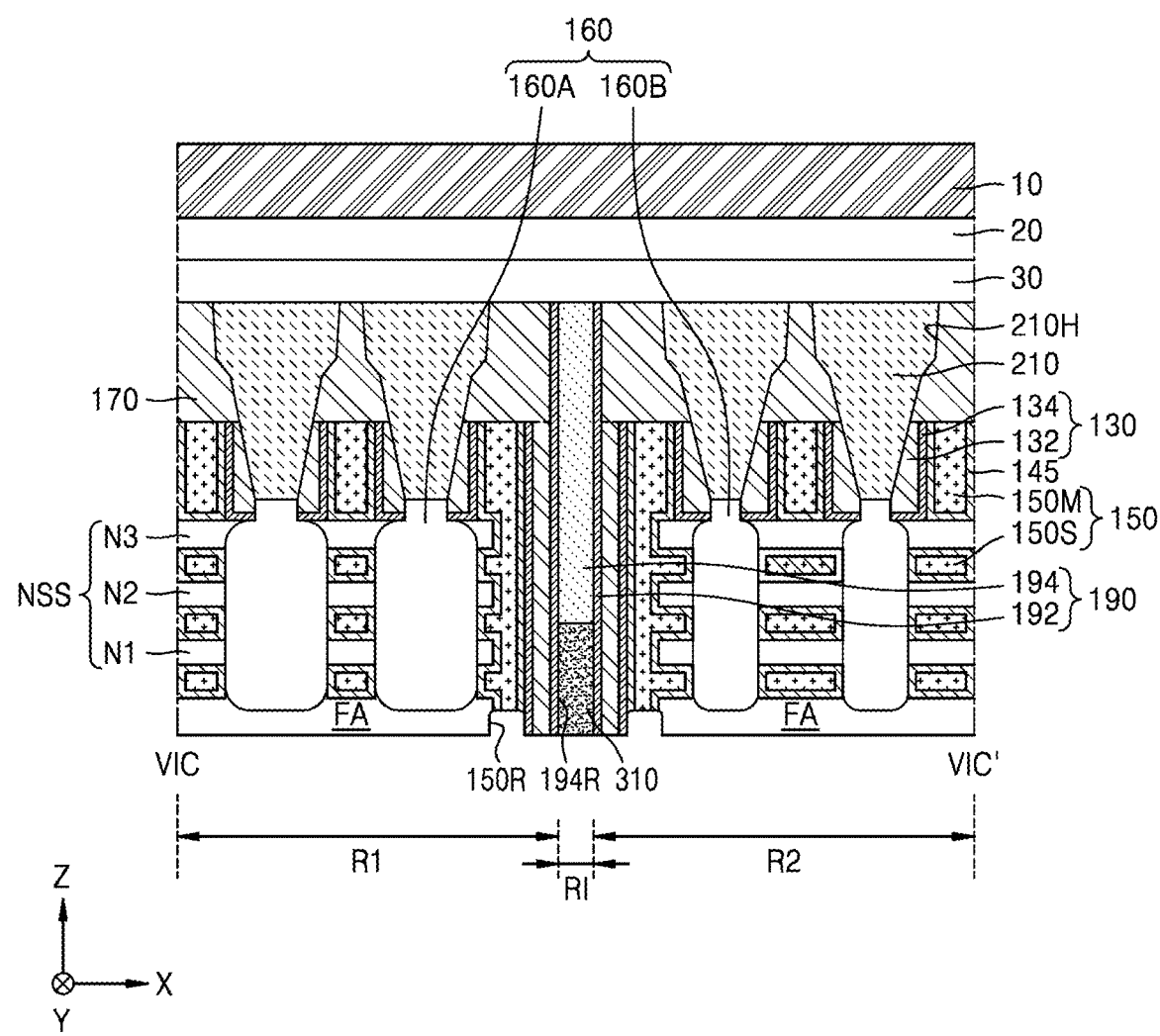
Figure 6D:
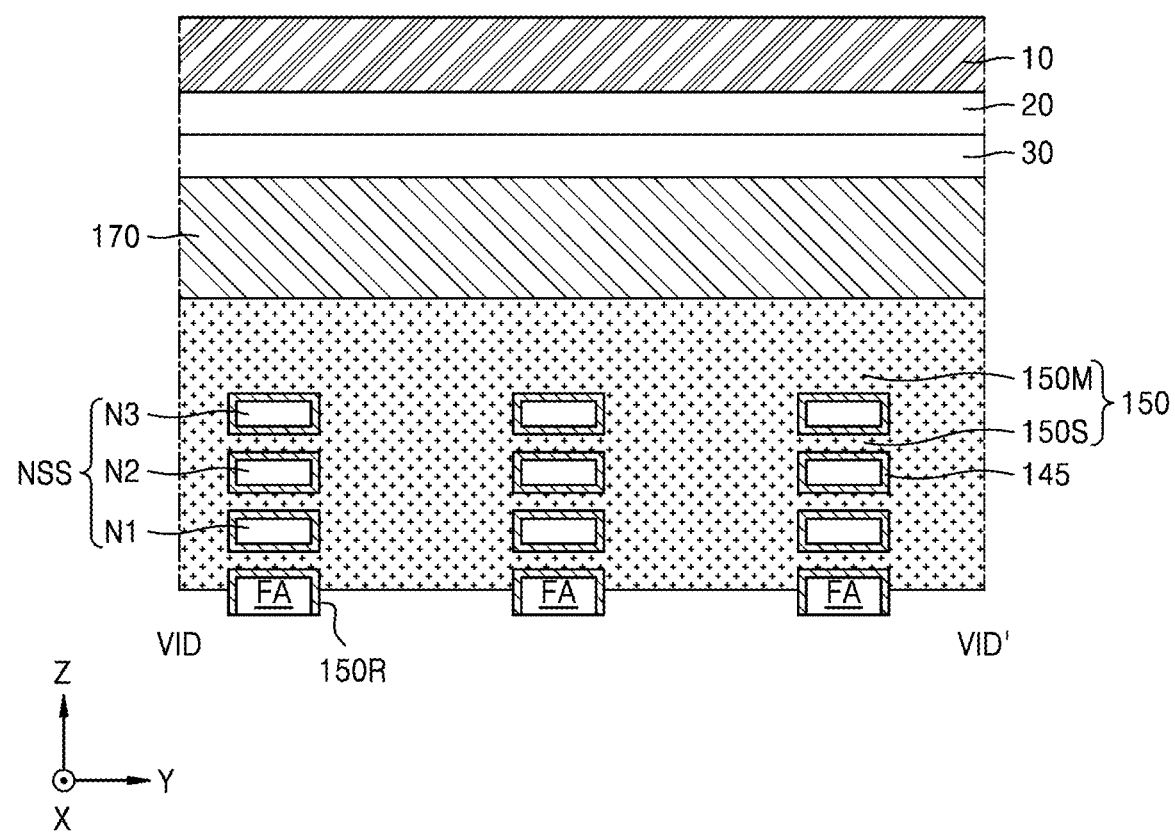
Figure 7A:
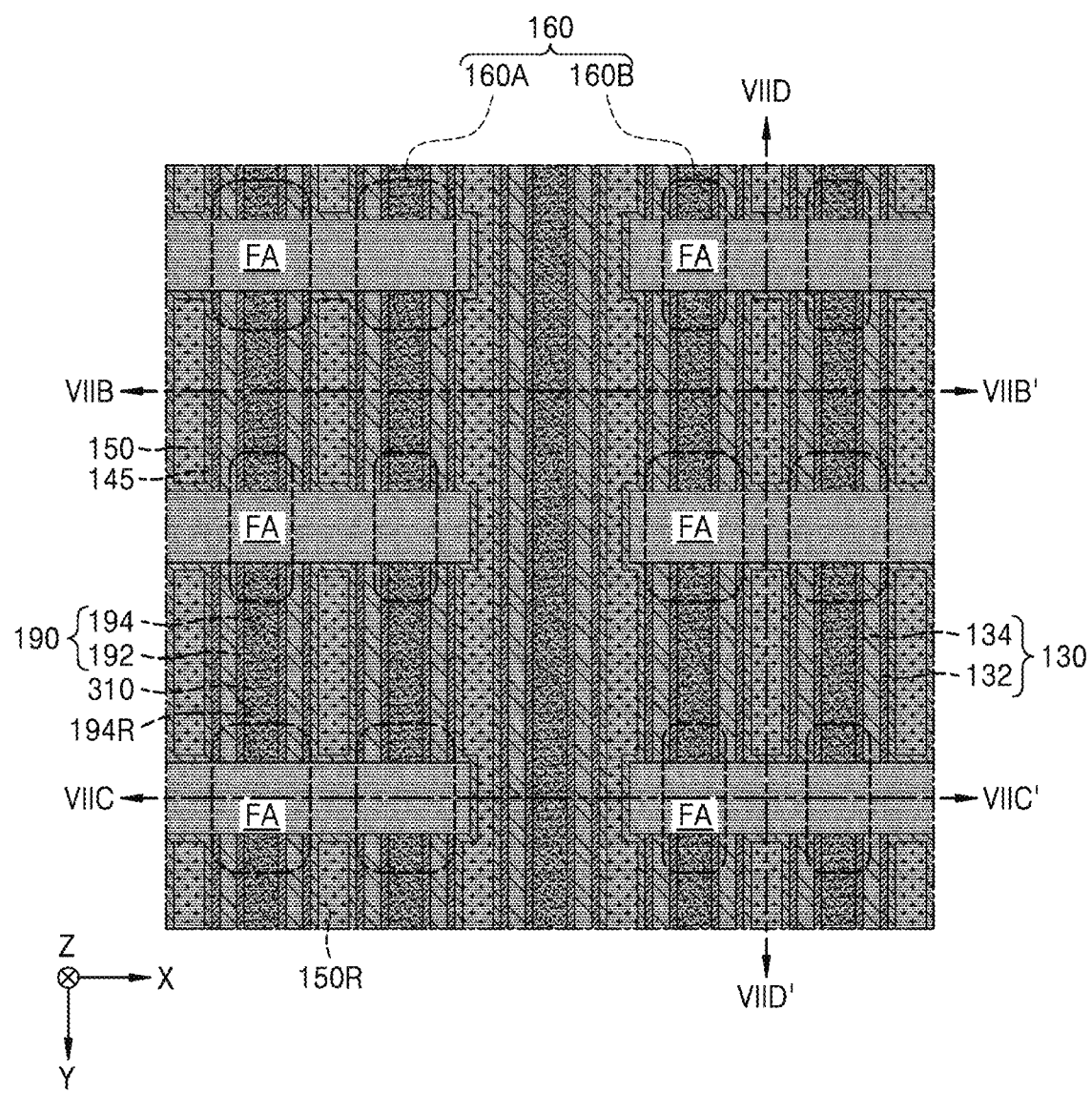
Figure 7B:
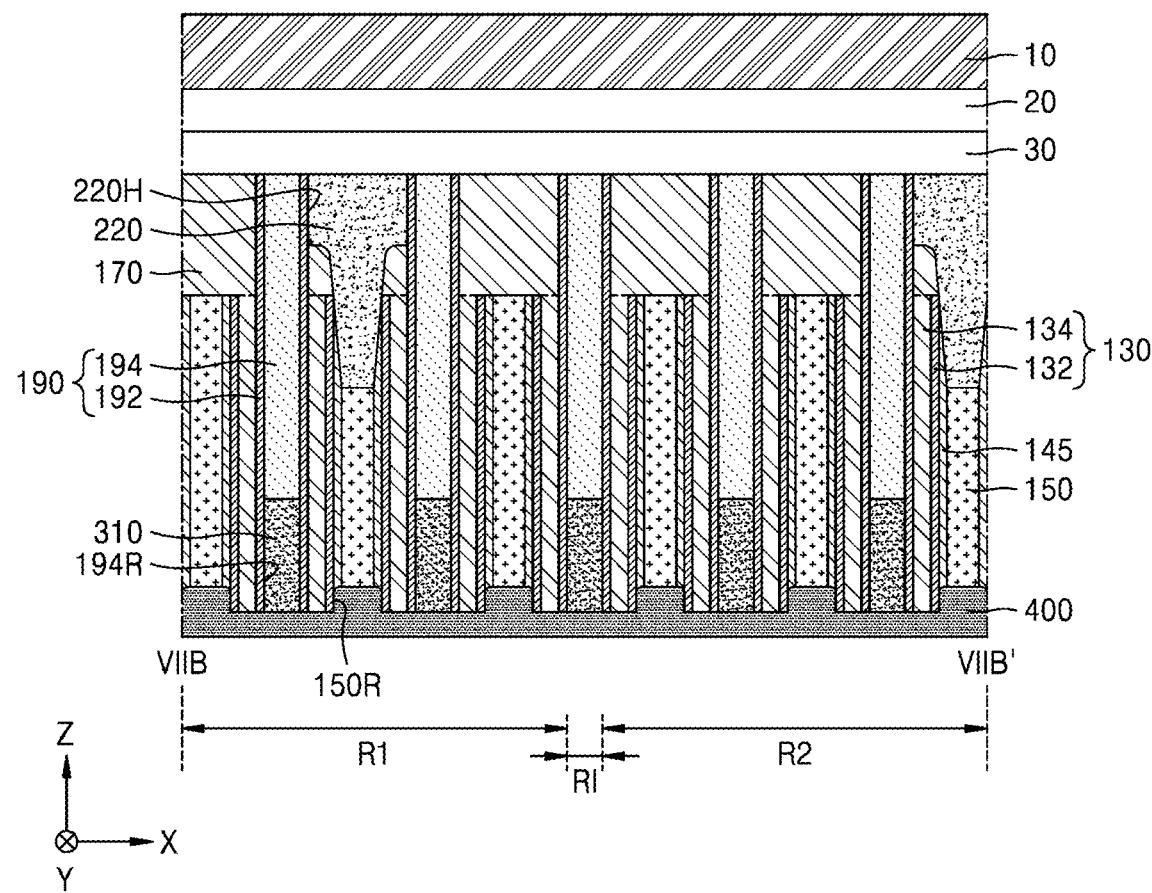
Figure 7C:
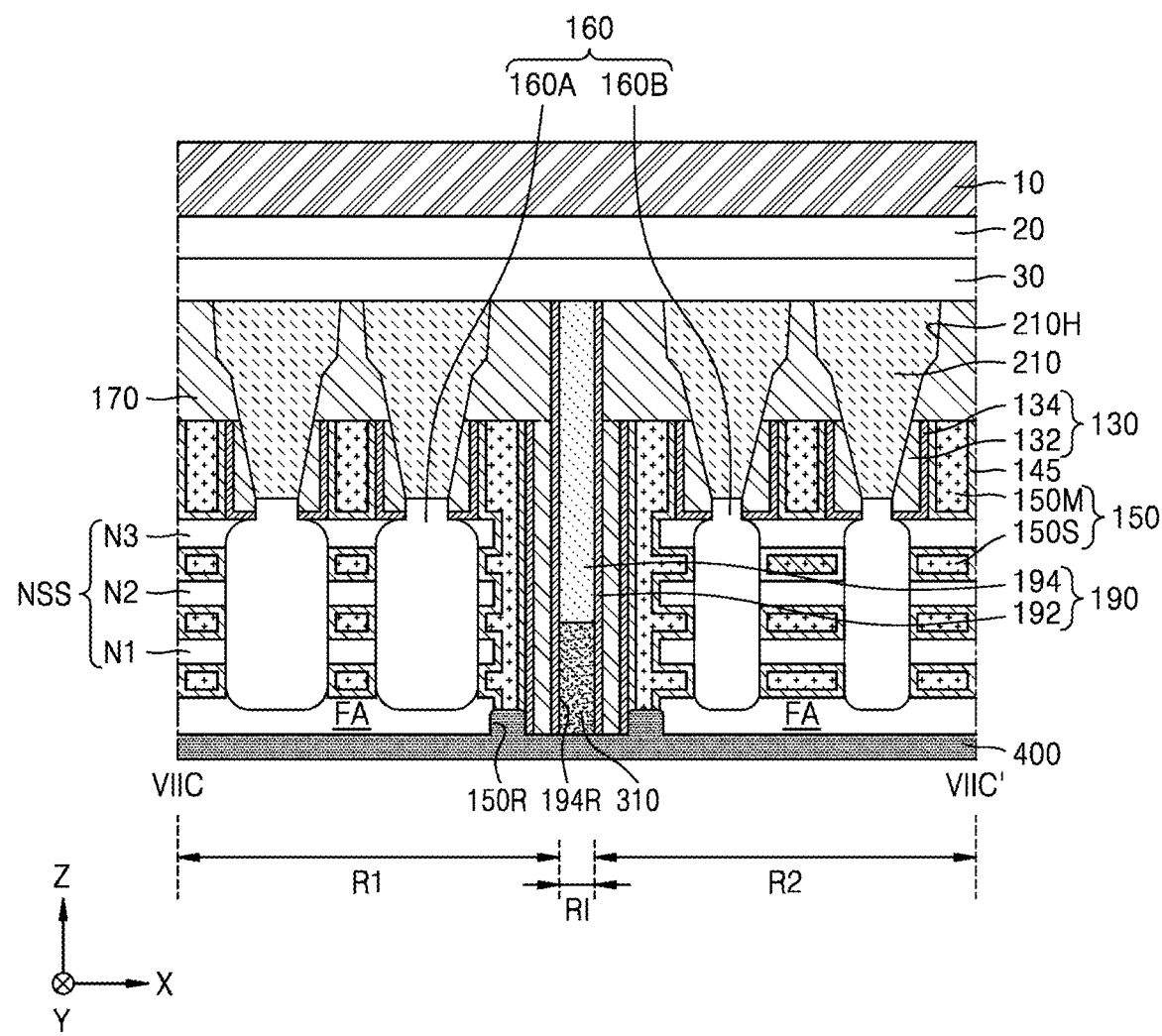
Figure 7D:
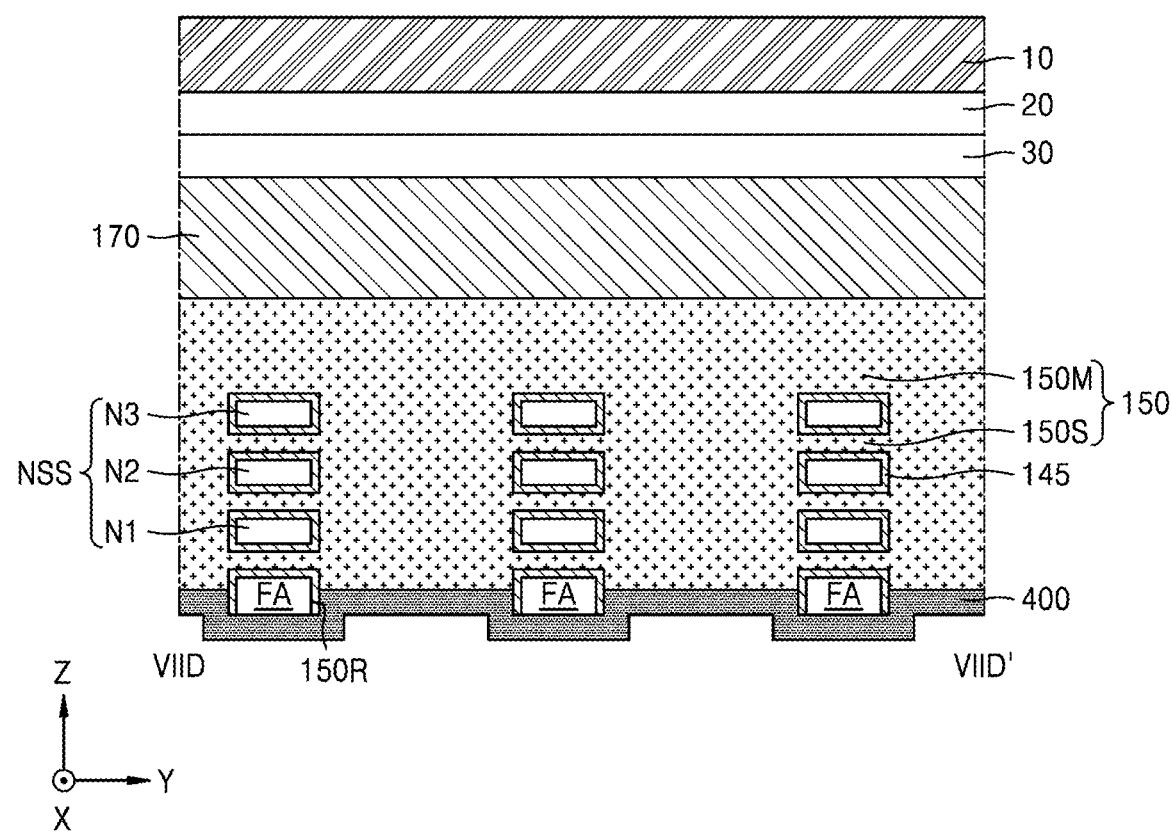
Figure 8A:
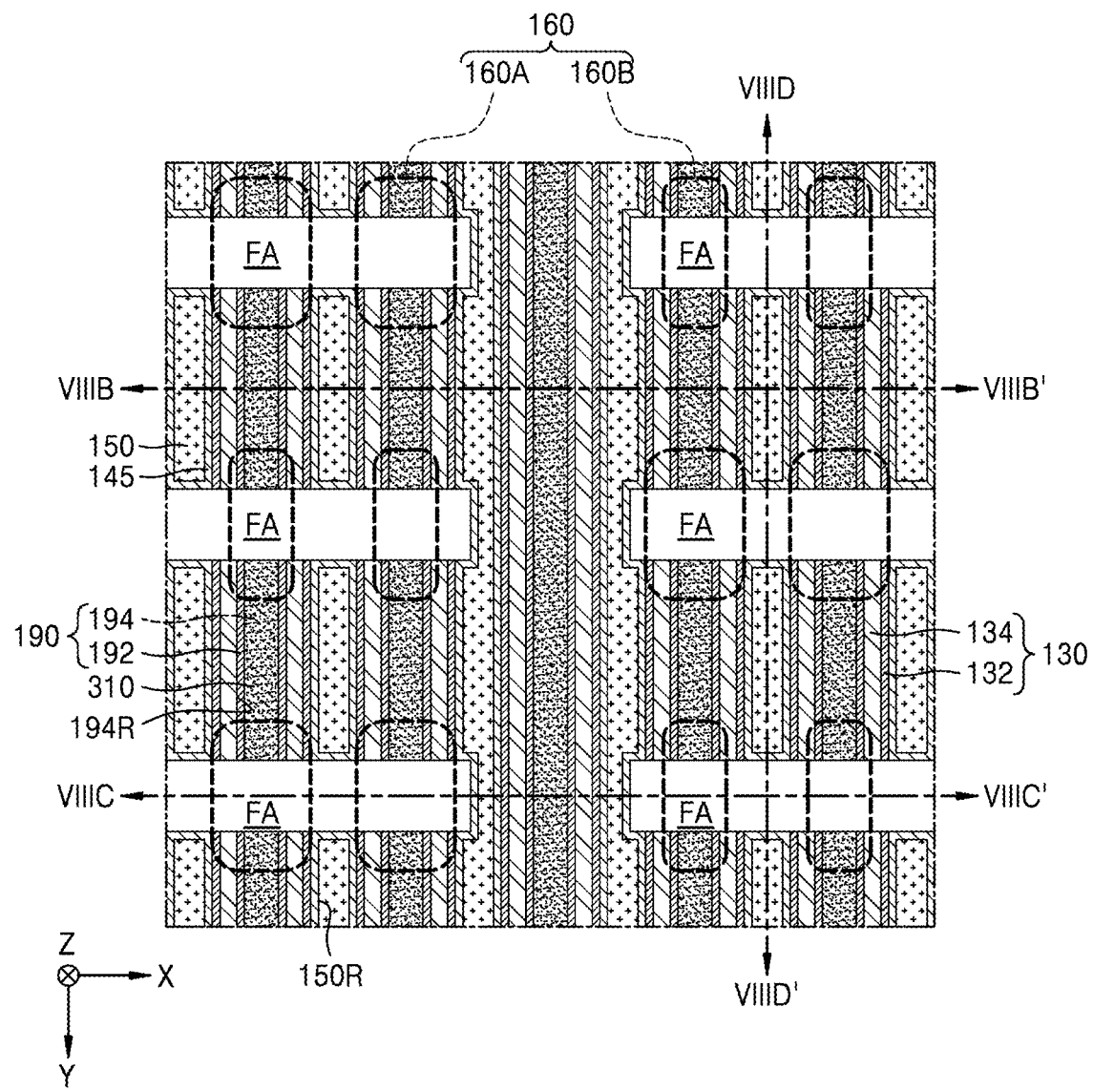
Figure 8B:
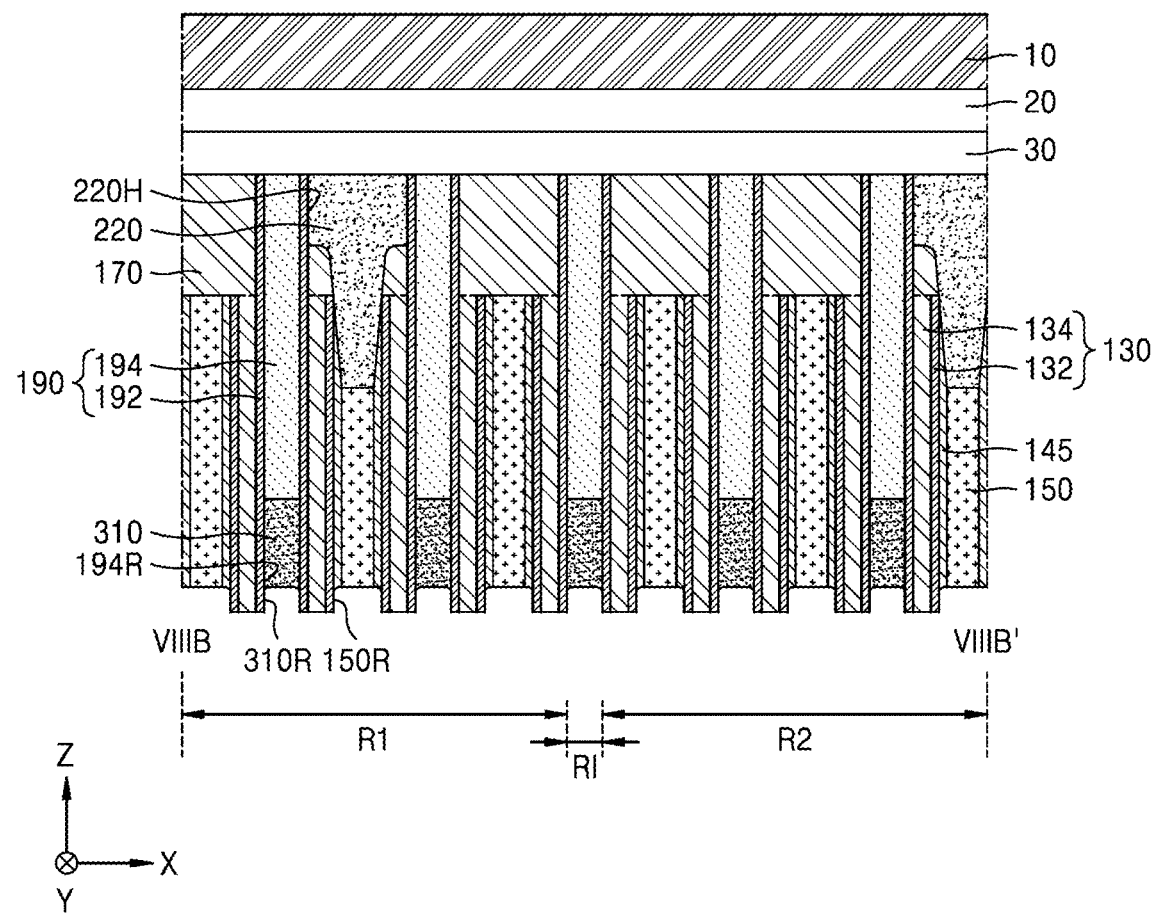
Figure 8C:
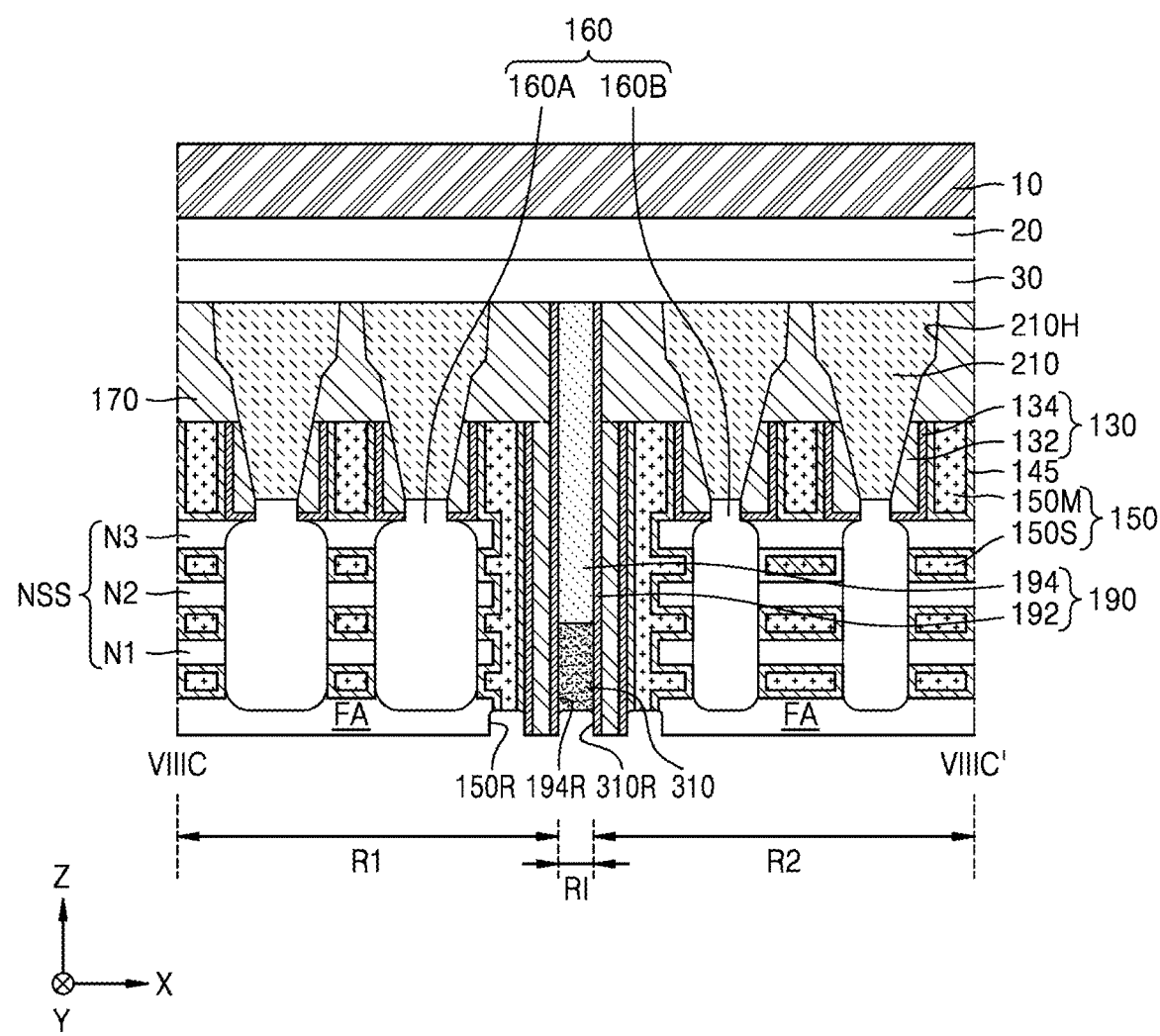
Figure 8D:
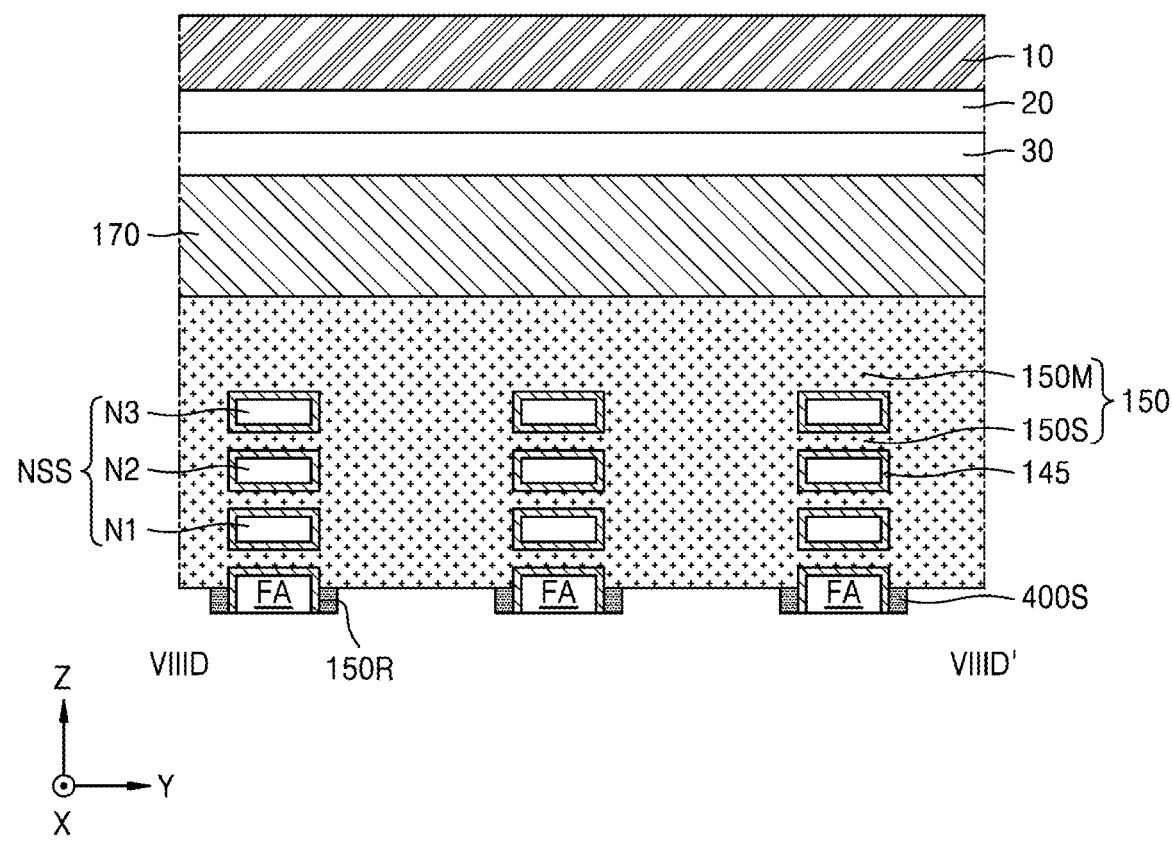
Figure 9A:
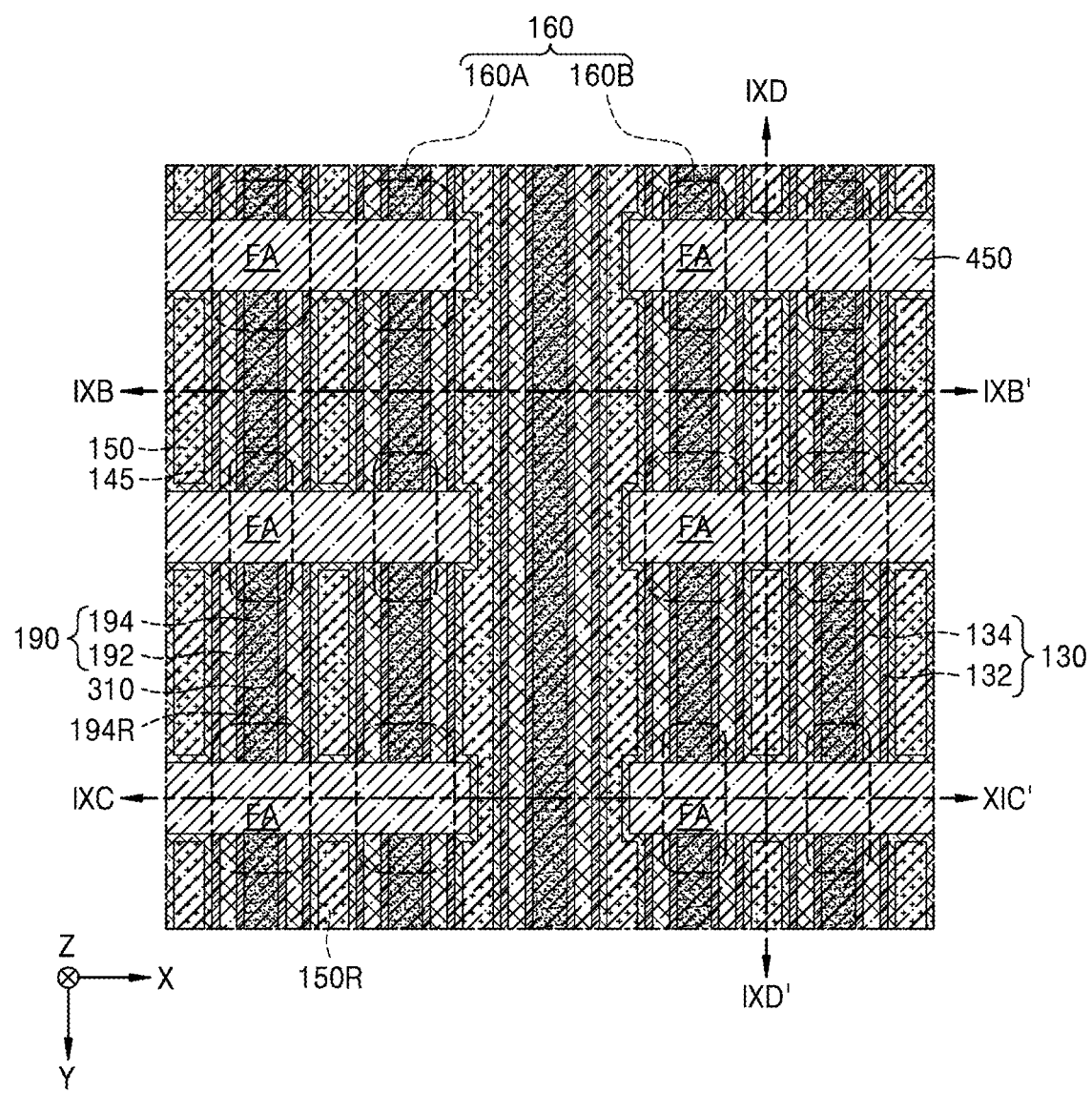
Figure 9B:
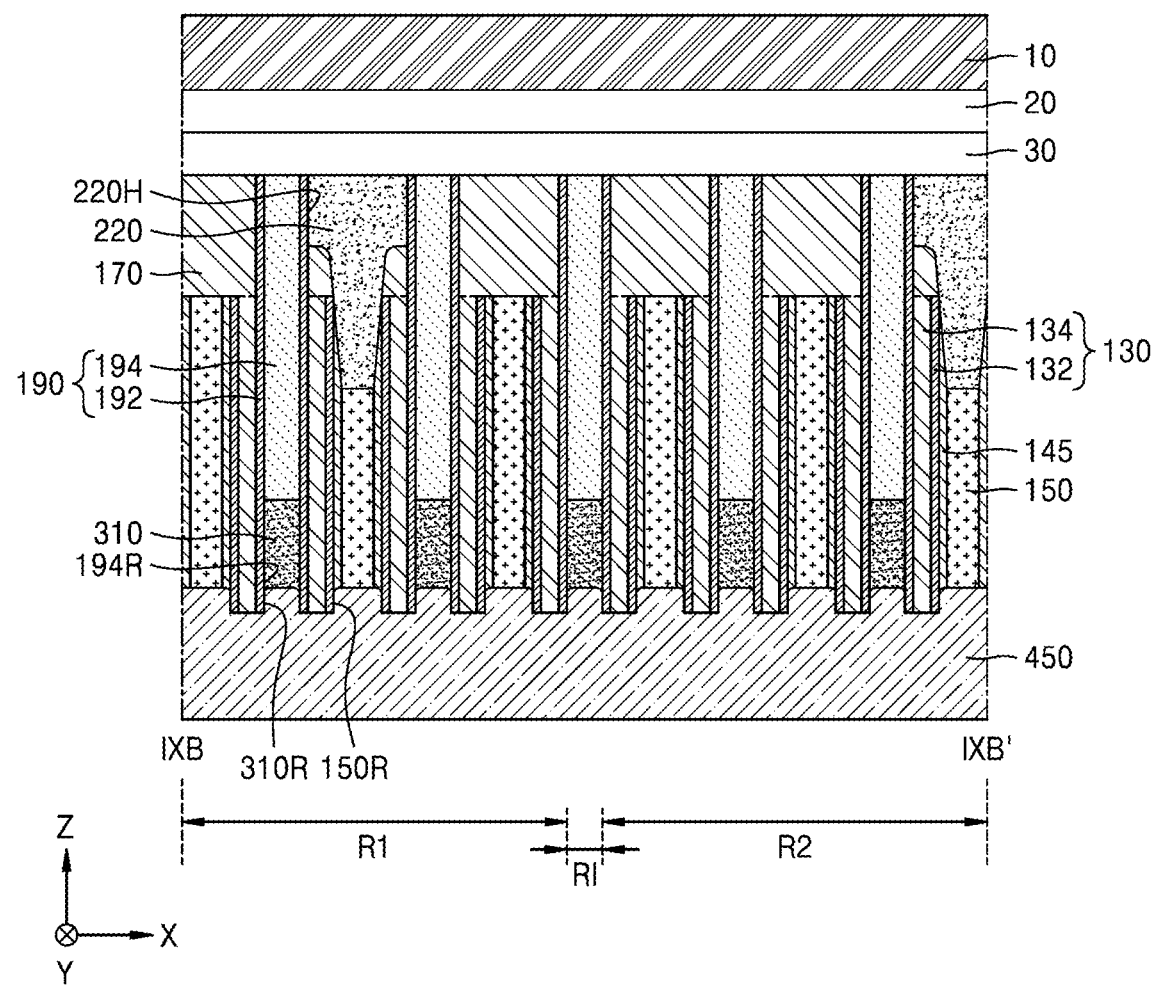
Figure 9C:
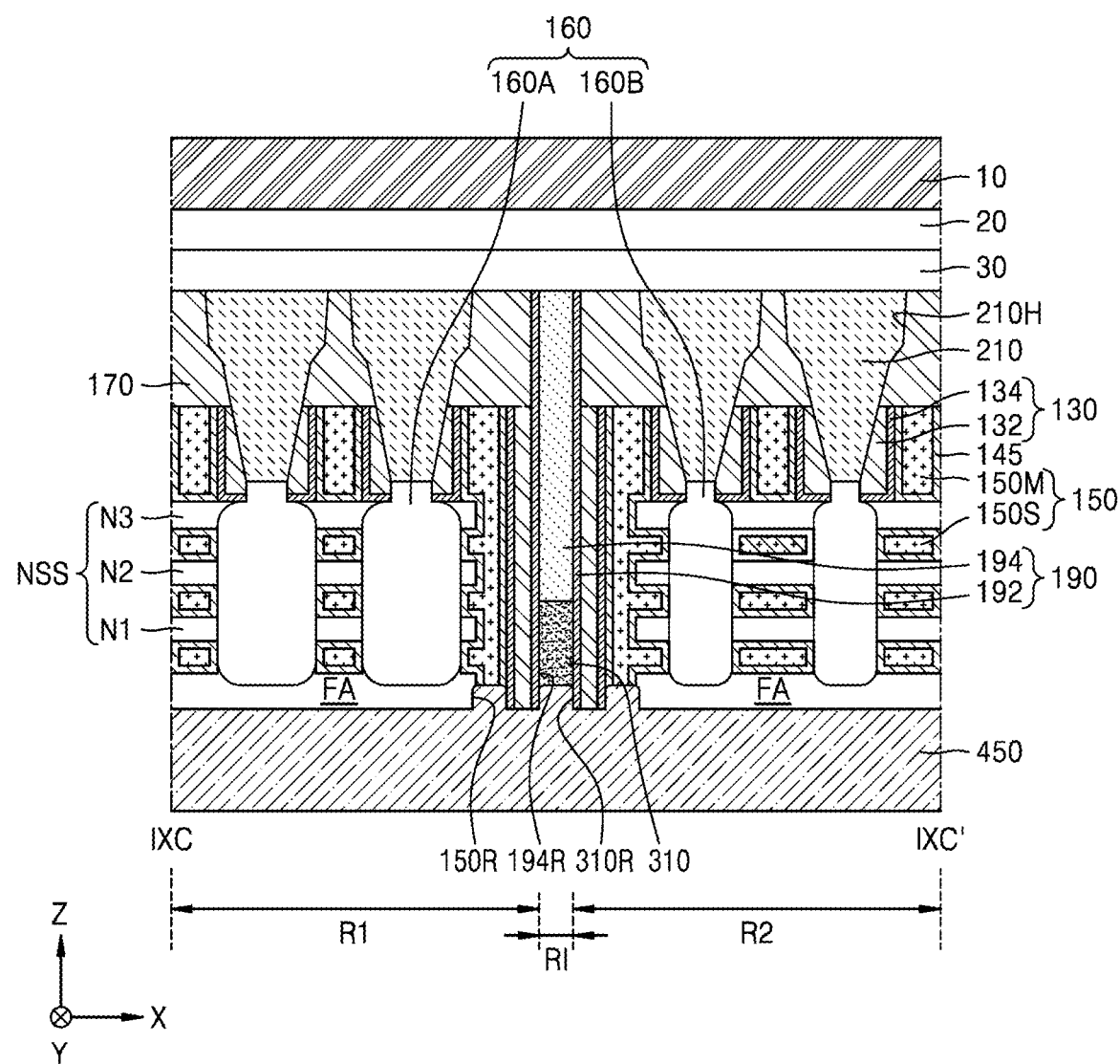
Figure 9D:
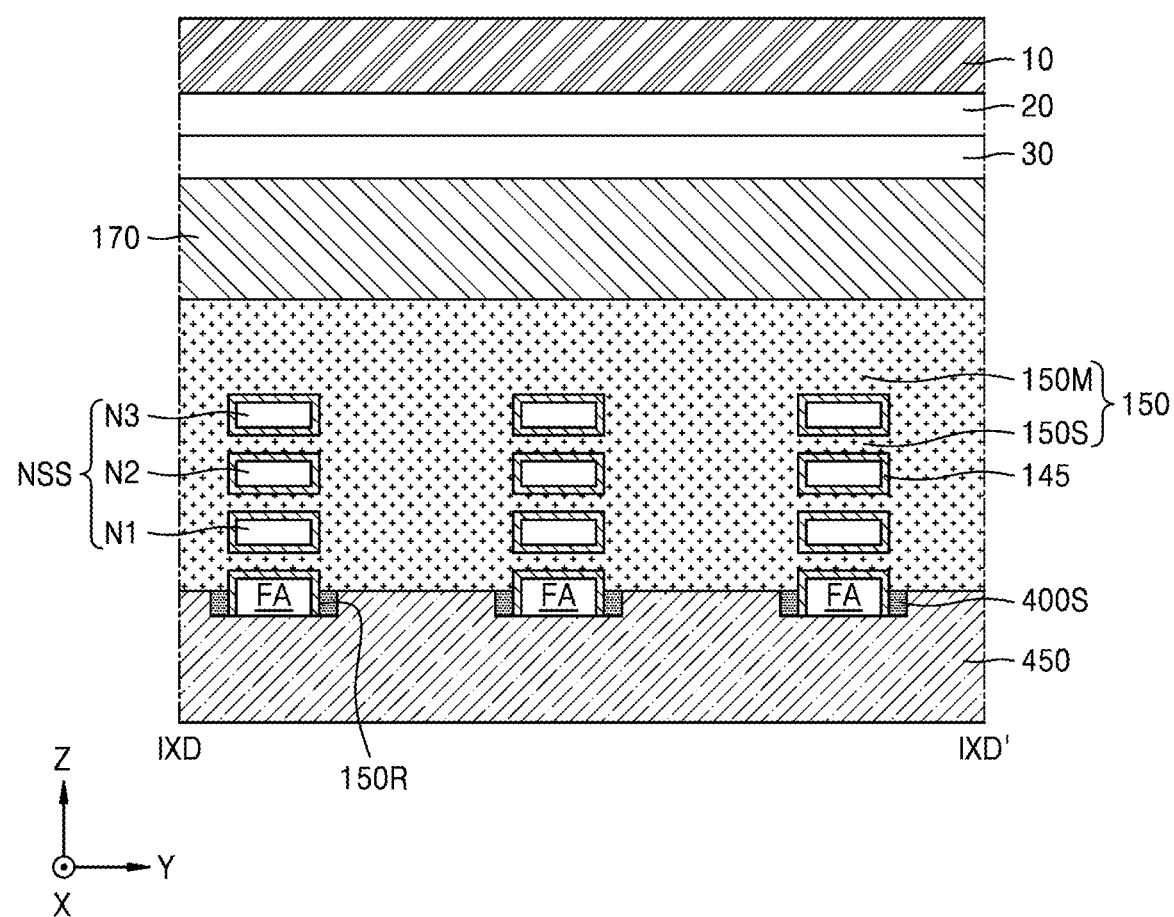
Figure 10A:
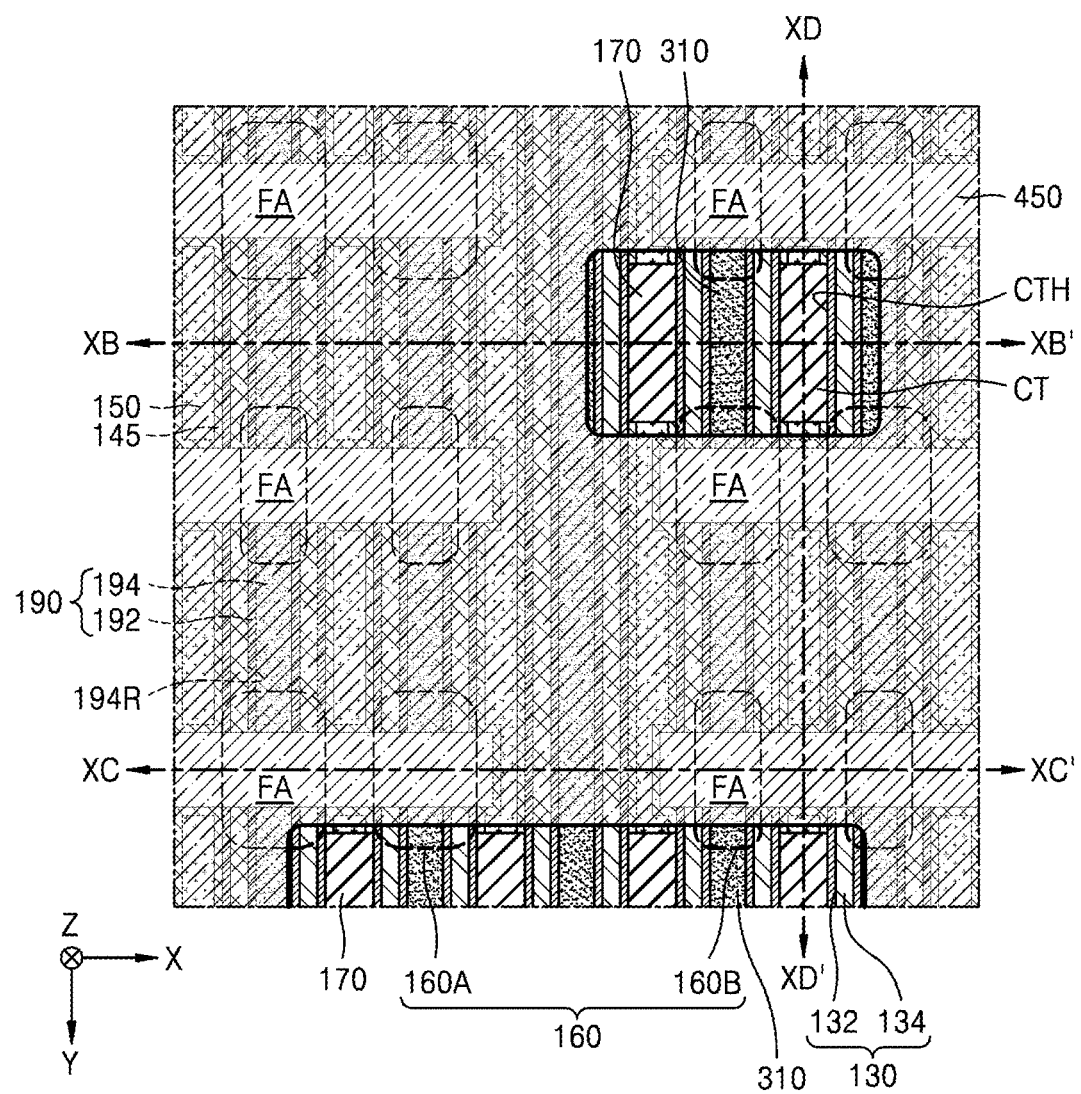
Figure 10B:
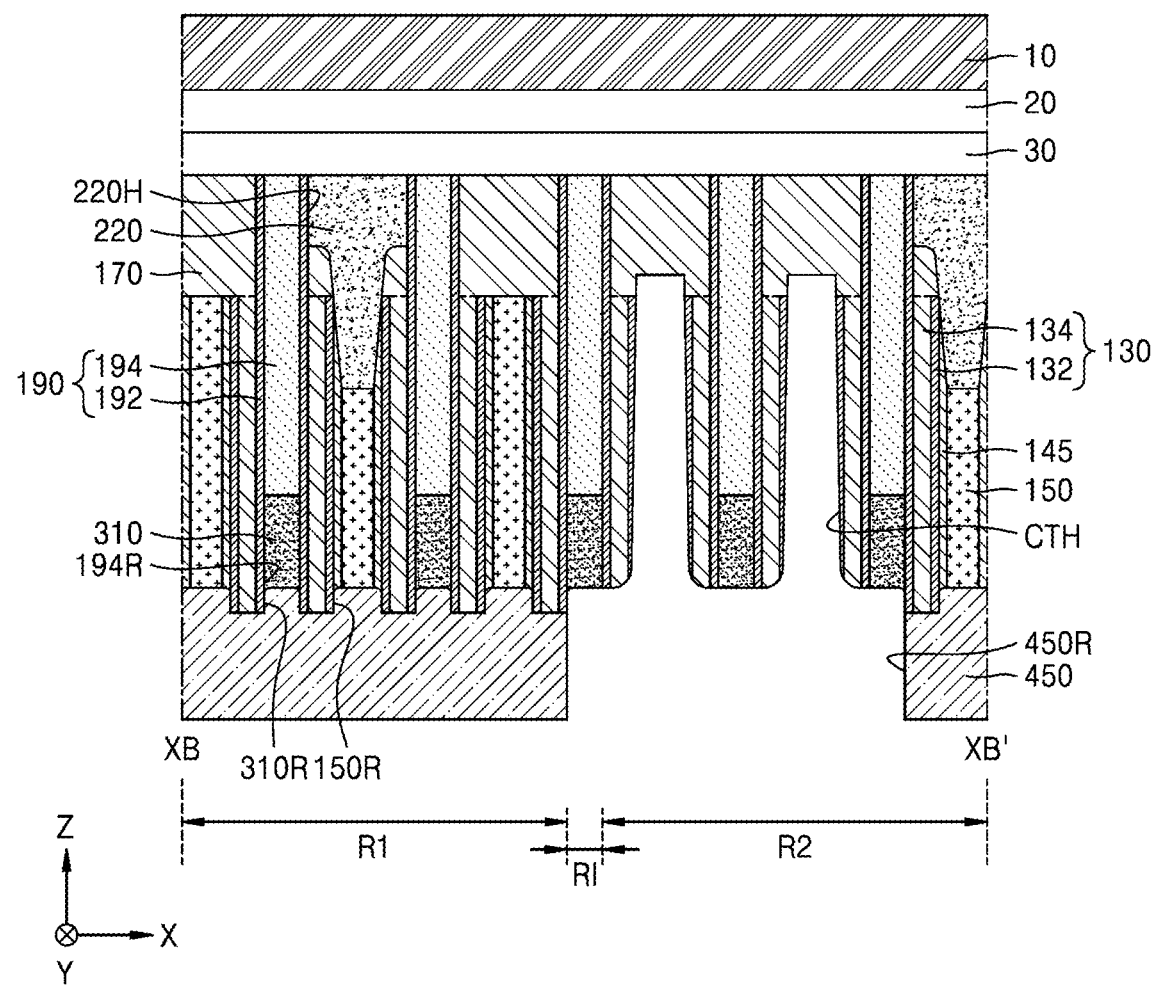
Figure 10C:
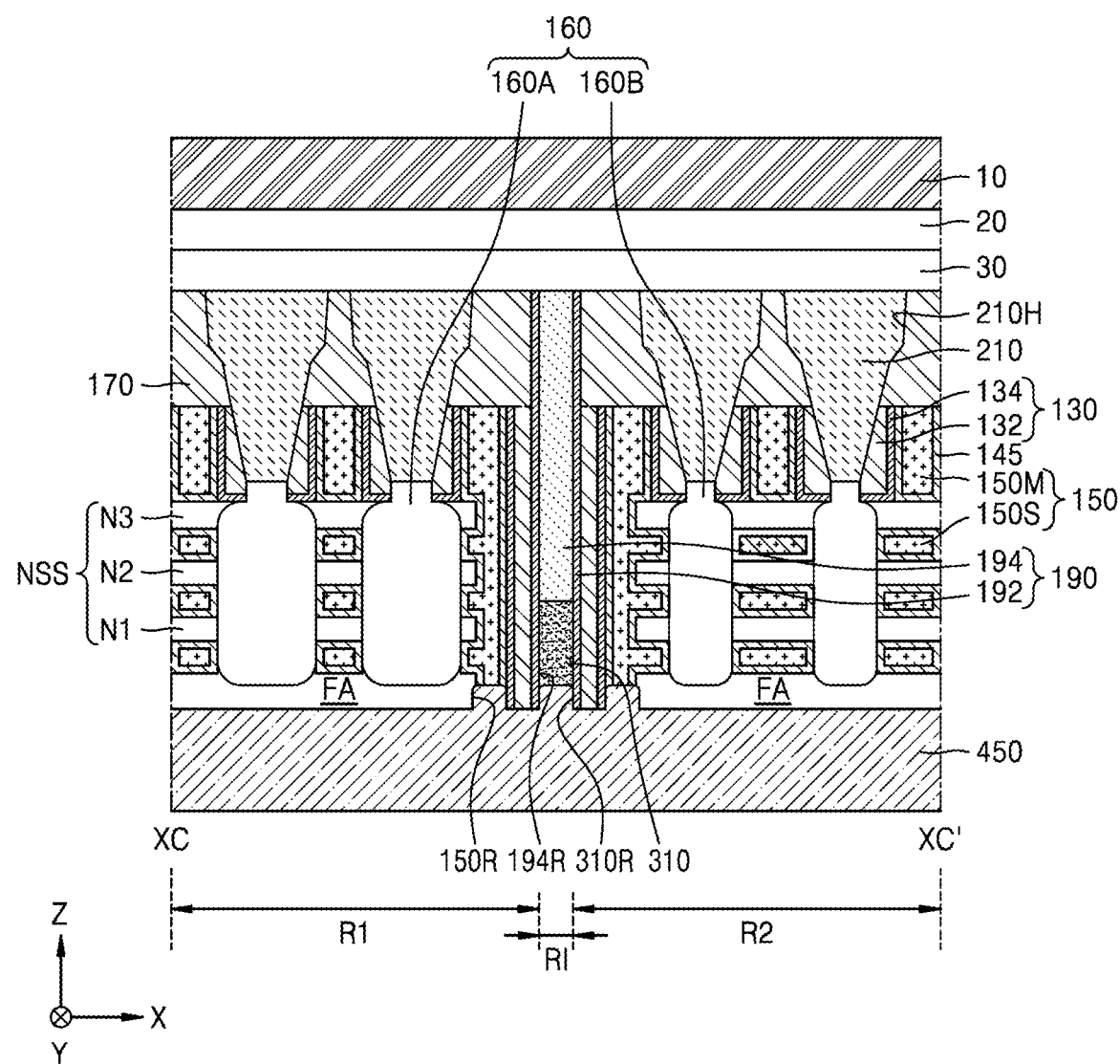
Figure 10D:
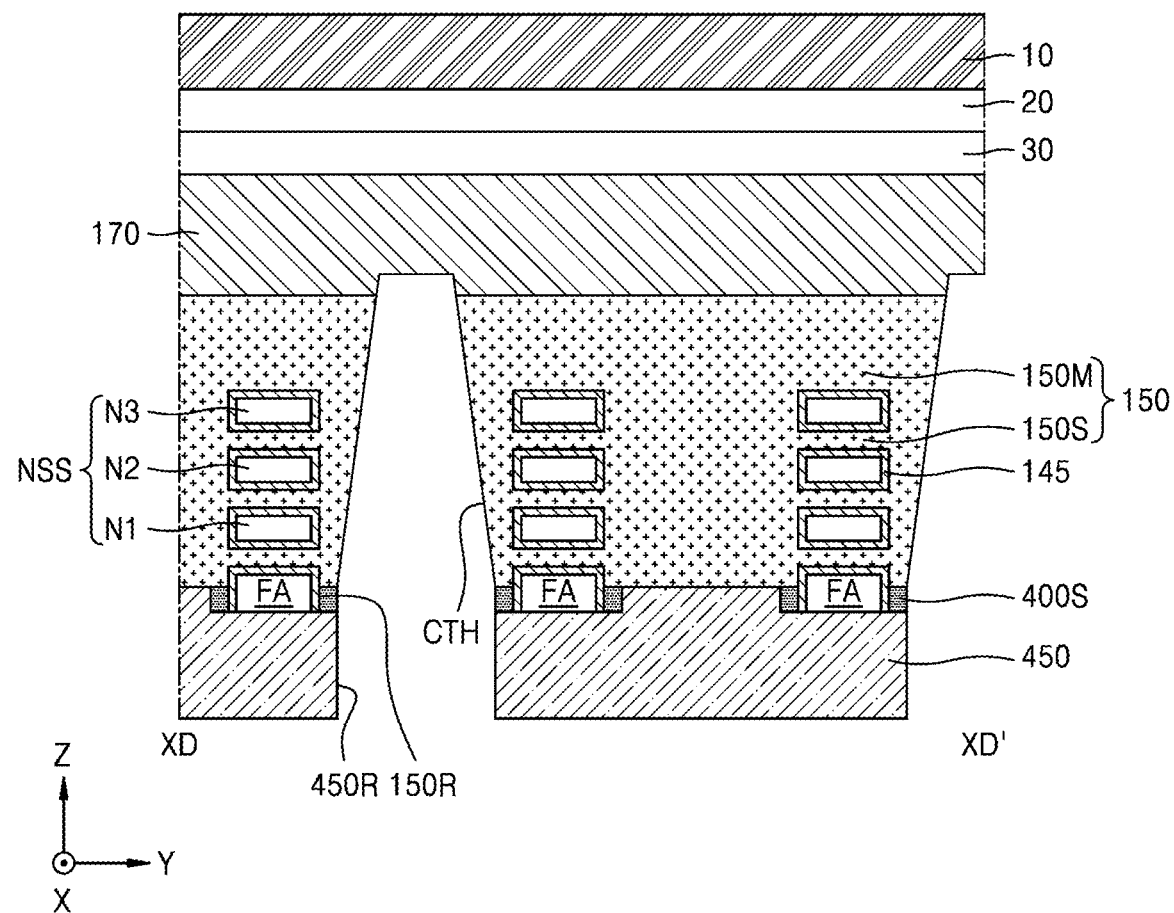

In FIGS. 2B to 2D, the support substrate 10 is shown on the upper side and the substrate 110 is shown on the lower side, but this is only for convenience of illustration and embodiments of inventive concepts are not limited thereto. For example, the substrate 110 may be attached to the support substrate 10 after being turned over, and a subsequent process may be performed when the support substrate 10 is at the lower side and the substrate 110 is at the upper side.

Referring to FIGS. 3A to 3D together, a portion of the substrate 110 and the device isolation layer 120 shown in FIGS. 2A to 2B are removed so that the plurality of gate electrodes 150 are exposed. A portion of the substrate 110 and the device isolation layer 120 may be removed to expose the fin-type active area FA, the gate spacer 130, and the inter-gate insulating layer 190 together with the plurality of gate electrodes 150. In some embodiments, a portion of the substrate 110 and the device isolation layer 120 may be removed by removing a portion of a lower surface of the substrate 110 to make the substrate 110 thin, and then performing an additional chemical mechanical polishing (CMP) process.

Referring to FIGS. 4A to 4D together, a lower portion of the second inter-gate insulating layer 194 is removed to form the protective recess 194R in a lower portion of a space between the pair of first inter-gate insulating layers 192 facing each other. As another embodiment, when the first inter-gate insulating layer 192 and the second inter-gate insulating layer 194 include the same or similar material, lower portions of the first inter-gate insulating layer 192 and the second inter-gate insulating layer 194 may be removed together to form the protective recess 194R in a lower portion of the space between the gate spacers 130. In some embodiments, when the inter-gate insulating layer 190 is formed as a single layer, a portion of a lower portion of the inter-gate insulating layer 190 may be removed to form the protective recess 194R below the space between the gate spacers 130.

Referring to FIGS. 5A to 5D together, the protective insulating layer 310 filling the protective recess 194R is formed. The protective insulating layer 310, after forming a preliminary protective insulating material layer filling the protective recess 194R and covering the lower surface of the gate electrode 150, may be formed by removing a portion of the preliminary protective insulating material layer so that the gate electrode 150 is exposed. For example, the protective insulating layer 310 may be a portion filling the protective recess 194R in the preliminary protective insulating material layer.

Referring to FIGS. 6A to 6D together, a lower portion of the gate electrode 150 is removed to form the first lower recess 150R. The first lower recess 150R may be a lower portion of the space between the pair of gate spacers 130 covering both sidewalls of the gate electrode 150 that is not filled by the gate electrode 150.

In some embodiments, the gate insulating layer 145 may be exposed on an inner wall of the first lower recess 150R. In some other embodiments, in the process of removing a lower portion of the gate electrode 150 to form the first lower recess 150R, a lower portion of the gate insulating layer 145 may be removed together, so that the fin-type active area FA may be exposed on at least a portion of the inner wall of the first lower recess 150R.

Referring to FIGS. 7A to 7D together, a lower cover insulating layer 400 filling the first lower recess 150R is formed. The lower cover insulating layer 400 may be formed to fill the first lower recess 150R and cover the fin-type active area FA, the gate spacer 130, and a lower surface of the protective insulating layer 310. The lower cover insulating layer 400 may include a material having an etch selectivity with respect to the gate electrode 150. For example, the lower cover insulating layer 400 may include silicon nitride.

Referring to FIGS. 7A to 8D together, a portion of the lower cover insulating layer 400 is removed to form the plurality of gap insulating layers 400S arranged adjacent to the plurality of fin-type active areas FA. A pair of gap insulating layers 400S may be adjacently on both sidewalls of one fin-type active area FA in an extension direction of the gate electrode 150, that is, the second horizontal direction (Y direction). In some embodiments, the gap insulating layers 400S have the gate insulating layer 145 therebetween, and may be formed to cover at least a portion of a sidewall of the fin-type active area FA.

In some other embodiments, the gate insulating layer 145 may not be between a gap insulating layer 400S and the sidewall of the fin-type active area FA, and the gap insulating layer 400S may be formed to directly contact the fin-type active area FA. In some embodiments, the gap insulating layer 400S may be formed to cover a lower portion of the sidewall of the fin-type active area FA.

In the process of removing a portion of the lower cover insulating layer 400 to form the plurality of gap insulating layers 400S, a portion of the lower cover insulating layer 400 filling the first lower recess 150R may also be removed, and a lower portion of the protective insulating layer 310 may also be removed. A portion from which the lower portion of the protective insulating layer 310 is removed may be defined as the second lower recess 310R.

In some embodiments, the first lower recess 150R and the second lower recess 310R may have substantially the same depth with respect to the lower surface of the fin-type active area FA or the lower surface of the gate spacer 130.

Referring to FIGS. 9A to 9D together, a mask layer 450 is formed to fill the first lower recess 150R and the second lower recess 310R and to cover the gap insulating layer 400S. The mask layer 450 may be formed to fill the first lower recess 150R and the second lower recess 310R and to cover the gate electrode 150, the gap insulating layer 400S, the fin-type active area FA, the gate spacer 130, and a lower surface of the protective insulating layer 310. For example, the mask layer 450 may include a material having an etch selectivity with respect to the gate electrode 150, the gap insulating layer 400S, the fin-type active area FA, the gate spacer 130, and the protective insulating layer 310. In some embodiments, the mask layer 450 may include photoresist, but embodiments of inventive concepts are not limited thereto.

Referring to FIGS. 10A to 10D together, a portion of the mask layer 450 is removed to form a mask opening 450R exposing a portion of the gate electrode 150. In some embodiments, the mask opening 450R may be formed through a photolithography process.

Thereafter, a portion of the gate electrode 150 exposed through the mask opening 450R is removed to form the gate cut hole CTH passing through the gate electrode 150 in the vertical direction (Z direction). In the process of forming the gate cut hole CTH, a portion of the gate insulating layer 145 in contact with the removed portion of the gate electrode 150 may also be removed.

The gate cut hole CTH may be formed to separate the gate electrode 150 extending in the second horizontal direction (Y direction) by cutting the gate electrode 150 to be apart from each other based on the gate cut hole CTH. The pair of gate electrodes 150 having the gate cut hole CTH therebetween and respectively having ends facing each other may extend along a straight line extending in the second horizontal direction (Y direction).

The gate cut hole CTH may be formed to have a tapered shape in which the horizontal width thereof decreases while extending upward in the vertical direction (Z direction). The gate cut hole CTH may be formed to increase in horizontal width away from the interlayer insulating layer 170.

For example, the gate cut hole CTH may be formed to have a tapered shape in which the horizontal width thereof decreases in the second horizontal direction (Y direction) while extending upward in the vertical direction (Z direction). In some embodiments, the gate cut hole CTH may be formed to have a tapered shape in which the horizontal width in the first horizontal direction (X direction) and the horizontal width in the second horizontal direction (Y direction) decrease, respectively, while extending upward in the vertical direction (Z direction). In the gate cut hole CTH, a rate at which the horizontal width decreases in the first horizontal direction (X direction) while extending upward in the vertical direction (Z direction) may be less than a rate at which the horizontal width decreases in the second horizontal direction (Y direction). In some embodiments, the gate cut hole CTH may be formed to pass through a lower surface of the interlayer insulating layer 170 and extend into the interlayer insulating layer 170.

In some embodiments, in the process of forming the gate cut hole CTH, the gate spacer 130 exposed through the mask opening 450R and a lower portion of the protective insulating layer 310 may also be removed.

After the gate cut hole CTH is formed, the mask layer 450 may be removed.

Referring to FIGS. 11A to 11D together, the gate cut structure CT is formed to fill the gate cut hole CTH. The gate cut structure CT may fill the gate cut hole CTH extending between the pair of gate spacers 130.

Because the gate cut structure CT is formed by filling the gate cut hole CTH, the gate cut structure CT may have a tapered shape in which the horizontal width thereof decreases while extending upward in the vertical direction (Z direction). In some embodiments, the gate cut structure CT between the pair of gate spacers 130 may extend into the interlayer insulating layer 170. A portion of the gate cut structure CT may protrude from a lower surface of the interlayer insulating layer 170 into the interlayer insulating layer 170.

In some embodiments, at least two gate cut structures CT adjacent in the first horizontal direction (X direction) may be connected to each other at a lower portion to form an integral body. The at least two gate cut structures CT adjacent to each other in the first horizontal direction (X direction) may be connected to each other while extending under the protective insulating layer 310 therebetween.

After filling the gate cut hole CTH and forming an insulating material covering the fin-type active area FA, the gate spacer 130, and a lower surface of the protective insulating layer 310, a portion of the insulating material is removed to expose the fin-type active area FA and the gate spacer 130 to form the gate cut structure CT.

In some embodiments, in the process of forming the gate cut structure CT, the residual insulating layer CTF may be formed to fill the first lower recess 150R and the second lower recess 310R, respectively. The residual insulating layer CTF may be below the gate electrode 150 and below the protective insulating layer 310.

A portion filling the first lower recess 150R and the second lower recess 310R of the insulating material for forming the gate cut structure CT is not removed in the process of removing a portion of the insulating material to form the gate cut structure CT, but remains, thereby forming the residual insulating layer CTF. The gate cut structure CT and the residual insulating layer CTF may include the same material. The gate cut structure CT and the residual insulating layer CTF may be formed such that lower surfaces thereof are located at the same vertical level. In some embodiments, the gate cut structure CT, the residual insulating layer CTF, the gate spacer 130, and the fin-type active area FA may be formed so that lower surfaces thereof are located at the same vertical level to form a coplanar surface.

Thereafter, as shown in FIGS. 1A to 1D, the substrate insulating layer 660 and the lower wiring structure BS-PDN may be sequentially formed on the gate cut structure CT, the residual insulating layer CTF, the gate spacer 130, and the lower surface of the fin-type active area FA, the support substrate 10, the first bonding layer 20, and the second bonding layer 30 may be removed, and then the upper wiring structure FS-PDN and the passivation layer 560 may be formed on the interlayer insulating layer 170 to form the integrated circuit device 1.

In the method of manufacturing the integrated circuit device 1 according to an embodiment of inventive concepts, before forming the lower wiring structure BS-PDN, the gate cut hole CTH and the gate cut structure CT are formed from a lower side of the gate electrode 150, so that damage to components arranged around and above the gate electrode 150 in the process of forming the gate cut structure CT may be limited and/or prevented. In addition, by the plurality of fin-type active areas FA and the gap insulating layer 400S, the gate cut hole CTH and the gate cut structure CT filling the same may be formed in self-alignment, so that the gate electrode 150 may be accurately cut.

Figure 12A:
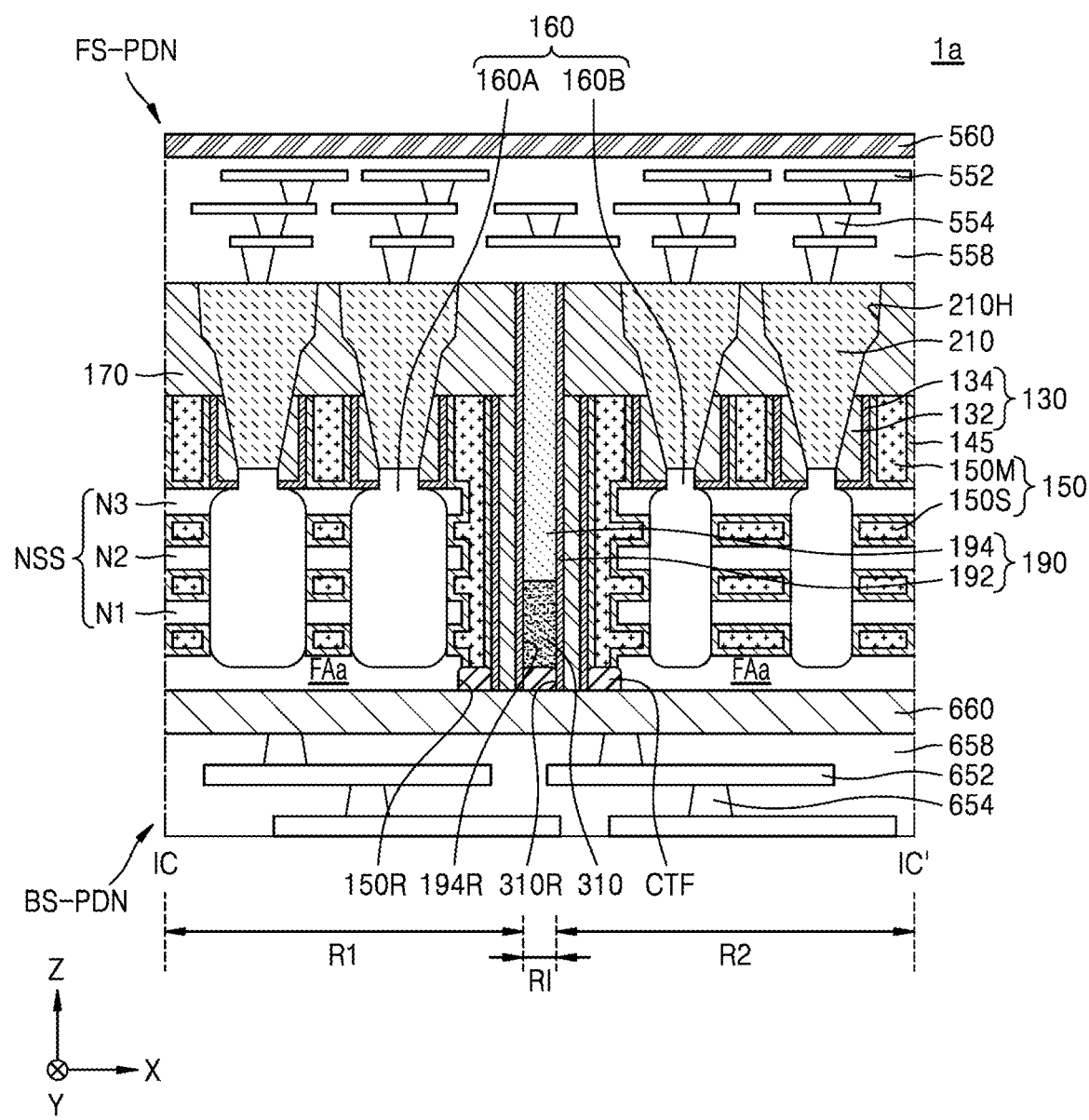
FIGS. 12A and 12B are cross-sectional views of an integrated circuit device according to embodiments.
Figure 12B:
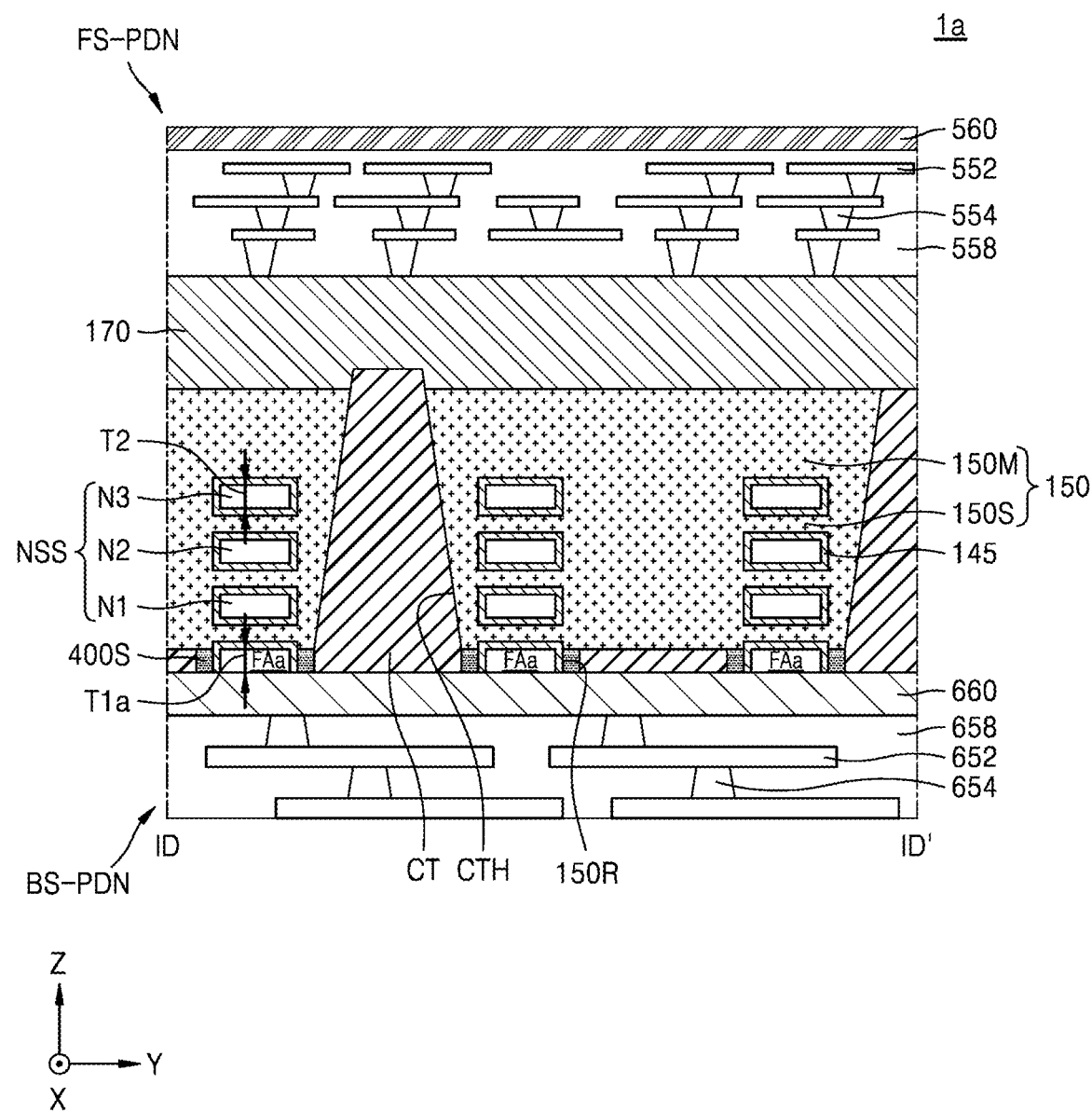

FIGS. 12A and 12B are cross-sectional views of an integrated circuit device according to embodiments. In more detail, FIGS. 12A and 12B are cross-sectional views of the integrated circuit device, taken along positions corresponding to lines IC-IC' and ID-ID' of FIG. 1A. In FIGS. 12A and 12B, the same reference numerals as in FIGS. 1A to 1D denote the same elements, and therefore, detailed descriptions thereof will not be given herein.

Referring to FIGS. 12A to 12D together, the integrated circuit device 1a may include the lower wiring structure BS-PDN, the substrate insulating layer 660 covering the lower wiring structure BS-PDN, and a plurality of fin-type active areas Faa protruding from the upper surface of the substrate insulating layer 660 in the vertical direction (Z direction) and extending in the first horizontal direction (X direction). In some embodiments, the integrated circuit device 1a may include a plurality of nanosheet stacked structures NSS facing upper surfaces of the plurality of fin-type active areas Faa at positions apart from the upper surfaces of the plurality of fin-type active areas Faa.

In some embodiments, a first thickness T1a, which is the thickness of the fin-type active area Faa in the vertical direction (Z direction), may be different (e.g., less than or greater than) than a second thickness T2, which is the thickness of each of the plurality of nanosheets N1, N2, and N3. For example, in the process of exposing the plurality of gate electrodes 150 by removing a portion of the substrate 110 and the device isolation layer 120 as described with reference to FIGS. 3A to 3D, by removing the substrate 110 relatively more (or relatively less), the fin-type active area Faa of the integrated circuit device 1a may be formed to be thinner than (or thicker than) the fin-type active area FA of the integrated circuit device 1 described with reference to FIGS. 1A to 1D.

Figure 13:
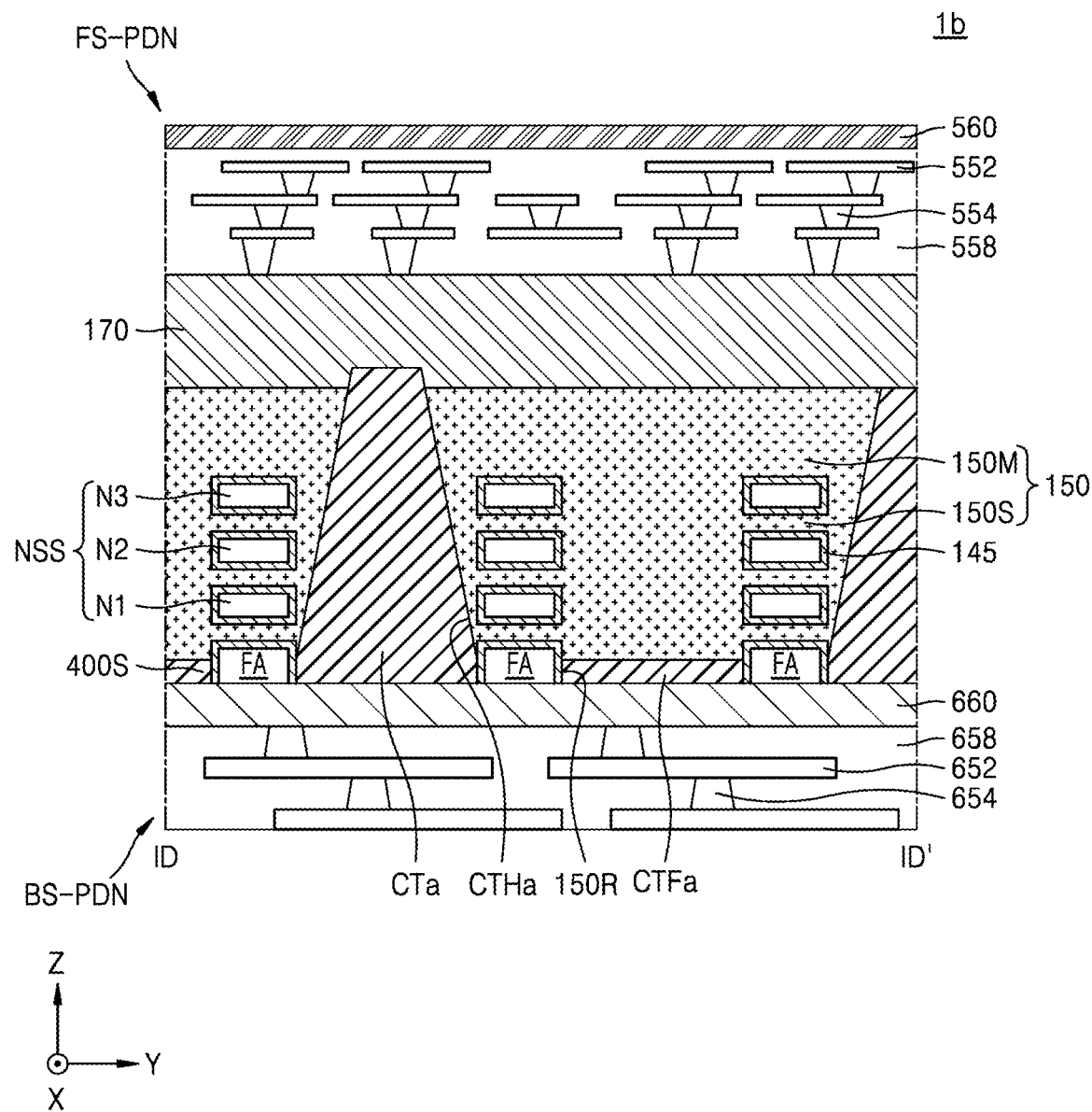
FIG. 13 is a cross-sectional view of an integrated circuit device according to embodiments.

FIG. 13 is a cross-sectional view of an integrated circuit device according to embodiments. In more detail, FIG. 13 is a cross-sectional view of the integrated circuit device, taken along a location corresponding to line ID-ID' of FIG. 1A. In FIG. 13, the same reference numerals as in FIGS. 1A to 1D denote the same elements, and therefore, detailed descriptions thereof will not be given herein.

Referring to FIG. 13, the integrated circuit device 1b may include a gate cut structure Cta extending from the upper surface of the substrate insulating layer 660 in the vertical direction (Z direction) between the pair of gate spacers 130. At least some of the plurality of gate electrodes 150 may have a gate cut hole CTHa extending in the vertical direction (Z direction). The gate cut structure Cta may fill the gate cut hole CTHa extending between the pair of gate spacers 130. The gate cut structure Cta may have a tapered shape in which the horizontal width thereof decreases while extending upward in the vertical direction (Z direction).

In some embodiments, a residual insulating layer CTFa may be under the gate electrode 150. The first lower recess 150R may be filled by the residual insulating layer CTFa. The residual insulating layer CTFa may include the same material as that of the gate cut structure Cta. A lower surface of the gate cut structure Cta and the lower surface of the residual insulating layer CTFa may be at the same vertical level.

Although the integrated circuit device 1 shown in FIGS. 1A to 1D includes the plurality of gap insulating layers 400S, the integrated circuit device 1b shown in FIG. 13 may not include the plurality of gap insulating layers 400S. A horizontal width of the gate cut structure Cta, for example, a horizontal width in the second horizontal direction (Y direction) may be defined by the fin-type active area FA or the fin-type active area FA and the gate insulating layer 145.

The integrated circuit device 1b may be formed by omitting the process of forming the plurality of gap insulating layers 400S shown in FIGS. 7A to 8D.

FIG. 14 is a cross-sectional view of an integrated circuit device according to embodiments. In more detail, FIG. 14 is a cross-sectional view of the integrated circuit device, taken along a location corresponding to line IC-IC' of FIG. 1A. In FIG. 14, the same reference numerals as in FIGS. 1A to 1D denote the same elements, and therefore, detailed descriptions thereof will not be given herein.

Referring to FIG. 14, the integrated circuit device 1c includes a plurality of source/drain areas 160a on the fin-type active area FA. The plurality of source/drain areas 160a are connected to ends of the adjacent nanosheets N1, N2, and N3, respectively. The plurality of source/drain areas 160a may include a first source/drain area 160Aa arranged in the first region R1; and a second source/drain area 160Ba arranged in the second region R2.

In some embodiments, the first source/drain area 160Aa and the second source/drain area 160Ba may include different materials, and each of the first source/drain area 160Aa and the second source/drain area 160Ba may be formed by performing a separate epitaxial growth process. The first source/drain area 160Aa may include Ge.

In some embodiments, a source/drain area 160a penetrates through the fin-type active area FA and comes into contact with an upper surface of the substrate insulating layer 660 so that a lower surface of the source/drain area 160a and a lower surface of the fin-type active area FA may form a coplanar surface. In some other embodiments, the plurality of source/drain areas 160a may extend into the fin-type active area FA. In this case, the lower surface of the source/drain area 160a may be between an upper surface of the fin-type active area FA and the upper surface of the substrate insulating layer 660. That is, the lower surface of the source/drain area 160a may be between the upper surface and the lower surface of the fin-type active area FA.

In addition, in the embodiment of FIG. 14, it is illustrated that a lower surface of the first source/drain area 160Aa and a lower surface of the second source/drain area 160Ba are located at the same vertical level. However, the lower surface of the first source/drain area 160Aa and the lower surface of the second source/drain area 160Ba may be at different vertical levels. For example, the lower surface of the first source/drain area 160Aa in the first region R1 is in contact with the upper surface of the substrate insulating layer 660, and the lower surface of the second source/drain area 160Ba in the second region R2 may be between the upper surface of the fin-type active area FA and the upper surface of the substrate insulating layer 660. However, the opposite embodiment is also possible. As another embodiment, in some of a plurality of first source/drain areas 160Aa in the first region R1, a lower surface thereof may be in contact with the upper surface of the substrate insulating layer 660, and in others, a lower surface thereof may be between the upper surface of the fin-type active area FA and the upper surface of the substrate insulating layer 660. This embodiment is equally applicable to a plurality of second source/drain areas 160Ba in the second region R2.

When a portion of a plurality of nanosheet semiconductor layers is etched to form the stacked structure NSS of the plurality of nanosheets N1, N2, and N3 described in FIGS. 2A to 2D, after a portion of the fin-type active area FA is further etched, the plurality of source/drain areas 160a may be formed on the fin-type active area FA to form the integrated circuit device 1b.

FIGS. 15A and 15B are cross-sectional views of an integrated circuit device according to embodiments. In more detail, FIGS. 15A and 15B are cross-sectional views of the integrated circuit device, taken along positions corresponding to lines IC-IC' and ID-ID' of FIG. 1A.

Referring to FIGS. 15A and 15B together, the integrated circuit device 1d may include a supporting insulating layer 390 instead of the fin-type active area FA included in the integrated circuit device 1 shown in FIGS. 1A to 1D. The various embodiments described with reference to FIGS. 1A to 14 may be applied in the same or similar manner even when the fin-type active area FA is replaced with the supporting insulating layer 390. In some embodiments, the supporting insulating layer 390 may include silicon oxide. In some other embodiments, the supporting insulating layer 390 may include silicon nitride.

The plurality of source/drain areas 160 are formed on the plurality of supporting insulating layers 390. The plurality of source/drain areas 160 are connected to ends of adjacent nanosheets N1, N2, and N3, respectively.

Because the integrated circuit device 1d does not include the fin-type active area FA included in the integrated circuit device 1 shown in FIGS. 1A to 1D, the nanosheet stacked structure NSS including the plurality of nanosheets N1, N2, and N3 may be referred to as a channel area.

In the exposing of the fin-type active area FA on the lower surface of the manufacturing method described with reference to FIGS. 3A to 11D, the fin-type active area FA may be removed, and the supporting insulating layer 390 may be filled in a space in which the fin-type active area FA is removed to form the integrated circuit device 1d.

Figure 16:
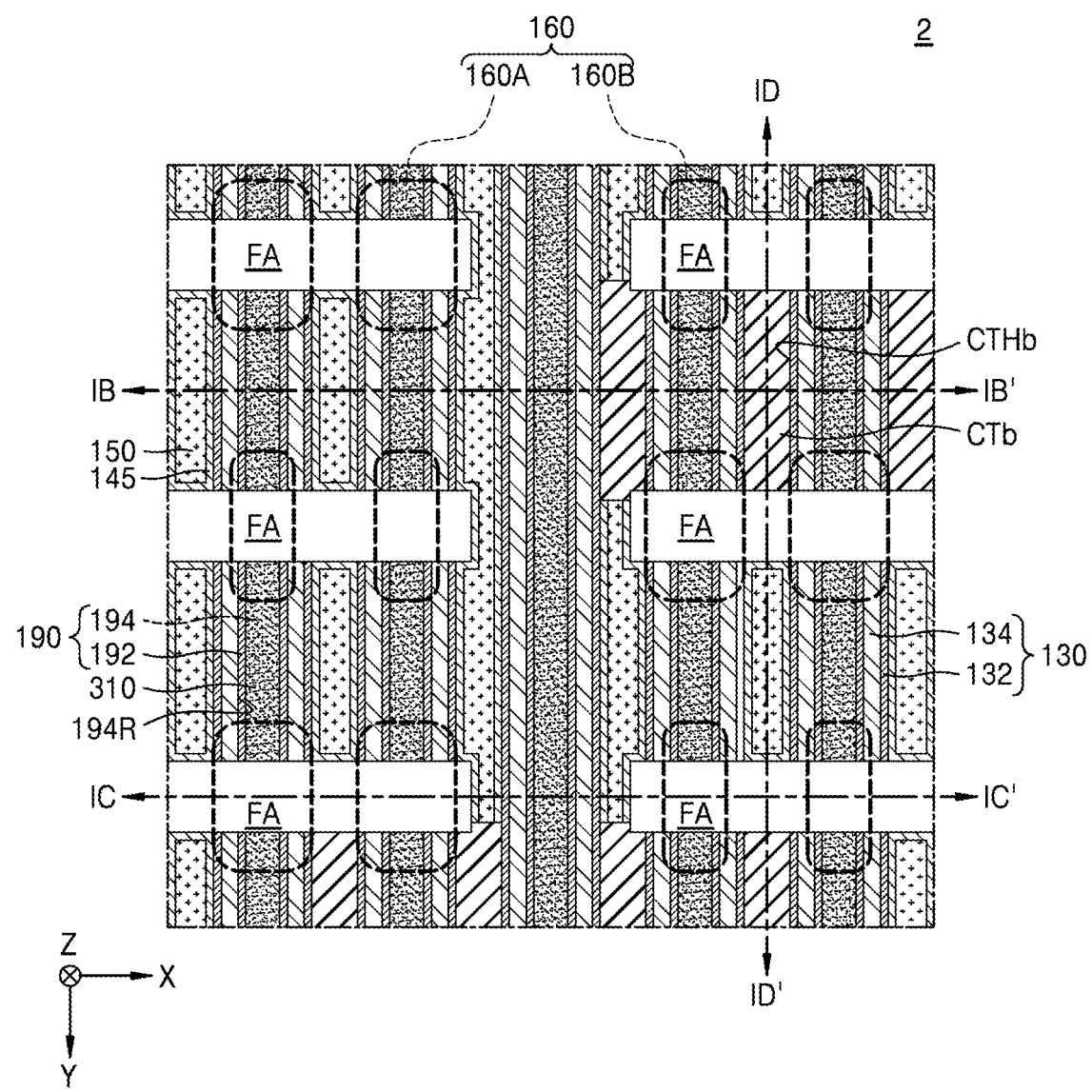
FIG. 16 is a plan layout view of an integrated circuit device according to embodiments.

FIG. 16 is a plan layout view of an integrated circuit device according to embodiments. Because cross-sectional views of the integrated circuit device, taken along lines IC-IC' and ID-ID' of FIG. 16 are substantially the same as those of FIGS. 1B and 1C and FIG. 13, in FIG. 16, the same reference numerals as in FIGS. 1A to 1C and FIG. 13 denote the same elements, and therefore, detailed descriptions thereof will not be given herein.

Referring to FIG. 16, an integrated circuit device 2 may include a plurality of fin-type active areas FA extending in the first horizontal direction (X direction), the plurality of gate electrodes 150 extending in the second horizontal direction (Y direction) crossing the first horizontal direction (X direction) on the plurality of fin-type active areas FA, gate cut holes CTHb passing through at least some of the plurality of gate electrodes 150, and gate cut structures CTb filling the gate cut holes CTHb. A gate cut structure CTb may be between two fin-type active areas FA adjacent to each other in the second horizontal direction (Y direction).

Some of the gate cut structures CTb are defined between the two fin-type active areas FA adjacent to each other in the second horizontal direction (Y direction), and may have a bar-shaped planar cross-section extending in the second horizontal direction (Y-direction), or a rectangular planar cross-section having a long axis in the second horizontal direction (Y-direction). The gate cut structure CTb having the bar-shaped planar cross-section extending in the second horizontal direction (Y direction) or the rectangular planar cross-section having a long axis in the second horizontal direction (Y direction) may be referred to as a first gate cut structure.

Some others of the gate cut structures CTb may be arranged to respectively contact ends in the first horizontal direction (X direction) of the two fin-type active areas FA adjacent to each other in the second horizontal direction (Y direction). A gate cut structure CTb arranged to be in contact with each end in the first horizontal direction (X direction) of the two fin-type active areas FA adjacent to each other in the second horizontal direction (Y direction) may be referred to as a second gate cut structure. The second gate cut structure generally has a bar-shaped planar cross-section extending in the second horizontal direction (Y-direction), or a rectangular planar cross-section having a long axis in the second horizontal direction (Y-direction), and may have a groove in which portions of two corners in contact with the two fin-type active areas FA are concavely introduced in the planar cross-section of the second gate cut structure. The planar cross-section of the second gate cut structure may have a concavely refracted edge corresponding to a corner of the fin-type active area FA, and the grooves in which portions of two corners in contact with the two fin-type active areas FA are concavely introduced may be defined by the concavely refracted edge. A corner portion of the fin-type active area FA may be located in the groove of the second gate cut structure.

An extension length of the second gate cut structure in the second horizontal direction (Y direction) may be greater than an extension length of the first gate cut structure. For example, the second gate cut structure may extend greater than the first gate cut structure in the second horizontal direction (Y direction) along one end of the first horizontal direction (X direction) of the fin-type active area FA.

Figure 17:
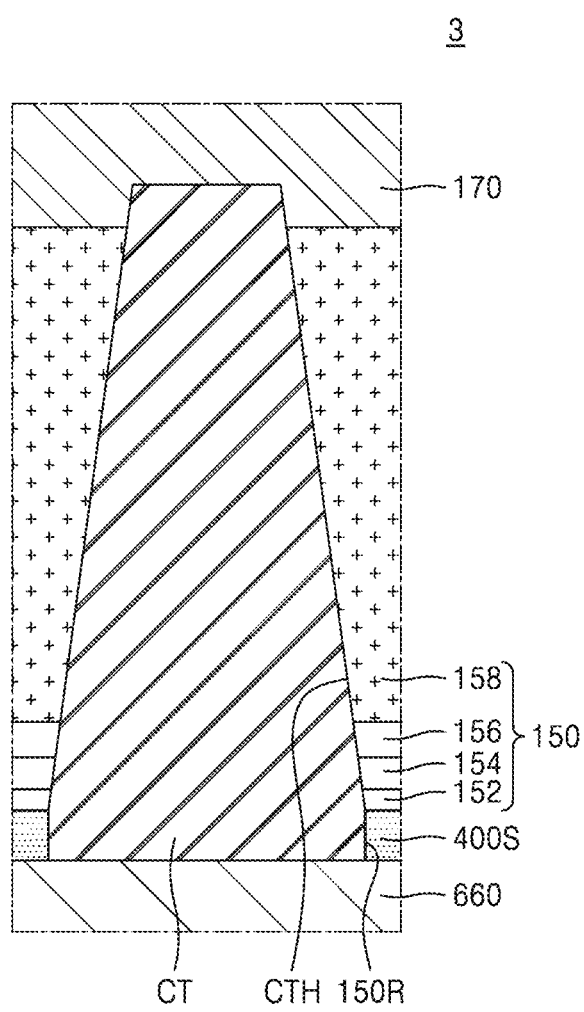
FIG. 17 is an enlarged cross-sectional view of an integrated circuit device according to embodiments.

FIG. 17 is an enlarged cross-sectional view of an integrated circuit device according to embodiments. In more detail, FIG. 17 is an enlarged cross-sectional view showing an enlarged portion corresponding to the gate cut structure CT and a peripheral portion in FIG. 1D, and in FIG. 17, the same reference numerals as in FIGS. 1A to 1D denote the same elements, and therefore, detailed descriptions thereof will not be given herein.

Referring to FIG. 17, an integrated circuit device 3 may include the gate cut hole CTH passing through the gate electrodes 150 and the gate cut structure CT filling the gate cut hole CTH.

The gate electrode 150 may include a first electrode layer 152, a second electrode layer 154, a third electrode layer 156, and a fourth electrode layer 158 sequentially stacked. In some embodiments, the first electrode layer 152 may be a conductive barrier layer, the second electrode layer 154 may be a metal-containing layer for regulating a work function, the third electrode layer 156 may be a conductive capping layer, and the fourth electrode layer 158 may be a gap-fill metal layer. The first electrode layer 152 may include, for example, metal nitride. The second electrode layer 154 may include, for example, at least one of Ti, W, Ru, Nb, Mo, Hf, Ni, Co, Pt, Yb, Tb, Dy, Er, and Pd. The third electrode layer 156 may include, for example, metal nitride. The fourth electrode layer 158 may include, for example, W or Al.

The gate cut hole CTH may be formed to penetrate each of the first electrode layer 152, the second electrode layer 154, the third electrode layer 156, and the fourth electrode layer 158. The gate cut structure CT filling the gate cut hole CTH may contact each of the first electrode layer 152, the second electrode layer 154, the third electrode layer 156, and the fourth electrode layer 158. In some embodiments, the gate cut structure CT may be in contact with each of the first electrode layer 152, the second electrode layer 154, the third electrode layer 156, and the fourth electrode layer 158, and may extend into the interlayer insulating layer 170.

Although not shown separately, the gate cut structure Cta shown in FIG. 13 may also contact each of the first electrode layer 152, the second electrode layer 154, the third electrode layer 156, and the fourth electrode layer 158.

While some embodiments of inventive concepts have been particularly shown and described with reference to embodiments thereof, it will be understood that various changes in form and details may be made therein without departing from the spirit and scope of inventive concepts as set forth in the following claims.

What is claimed is:

1. An integrated circuit device comprising:
    a lower wiring structure including a plurality of lower wiring lines, a plurality of lower wiring vias connected to at least one of the plurality of lower wiring lines, and a lower inter-wiring insulating layer surrounding the plurality of lower wiring lines and the plurality of lower wiring vias;
    a substrate insulating layer on the lower wiring structure;
    a plurality of channel areas extending in a first horizontal direction on the substrate insulating layer;
    a plurality of gate structures, each of the plurality of gate structures including a gate electrode extending in a second horizontal direction on the plurality of channel areas, a pair of gate spacers covering both sidewalls of the gate electrode, and a gate insulating layer between the gate electrode and the pair of gate spacers, the second horizontal direction crossing the first horizontal direction;
    an interlayer insulating layer covering the plurality of gate structures; and
    a gate cut structure on the substrate insulating layer, the gate cut structure extending in a vertical direction from an upper surface of the substrate insulating layer toward the interlayer insulating layer and passing through the gate electrode of a corresponding one of the plurality of gate structures to cut and separate the gate electrode of the corresponding one of the plurality of gate structures, the gate cut structure having a tapered shape in which a horizontal width thereof decreases from a lower side to an upper side thereof in the vertical direction.

2. The integrated circuit device of claim 1, further comprising:
    an inter-gate insulating layer filling a portion of a space between the plurality of gate structures; and
    a protective insulating layer filling a protective recess, the protective recess defined by a lower portion of the space between the plurality of gate structures, and a material of the protective insulating layer being different than a material of at least a portion of the inter-gate insulating layer.

3. The integrated circuit device of claim 2, further comprising:
    a residual insulating layer including a first residual insulating layer and a second residual insulating layer, the first residual insulating layer filling a first lower recess between the gate electrode and the substrate insulating layer, and the second residual insulating layer filling a second lower recess between the protective insulating layer and the substrate insulating layer, wherein
    a material in the second residual insulating layer is the same as a material in the first residual insulating layer.

4. The integrated circuit device of claim 3, wherein the material in the first residual insulating layer and the second residual insulating layer is the same as a material in the gate cut structure.

5. The integrated circuit device of claim 3, wherein the first residual insulating layer and the second residual insulating layer have a same thickness.

6. The integrated circuit device of claim 3, further comprising:
    a plurality of source/drain areas, wherein
    each of the plurality of channel areas includes a nanosheet stacked structure including a fin-type active area and a plurality of nanosheets extending parallel to an upper surface of the fin-type active area, and the plurality of source/drain areas respectively connected to ends of the plurality of nanosheets in the fin-type active area of each of the plurality of channel areas.

7. The integrated circuit device of claim 6, further comprising:

a gap insulating layer adjacent to a sidewall of the fin-type active area in the second horizontal direction, wherein the gap insulating layer is between the gate cut structure and the fin-type active area such that the gate cut structure is spaced apart from the fin-type active area.

8. The integrated circuit device of claim 7, wherein the residual insulating layer and the gap insulating layer have a same thickness.

9. The integrated circuit device of claim 7, wherein a lower surface of the gate cut structure, a lower surface of the gap insulating layer, a lower surface of the residual insulating layer, a lower surface of the pair of gate spacers, and a lower surface of the fin-type active area are at a same vertical level to form a coplanar surface.

10. The integrated circuit device of claim 2, wherein the gate cut structure includes at least two gate cut structures connected to each other in the first horizontal direction, and the at least two gate cut structures connected to each other in the first horizontal direction extend along a bottom of the protective insulating layer therebetween and form an integral body.

11. The integrated circuit device of claim 1, wherein the gate cut structure extends in the vertical direction between the pair of gate spacers and extends into the interlayer insulating layer.

12. An integrated circuit device comprising:

a channel area extending in a first horizontal direction;

a gate cut structure having a tapered shape in which a horizontal width thereof decreases from a lower side thereof to an upper side thereof in a vertical direction; and a pair of gate electrodes respectively having ends facing each other with the gate cut structure therebetween, the pair of gate electrodes extending in a second horizontal direction, the second horizontal direction intersecting the first horizontal direction, wherein, in the tapered shape of the gate cut structure, a horizontal width of the gate cut structure in the first horizontal direction and a horizontal width of the gate cut structure in the second horizontal direction decrease, respectively.

13. The integrated circuit device of claim 12, wherein the gate cut structure extends in the vertical direction, and a rate at which the horizontal width of the gate cut structure in the first horizontal direction decreases is less than a rate at which the horizontal width of the gate cut structure in the second horizontal direction decreases.

14. The integrated circuit device of claim 12, further comprising:

a residual insulating layer below the pair of gate electrodes, wherein a material in the residual insulating layer is the same as a material in the gate cut structure.

15. The integrated circuit device of claim 14, wherein the residual insulating layer has a lower surface at a same vertical level as a lower surface of the gate cut structure.

16. The integrated circuit device of claim 14, further comprising:

a pair of gate spacers covering both sidewalls of the gate cut structure and both sidewalls of the pair of gate electrodes, wherein a lower surface of the gate cut structure, a lower surface of the residual insulating layer, and a lower surface of the gate spacer are at a same vertical level to form a coplanar surface.

17. An integrated circuit device comprising:

a lower wiring structure including a plurality of lower wiring lines, a plurality of lower wiring vias connected to at least one of the plurality of lower wiring lines, and a lower inter-wiring insulating layer surrounding the plurality of lower wiring lines and the plurality of lower wiring vias;

a substrate insulating layer on the lower wiring structure;

a plurality of fin-type active areas extending in a first horizontal direction on the substrate insulating layer;

a plurality of nanosheet stacked structures on the plurality of fin-type active areas, each of the plurality of nanosheet stacked structures including a plurality of nanosheets extending parallel to upper surfaces of the plurality of fin-type active areas;

a plurality of source/drain areas respectively connected to ends of the plurality of nanosheets in the plurality of nanosheet stacked structures;

a plurality of gate structures, each of the plurality of gate structures including a gate electrode extending in a second horizontal direction on the plurality of fin-type active areas, a pair of gate spacers covering both sidewalls of the gate electrode, and a gate insulating layer between the gate electrode and the pair of gate spacers, the second horizontal direction crossing the first horizontal direction;

an inter-gate insulating layer filling a portion of a space between the plurality of gate structures;

a protective insulating layer filling a protective recess, the protective recess defined by a lower portion of the space between the plurality of gate structures, a material of the protective insulating layer being different than a material of at least a portion of the inter-gate insulating layer;

an interlayer insulating layer configured to cover the plurality of gate structures; and a gate cut structure on the substrate insulating layer, the gate cut structure extending in a vertical direction from an upper surface of the substrate insulating layer toward the interlayer insulating layer and passing through the gate electrode of a corresponding one of the plurality of gate structures to cut and separate the gate electrode of the corresponding one of the plurality of gate structures, and the gate cut structure having a tapered shape in which a horizontal width thereof decreases from a lower side to an upper side thereof in the vertical direction.

18. The integrated circuit device of claim 17, wherein a lower surface of the plurality of fin-type active areas, a lower surface of the gate cut structure, and a lower surface of the pair of gate spacers are at a same vertical level to form a coplanar surface.

19. The integrated circuit device of claim 17, further comprising:

a residual insulating layer between the gate electrode of the corresponding one of the plurality of gate structures and the substrate insulating layer and between the protective insulating layer and the substrate insulating layer, wherein
a material in the residual insulating layer is the same as a material in the gate cut structure, and
a lower surface of the residual insulating layer is at a same vertical level as a lower surface of the gate cut structure.

* * * * *